United States Patent
Saida

(10) Patent No.: US 10,096,771 B2
(45) Date of Patent: Oct. 9, 2018

(54) MAGNETIC ELEMENT AND MEMORY DEVICE

(71) Applicant: Kabushiki Kaisha Toshiba, Minato-ku (JP)

(72) Inventor: Daisuke Saida, Shinagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 24 days.

(21) Appl. No.: 15/262,403

(22) Filed: Sep. 12, 2016

(65) Prior Publication Data

US 2017/0077394 A1 Mar. 16, 2017

(30) Foreign Application Priority Data

Sep. 16, 2015 (JP) ................................. 2015-183460

(51) Int. Cl.
*H01L 43/10* (2006.01)
*H01L 43/08* (2006.01)
(Continued)

(52) U.S. Cl.
CPC ............ *H01L 43/10* (2013.01); *G11B 5/3906* (2013.01); *G11C 11/161* (2013.01);
(Continued)

(58) Field of Classification Search
CPC ....... H01L 43/10; H01L 43/08; H01L 27/228; H01L 29/66984; G11C 11/1675;
(Continued)

(56) References Cited

U.S. PATENT DOCUMENTS

2009/0015958 A1  1/2009  Nakamura et al.
2012/0061784 A1  3/2012  Nakamura et al.
(Continued)

FOREIGN PATENT DOCUMENTS

JP   2009-21352 A   1/2009
JP   2012-64792 A   3/2012
(Continued)

OTHER PUBLICATIONS

Tomohiro Taniguchi, et al., "Magnetization switching by current and microwaves" Physical Review, vol. B 93, No. 014430, 2016, pp. 014430-1-014430-18.

*Primary Examiner* — Julio J Maldonado
*Assistant Examiner* — Stanetta Isaac
(74) *Attorney, Agent, or Firm* — Oblon, McClelland, Maier & Neustadt, L.L.P.

(57) ABSTRACT

According to one embodiment, a magnetic element includes a first stacked unit and a third ferromagnetic layer. The first stacked unit includes first and second ferromagnetic layers, and a first non-magnetic layer. The first ferromagnetic layer has a first magnetization. The second ferromagnetic layer is separated from the first ferromagnetic layer in a first direction, and has a second magnetization. The first non-magnetic layer is provided between the first and second ferromagnetic layers. The third ferromagnetic layer is stacked with the first stacked unit in the first direction, and has a third magnetization. 2γNzMs is not less than 0.9 times of a magnetic resonance frequency (Hz) of the third ferromagnetic layer, when the second magnetization is Ms (emu/cc), a demagnetizing coefficient of the second ferromagnetic layer is Nz, and a gyro magnetic constant is γ (Hz/Oe).

20 Claims, 25 Drawing Sheets

(51) Int. Cl.
*G11B 5/39* (2006.01)
*G11C 11/16* (2006.01)
*G11C 11/56* (2006.01)
*H01L 27/22* (2006.01)

(52) U.S. Cl.
CPC ...... *G11C 11/1659* (2013.01); *G11C 11/1673* (2013.01); *G11C 11/1675* (2013.01); *G11C 11/5607* (2013.01); *H01L 43/08* (2013.01); *H01L 27/228* (2013.01)

(58) Field of Classification Search
CPC ............ G11C 11/5607; G11C 11/1659; G11C 11/1673; G11C 11/161; G11B 5/3906; G02F 2203/16; H01F 10/32–10/3295; Y10S 977/933–977/935
See application file for complete search history.

(56) References Cited

U.S. PATENT DOCUMENTS

| | | | |
|---|---|---|---|
| 2012/0068281 A1 | 3/2012 | Saida et al. | |
| 2012/0069465 A1* | 3/2012 | Sato | G11B 5/3133 360/77.02 |
| 2012/0126905 A1 | 5/2012 | Zhang et al. | |
| 2012/0241827 A1 | 9/2012 | Daibou et al. | |
| 2013/0069185 A1 | 3/2013 | Saida et al. | |
| 2013/0070522 A1 | 3/2013 | Saida et al. | |
| 2013/0070523 A1 | 3/2013 | Saida et al. | |
| 2013/0181305 A1 | 7/2013 | Nakayama et al. | |
| 2013/0249024 A1 | 9/2013 | Saida et al. | |
| 2013/0271866 A1 | 10/2013 | Sato | |
| 2014/0085968 A1 | 3/2014 | Saida et al. | |
| 2014/0269037 A1 | 9/2014 | Saida et al. | |

FOREIGN PATENT DOCUMENTS

| | | |
|---|---|---|
| JP | 2012-64863 A | 3/2012 |
| JP | 2012-64904 A | 3/2012 |
| JP | 2012-69958 A | 4/2012 |
| JP | 2012-114441 A | 6/2012 |
| JP | 2012-204680 A | 10/2012 |
| JP | 2013-69819 A | 4/2013 |
| JP | 2013-69820 A | 4/2013 |
| JP | 2013-69821 A | 4/2013 |
| JP | 2013-197317 A | 9/2013 |
| JP | 2013-222485 A | 10/2013 |
| JP | 2014-67469 A | 4/2014 |
| JP | 2014-179381 A | 9/2014 |

* cited by examiner

FIG. 19A
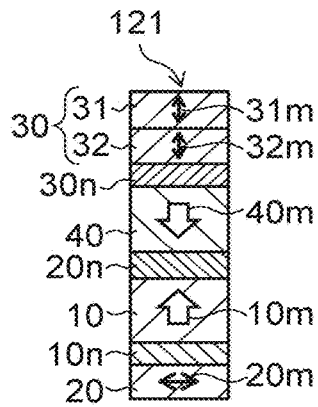
FIG. 19B FIG. 19C FIG. 19D
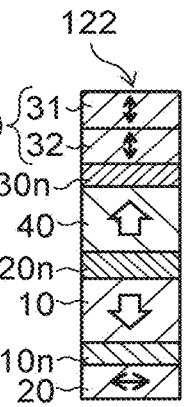 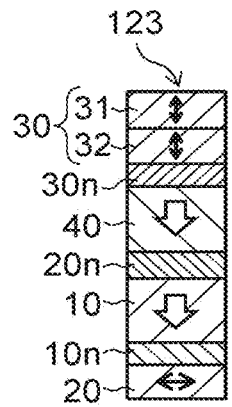 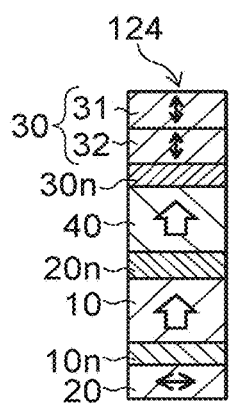
FIG. 19E FIG. 19F FIG. 19G FIG. 19H
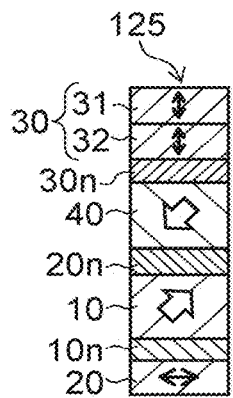 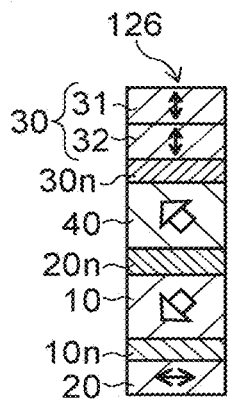 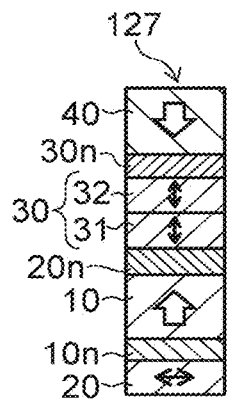 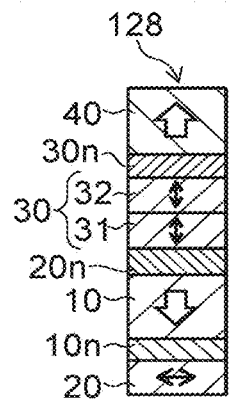
FIG. 19I FIG. 19J FIG. 19K
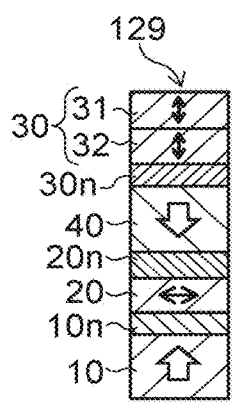 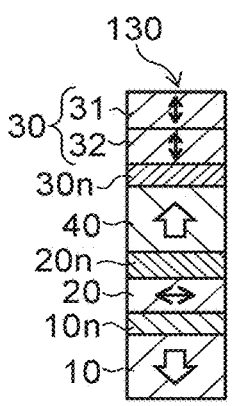 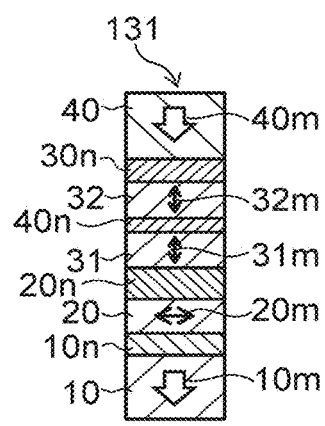

MAGNETIC ELEMENT AND MEMORY DEVICE

CROSS-REFERENCE TO RELATED APPLICATIONS

This application is based upon and claims the benefit of priority from Japanese Patent Application No. 2015-183460, filed on Sep. 16, 2015; the entire contents of which are incorporated herein by reference.

FIELD

Embodiments described herein relate generally to a magnetic element and a memory device.

BACKGROUND

A magnetic element such as a spin torque oscillator (STO) based on a magnetic body has been proposed. The magnetic element like this is small in size and is capable of generating a magnetic field in a frequency band of gigahertz (GHz), and thus attracts attention. It is desirable that a magnetic field of a high frequency is generated by a small current in the magnetic element like this.

SUMMARY OF THE INVENTION

A memory device comprising a magnetic element; a first interconnection electrically connected to one end of the magnetic element; a second interconnection electrically connected to other end of the magnetic element; and a controller electrically connected to the magnetic element via the first interconnection and the second interconnection, the magnetic element comprising: a first stacked unit comprising a first ferromagnetic layer having a first magnetization, a second ferromagnetic layer separated from the first ferromagnetic layer in a first direction, the second ferromagnetic layer having a second magnetization, and a first non-magnetic layer provided between the first ferromagnetic layer and the second ferromagnetic layer; and a third ferromagnetic layer stacked with the first stacked unit in the first direction, the third ferromagnetic layer having a third magnetization, wherein a component of the first direction of the first magnetization is larger than a component of a second direction perpendicular to the first direction of the first magnetization, a component of the first direction of the second magnetization is smaller than a component of the second direction of the second magnetization, and a component of the first direction of the third magnetization is larger than a component of the second direction of the third magnetization.

BRIEF DESCRIPTION OF THE DRAWINGS

FIG. 19A to FIG. 19K are schematic cross-sectional views showing other magnetic elements according to the fourth embodiment;

DETAILED DESCRIPTION

Figure 1:
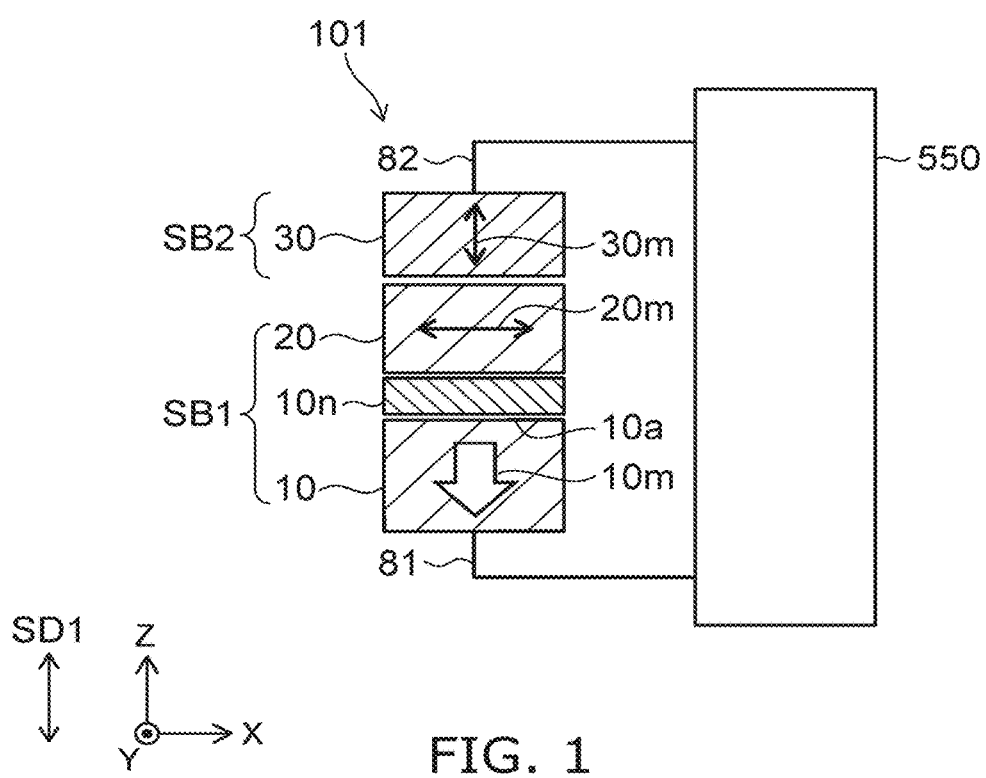
FIG. 1 is a schematic cross-sectional view showing a magnetic element according to a first embodiment.

According to one embodiment, a magnetic element includes a first stacked unit and a third ferromagnetic layer.

The first stacked unit includes a first ferromagnetic layer, a second ferromagnetic layer, and a first non-magnetic layer. The first ferromagnetic layer has a first magnetization. The second ferromagnetic layer is separated from the first ferromagnetic layer in a first direction, and has a second magnetization. The first non-magnetic layer is provided between the first ferromagnetic layer and the second ferromagnetic layer. The third ferromagnetic layer is stacked with the first stacked unit in the first direction, and has a third magnetization. A component of the first direction of the first magnetization is larger than a component of a second direction perpendicular to the first direction of the first magnetization. A component of the first direction of the second magnetization is smaller than a component of the second direction of the second magnetization. A component of the first direction of the third magnetization is larger than a component of the second direction of the third magnetization. 2γNzMs is not less than 0.9 times of a magnetic resonance frequency (unit: Hz) of the third ferromagnetic layer, when the second magnetization of the second ferromagnetic layer is Ms (unit: emu/cc), a demagnetizing coefficient of the second ferromagnetic layer is Nz, and a gyro magnetic constant is γ (unit: Hz/Oe).

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic cross-sectional view illustrating a magnetic element according to a first embodiment.

As shown in FIG. 1, a magnetic element 101 according to the embodiment includes a first stacking unit SB1 and a second stacking unit SB2. The first stacking unit SB1 includes a first ferromagnetic layer 10, a second ferromagnetic layer 20 and a first non-magnetic layer 10n. The second stacking unit SB2 includes a third ferromagnetic layer 30. The magnetic element 101 is, for example, a spin torque oscillator (STO).

The first ferromagnetic layer 10 has a first magnetization 10m. A direction of the first magnetization 10m is substantially fixed. The direction of the first magnetization 10m of the first ferromagnetic layer 10 has a component perpendicular to a major surface 10a of the first ferromagnetic layer 10. The direction of the first magnetization 10m is nonparallel to the major surface 10a. The first ferromagnetic layer 10 is, for example, a spin injection layer.

The second ferromagnetic layer 20 is stacked with the first ferromagnetic layer 10. The second ferromagnetic layer 20 is separated from the first ferromagnetic layer 10 in a first direction SD1. The first direction SD1 (stacking direction) is, for example, perpendicular to the major surface 10a.

The second ferromagnetic layer 20 has a second magnetization 20m. A direction of the second magnetization 20m of the second ferromagnetic layer 20 is variable. The direction of the second magnetization 20m has a component perpendicular to the first direction SD1. The second ferromagnetic layer 20 is, for example, an oscillation layer.

The first non-magnetic layer 10n is provided between the first ferromagnetic layer 10 and the second ferromagnetic layer 20. The first non-magnetic layer 10n, for example, contacts the first ferromagnetic layer 10 and the second ferromagnetic layer 20. The first ferromagnetic layer 10, the second ferromagnetic layer 20 and the first non-magnetic layer 10n are stacked in the first direction SD1.

The second stacked unit SB2 is stacked with the first stacked unit SB1 in the first direction SD1. That is, the third ferromagnetic layer 30 is stacked with the first stacked unit SB1 in the first direction SD1. In this example, the second ferromagnetic layer 20 is disposed between the first ferromagnetic layer and the second ferromagnetic layer 20.

The third ferromagnetic layer 30 has a third magnetization 30m. A direction of the third magnetization 30m of the third ferromagnetic layer 30 is variable. The direction of the third magnetization 30m has a component parallel to the first direction SD1.

As shown in FIG. 1, the magnetic element 101 may further include interconnections (conductive layer 81 and conductive layer 82). The first stacked unit SB1 and the second stacked unit SB2 are disposed between the conductive layer 81 and the conductive layer 82. The conductive layer 81 is electrically connected to the first stacked unit SB1, and the conductive layer 82 is electrically connected to the second stacked unit SB2. The conductive layer 81 and the conductive layer 82 are electrically connected to a controller 550. "Electrically connected" includes not only the case of direct contact connection but also the case of connection via other conductive member or the like.

The controller 550 applies a voltage and supplies a current to the magnetic element 101. That is, a current is flown between the conductive layer 81 and the conductive layer 82 via the first stacked unit SB1 and the second stacked unit SB2. Thereby, the controller 550 controls the operation of the magnetic element 101.

In the specification of the application, the state of being stacked includes not only the case of overlap by direct contact but also the case of overlap having other elements interposed.

A direction parallel to the stacking direction (first direction SD1) is taken as a Z-axis direction. One direction orthogonal to the Z-axis direction is taken as an X-axis direction. A direction perpendicular to the X-axis direction and the Z-axis direction is taken as a Y-axis direction. A film surface of each layer included in the first stacked unit SB1 and the second stacked unit SB2 is, for example, parallel to an X-Y plane. For example, the major surface 10a is parallel to the X-Y plane.

Figures 2A, 2B:
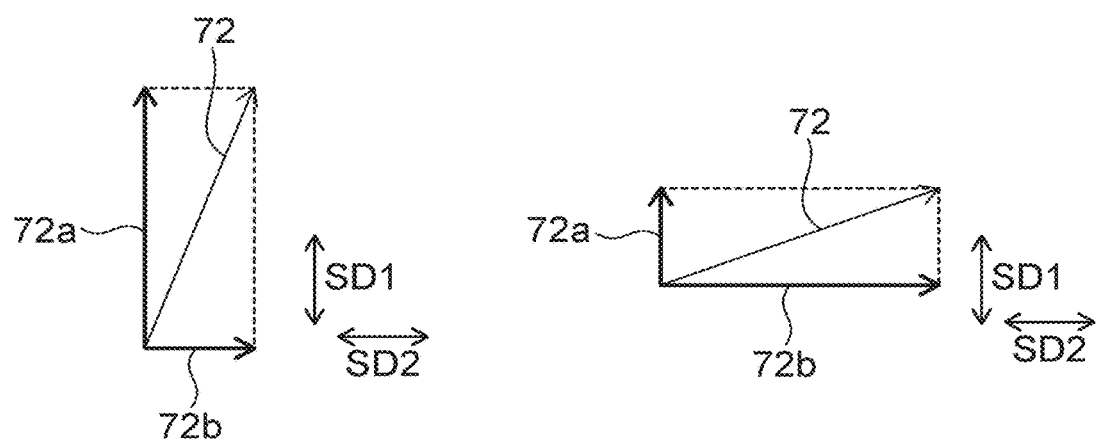
FIG. 2A and FIG. 2B are schematic views showing magnetization.

FIG. 2A and FIG. 2B are schematic views illustrating magnetization.

FIG. 2A illustrates the magnetization in a perpendicular magnetization film. FIG. 2B illustrates the magnetization in an in-plane magnetization film.

As shown in FIG. 2A and FIG. 2B, an in-plane direction included in the X-Y plane perpendicular to the first direction SD1 is taken as, for example, a second direction SD2.

An in-plane magnetization component 72b of the magnetization 72 is a component of the magnetization 72 projected on the X-Y plane. The in-plane component 72b is parallel to the in-plane direction. A perpendicular magnetization component 72a of the magnetization 72 is a component of the magnetization 72 projected in the Z-axis direction. The perpendicular magnetization component 72a is parallel to the first direction SD1.

As shown FIG. 2A, in the perpendicular magnetization film, the perpendicular magnetization component 72a has a larger magnetization state than the in-plane magnetization component 72b. It is desirable in the operation characteristics that the magnetization direction is substantially perpendicular to the film surface in the perpendicular magnetization film.

As shown in FIG. 2B, in the in-plane magnetization film, the in-plane magnetization component 72b has a larger magnetization state than the perpendicular magnetization component 72a. It is desirable in the operation characteristics that the magnetization direction is substantially parallel to the film surface in the in-plane magnetization film.

For example, the first ferromagnetic layer 10 is a perpendicular magnetization film. That is, a component of the first direction SD1 of the first magnetization 10m is larger than a component of the second direction SD2 of the first magnetization 10m, and the direction of the first magnetization 10m is along the first direction SD1.

For example, the second ferromagnetic layer 20 is an in-plane magnetization film when a current is not flown through the first stacked unit SB1. That is, when the current is not flown through the first stacked unit SB1, a component of the first direction SD1 of the second magnetization 20m is smaller than a component of the second direction SD2 of the second magnetization, and the direction of the second magnetization 20m is along the second direction SD2. An easy magnetization axis of the second ferromagnetic layer 20 is, for example, substantially parallel to the film surface.

For example, the third ferromagnetic layer 30 is a perpendicular magnetization film. When a current is not flown through the first stacked unit SB1, a component of the first direction SD1 of the third magnetization 30m is larger than a component of the second direction SD2 of the third magnetization 30m, and the third magnetization 30m is along the first direction SD1. An easy magnetization axis of the third ferromagnetic layer 30 is, for example, substantially perpendicular to the film surface.

In the following descriptions, for convenience, a direction from the first stacked unit SB1 toward the second stacked unit SB2 is referred to as "up" or "upward". A direction from the second stacked unit SB2 toward the first stacked unit SB1 is referred to as "down" or "downward". In the example shown in FIG. 1, the direction of the first magnetization 10m is downward. The first magnetization 10m may be upward. The direction of the third magnetization 30m is variable, and, for example, may be either in an upward state or a downward state.

An electron current can be flown through the first stacked unit SB1 and the second stacked unit SB2 via the conductive layer 81 and the conductive layer 82. The electron current is a flow of electron. When the current is flown upward, the electron current is flown downward.

For example, the electron current is flown upward in the first stacked unit SB1 and the second stacked unit SB2. At this time, the electron passing through the first ferromagnetic layer having the first magnetization 10m in substantially perpendicular direction to the film surface comes to have a spin in the same direction as the first magnetization 10m. If this electron flows into the second ferromagnetic layer 20, an angular momentum of this spin is transmitted to the second ferromagnetic layer 20, and operates on the second magnetization 20m. That is, so called spin transfer torque acts. Thereby, the second magnetization 20m precesses due to the supply of an electron current 60, and a rotating magnetic field is generated.

For example, the electron current is flown downward in the first stacked unit SB1 and the second stacked unit SB2. At this time, the electron having a reverse spin to the first magnetization 10m of the first ferromagnetic layer 10 is reflected at an interface between the first ferromagnetic layer 10 and the first non-magnetic layer 10n. The spin angular momentum of the reflected electron operates on the second magnetization 20m of the second ferromagnetic layer 20. Thereby, the second magnetization 20m precesses and the rotating magnetic field is generated. Thus, the second magnetization 20m oscillates when a current flows through the first stacked unit SB1. A frequency of the rotating magnetic field (high frequency magnetic field) is, for example, approximately 1 GHz to 60 GHz.

Figure 3:
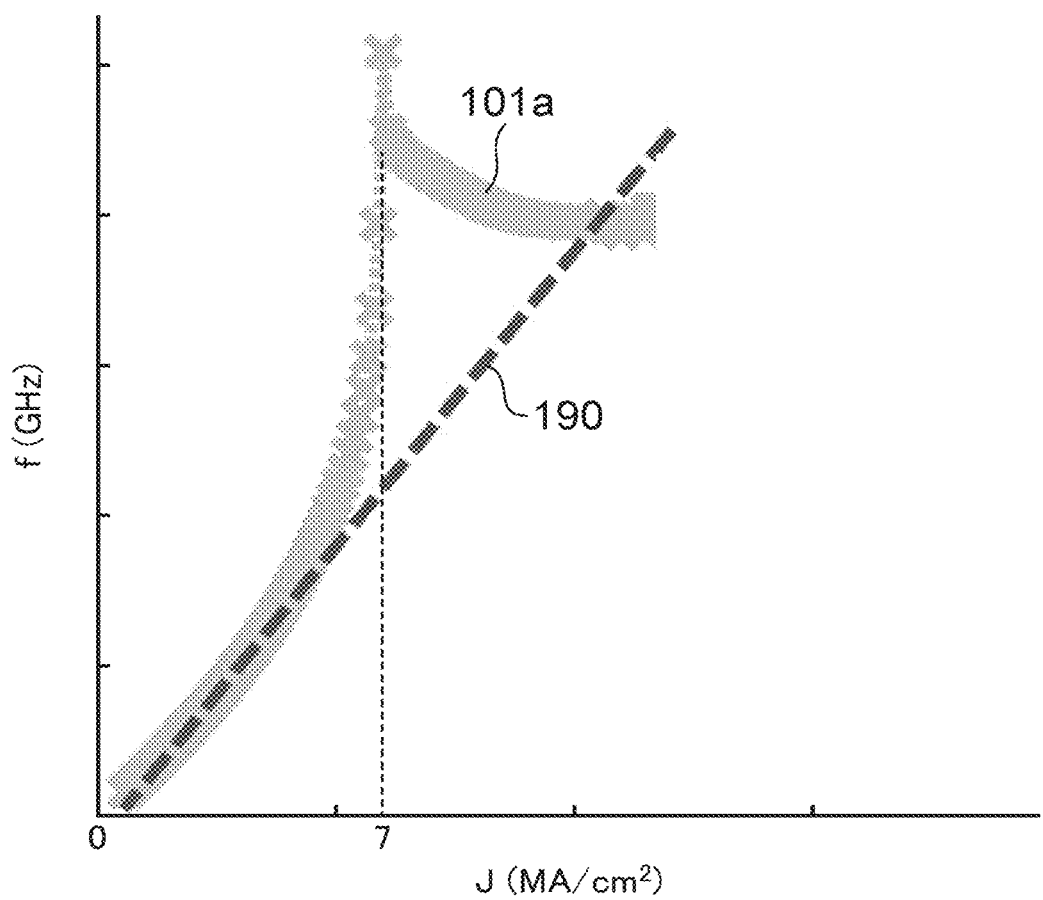
FIG. 3 shows a graph of simulation results of characteristics of the magnetic element.

FIG. 3 is a graph illustrating simulation results of the characteristics of the magnetic element.

A horizontal axis of FIG. 3 represents a current density J (MA/cm$^2$: mega ampere/square centimeter) of a current flowing through the magnetic element. A vertical axis of FIG. 3 represents an oscillation frequency f (GHz: gigahertz) at which the second ferromagnetic layer 20 (second magnetization 20m) oscillates, that is, the frequency of the high frequency magnetic field described above. In the specification of the application, the simulation is performed by micromagnetics-LLG (Landau-Liftshitz-Gilbert).

FIG. 3 illustrates the characteristics of the magnetic element 101 according to the embodiment and the characteristics of a magnetic element 190 of a reference example. The magnetic element 190 of the reference example does not include the third ferromagnetic layer 30. The configuration of the magnetic element 190 is the same as the magnetic element 101 described above other than the above.

It is known that the oscillation frequency f is expressed by, for example, the following formula (1).

$$f=\gamma/(2\pi\alpha)\times(\text{hbar}/2e)\times g(\theta)/(Ms\times t)\times J \quad (1)$$

γ represents a gyro magnetic constant, and α represents a dumping constant. hbar is a value of a Planck constant divided by 2π. g(θ) represents a spin injection efficiency, Ms represents magnetization of the oscillation layer (second ferromagnetic layer 20), and t represents a thickness (length along stacking direction) of the oscillation layer.

According to the formula (1), the oscillation frequency f is proportional to the current density 3. As shown in FIG. 3, in the magnetic element 190 not provided with the third ferromagnetic layer 30, the oscillation frequency f responds almost linearly to the current density J so as to follow the formula (1). In contrast, the inventor of the application has found that the oscillation frequency f increases by providing the third ferromagnetic layer 30 like the magnetic element 101 according to the embodiment. That is, when the current density J is constant, there exists a region where the oscillation frequency f in the magnetic element 101 is higher than the oscillation frequency f in the magnetic element 190. For example, when the current density 3 is 7 MA/cm$^2$, the oscillation frequency f in the magnetic element 101 is not less than two times of the frequency in the magnetic element 190.

The third magnetization 30m of the third ferromagnetic layer 30 is magnetically coupled with the second magnetization 20m of the second ferromagnetic layer 20. For example, the third magnetization 30m precesses in accompanying with the precession of the second magnetization 20m due to the electron current. Thereby, for example, rotation of the second magnetization 20m is encouraged, and the oscillation frequency f is increased.

The inventor of the application has further found that the maximum value of the oscillation frequency f in the magnetic element according to the embodiment is related to a magnetic resonance frequency f3 (Hz: hertz) of the third ferromagnetic layer 30.

For example, the oscillation frequency f based on the formula (1) is considered to be a frequency of a magnetic field which the second ferromagnetic layer 20 is capable of generating originally. Here, the third ferromagnetic layer is provided. Thereby, it can be considered that the oscillation frequency f is increased from the oscillation frequency f based on the formula (1) to approximately the magnetic resonance frequency f3 of the third ferromagnetic layer 30.

It has been found that the behavior of this magnetic resonance frequency f3 depends on a ratio of the maximum frequency which the second ferromagnetic layer 20 is capable of outputting to the magnetic resonance frequency f3 of the third ferromagnetic layer 30. The maximum frequency which the second ferromagnetic layer 20 is capable of outputting is based on a demagnetizing field generated by the second ferromagnetic layer 20. In addition, the oscillation frequency f depends on a current value (current density J) flowing through the first stacked unit SB1. For example, when a current with a certain current density J flows, the oscillation frequency f in accordance with the formula (1) is outputted. The oscillation frequency f increases with increasing current density 3, however the maximum frequency which the second ferromagnetic layer 20 is capable of outputting is determined by the demagnetizing field. For example, in the case where the maximum frequency can reach the magnetic resonance frequency f3 of the third ferromagnetic layer 30, the oscillation frequency f of the second ferromagnetic layer 20 is stabilized and increased without in accordance with the formula (1).

Here, "the maximum frequency which the second ferromagnetic layer 20 is capable of outputting" is referred to as a frequency when the second magnetization 20m of the second ferromagnetic layer 20 precesses in a state of being parallel to the stacking direction (first direction SD1). In the state of the second magnetization 20m being parallel to the stacking direction, the demagnetizing field of $4\pi NzMs$ is generated. Ms (emu/cc=emu/cm3) is the magnetization of the second ferromagnetic layer 20. Nz is a demagnetizing coefficient (dimension less) of the second ferromagnetic layer 20. At this time, the maximum frequency which the second ferromagnetic layer 20 is capable of outputting is expressed by $\gamma/(2\pi) \times 4\pi NzMs = 2\gamma NzMs$. $\gamma$(Hz/Oe: hertz/oersted) is a gyro magnetic constant. The gyro magnetic constant is about $17.6 \times 10^6$ Hz/Oe.

FIG. 4A to FIG. 4D are graphs illustrating simulation results of the characteristics of the magnetic element according to the first embodiment.

In each of FIG. 4A to FIG. 4D, the horizontal axis represents an oscillation frequency f(GHz) of the second ferromagnetic layer 20, and the vertical axis represents a current density J(MA/cm$^2$) of a current flowing through the magnetic element.

FIG. 4A to FIG. 4D illustrate the characteristics of magnetic elements 101a to 101d, respectively. Each of the magnetic elements 101a to 101d has a configuration similar to the magnetic element 101 described above. These magnetic elements are different in a relationship between the maximum frequency which the second ferromagnetic layer 20 is capable of outputting and the magnetic resonance frequency f3 of the third ferromagnetic layer 30.

Figure 4A:
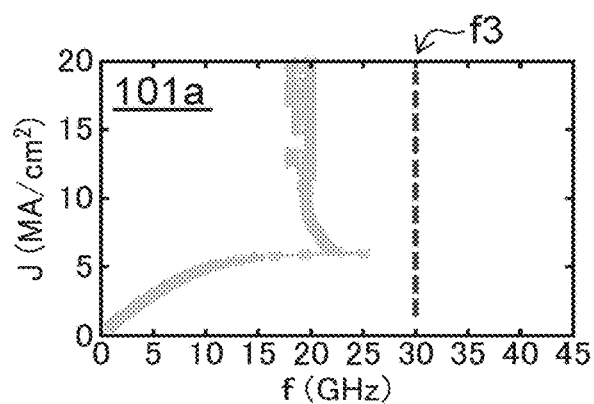
FIG. 4A to FIG. 4D are graphs showing simulation results of characteristics of the magnetic element according to the first embodiment.

In the magnetic element 101a shown in FIG. 4A, the magnetic resonance frequency f3 of the third ferromagnetic layer 30 is approximately 30 GHz. At this time, a ratio of 2γNzMs to the magnetic resonance frequency f3 is approximately 83%. In the magnetic element 101a, a range of the value of the current density 3 near the maximum value of the oscillation frequency is relatively narrow.

Figure 4B:
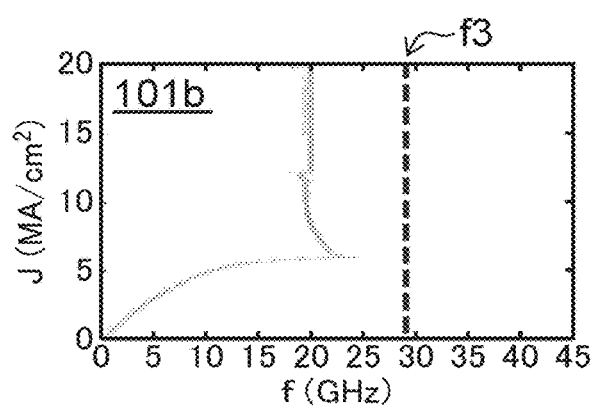

In the magnetic element 101b shown in FIG. 4B, the magnetic resonance frequency f3 of the third ferromagnetic layer 30 is approximately 29 GHz. At this time, a ratio of 2γNzMs to the magnetic resonance frequency f3 is approximately 86%. In the magnetic element 101b, a range of the value of the current density 3 near the maximum value of the oscillation frequency is relatively narrow.

Figure 4C:
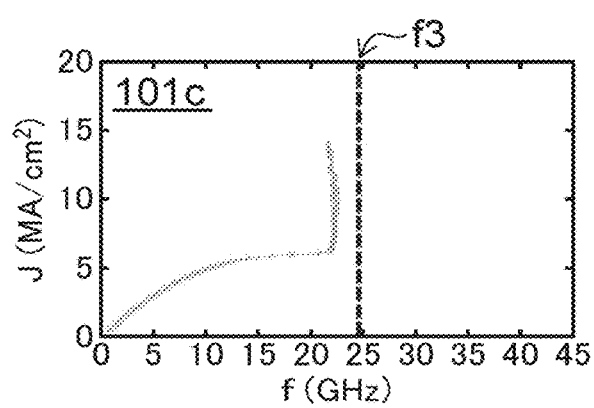

In the magnetic element 101c shown in FIG. 4C, the magnetic resonance frequency f3 of the third ferromagnetic layer 30 is approximately 24.5 GHz. At this time, a ratio of 2γNzMs to the magnetic resonance frequency f3 is approximately 90%. In the magnetic element 101c, a range of the value of the current density 3 near the maximum value of the oscillation frequency is relatively wide. For example, the oscillation frequency f maintains a high value in a range of the current density J approximately from 6 to 10 MA/cm$^2$.

Figure 4D:
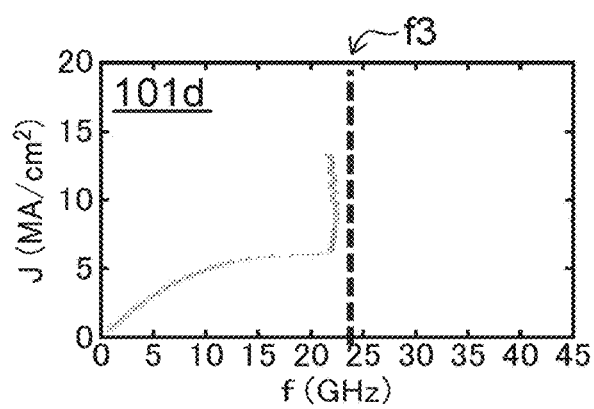

In the magnetic element 101d shown in FIG. 4D, the magnetic resonance frequency f3 of the third ferromagnetic layer 30 is approximately 24 GHz. At this time, a ratio of 2γNzMs to the magnetic resonance frequency f3 is approximately 96%. In the magnetic element 101d, the oscillation frequency f maintains a high value in a range of the current density J approximately from 6 to 12 MA/cm$^2$. The oscillation frequency f is influenced by the magnetic resonance frequency f3 of the third ferromagnetic layer 30. For this reason, in the example of FIG. 4D, the maximum value of the oscillation frequency is lower than the maximum frequency (2γNzMs) which is capable of outputted.

In this manner, the oscillation frequency f of the second ferromagnetic layer 20 becomes high by providing the third ferromagnetic layer 30. Furthermore, when a ratio of 2γNzMs to the magnetic resonance frequency f3 of the third ferromagnetic layer 30 is high, a high frequency magnetic field of the high oscillation frequency can be achieved with stability. It is favorable that 2γNzMs is not less than 0.9 times of the magnetic resonance frequency f3 of the third ferromagnetic layer 30.

Second Embodiment

Figure 5A:
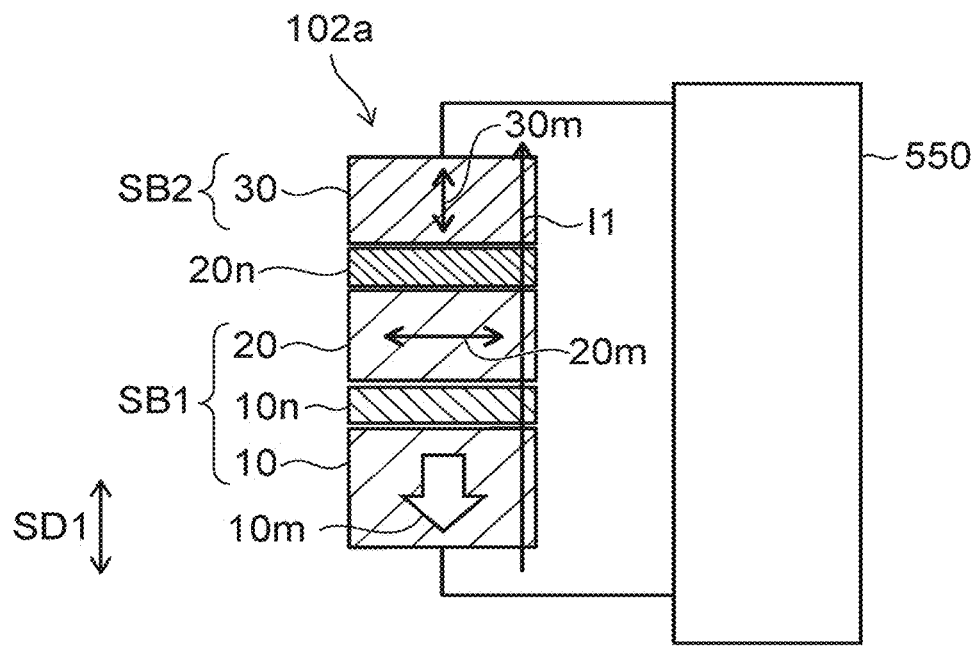
FIG. 5A and FIG. 5B are schematic cross-sectional views showing a magnetic element according to a second embodiment.
Figure 5B:
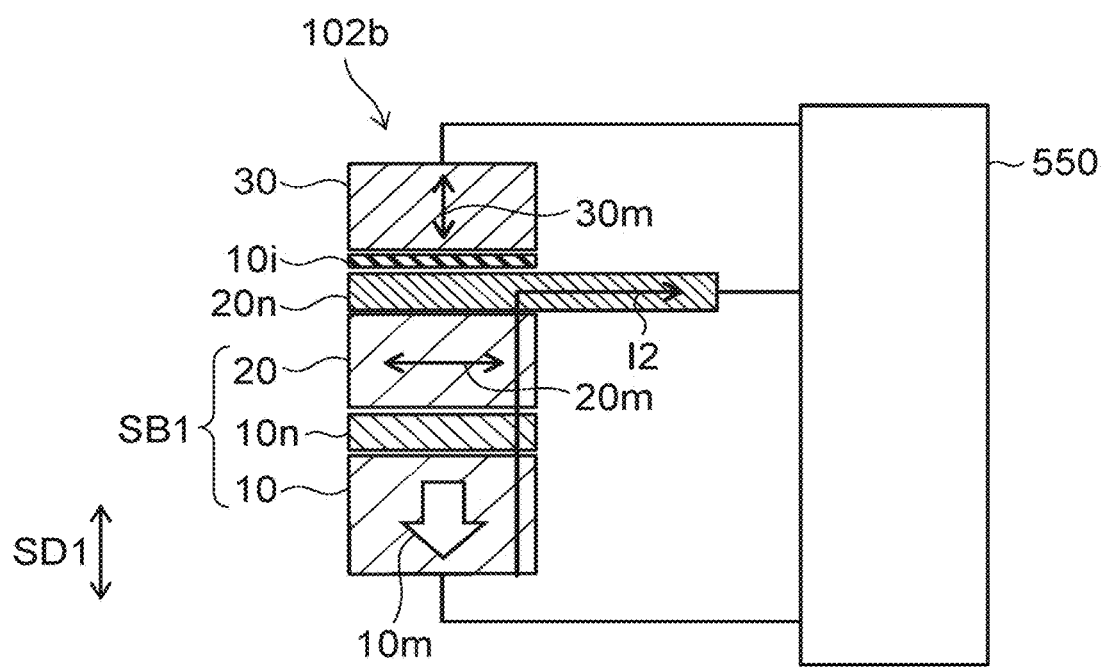

FIG. 5A and FIG. 5B are schematic cross-sectional views illustrating a magnetic element according to a second embodiment.

As shown in FIG. 5A, also in a magnetic element 102a according to the embodiment, the first ferromagnetic layer 10, the second ferromagnetic layer 20, the third ferromagnetic layer 30 and the first non-magnetic layer 10n are provided. These are similar to the magnetic element 101. The magnetic element 102a further includes a second non-magnetic layer 20n.

The second non-magnetic layer 20n is provided between the first stacked unit SB1 and the second stacked unit SB2. In the example of FIG. 5A, the second non-magnetic layer 20n is provided between the second ferromagnetic layer 20 and the third ferromagnetic layer 30. The non-magnetic layer 20n contacts, for example, the second ferromagnetic layer 20 and the third ferromagnetic layer 30.

The second non-magnetic layer 20n is conductive. A current I1 flows through the first stacked unit SB1 and the second stacked unit SB2 via the second non-magnetic layer 20n. Thereby, the high frequency magnetic field can be generated similar to the case of the magnetic element 101.

Also in this example, the second ferromagnetic layer 20 and the third ferromagnetic layer 30 are coupled magnetostatically, coupled ferromagnetically or coupled antiferromagnetically. Thereby, the oscillation frequency f of the second ferromagnetic layer 20 can be increased.

The current I1 flows between the second ferromagnetic layer 20 and the third ferromagnetic layer 30 via the second non-magnetic layer 20n. At this time, if spin information is kept in the second non-magnetic layer 20n, the second ferromagnetic layer 20 may be influenced by the spin transfer torque from the third ferromagnetic layer 30. For this reason, controllability of magnetization rotation of the second ferromagnetic layer 20 may be decreased.

A method for causing the spin torque to hardly propagate includes, for example, making a thickness of the second non-magnetic layer 20n (a length along the first direction SD1) thick. Specifically, the thickness of the second non-magnetic layer 20n is set to be, for example, not less than 3 nm (nanometers). Thereby, the spin torque becomes hard to be transferred, and oscillation state of the second ferromagnetic layer 20 is stabilized. In this case, it is preferable the thickness of the second non-magnetic layer 20n to be not more than 20 nm from a point of view that the second ferromagnetic layer 20 and the third ferromagnetic layer 30 are favorable to be coupled magnetostatically, coupled ferromagnetically or antiferromagnetically.

Another method for causing the spin torque to hardly propagate includes, for example, using a film having a short spin diffusion length such as ruthenium (Ru) (a material having a function of spin loss), or a layer having a structure with a short spin diffusion length for the second non-magnetic layer 20n. In this case, the strength of the spin transfer torque causing the magnetization 20m of the second ferromagnetic layer 20 to precess is determined by spin polarization in the first ferromagnetic layer 10. In this configuration, it is possible to control independently the magnetization of the second ferromagnetic layer 20 without being influenced by other electron spin (spin transfer torque). Thereby, the controllability of the magnetization rotation of the second ferromagnetic layer 20 can be suppressed from reducing. When the material with a short spin diffusion length is used for the second non-magnetic layer 20n, the thickness of the second non-magnetic layer 20n is, for example, not less than 1.4 nm and not more than 20 nm.

Also in the magnetic element 102b according to the embodiment shown in FIG. 5B, the first ferromagnetic layer 10, the second ferromagnetic layer 20, the third ferromagnetic layer 30, the first non-magnetic layer 10n and the second non-magnetic layer 20n are provided similar to the magnetic element 102a.

In the magnetic element 102b, the second non-magnetic layer 20n is electrically connected to the controller 550. In this example, the second non-magnetic layer 20n is a non-magnetic interconnection layer (conductive layer).

As shown in FIG. 5B, the controller 550 flows a current I2 into the first stacked unit SB1 and the second non-magnetic layer 20n. Thereby, a high frequency magnetic field can be generated in the second non-magnetic layer 20n similar to the case of the magnetic element 101. Also in this example, the second ferromagnetic layer 20 and the third ferromagnetic layer 30 are coupled magnetostatically, coupled ferromagnetically or antiferromagnetically. Thereby, the oscillation frequency f of the second ferromagnetic layer 20 can be increased.

When the controller 550 flows the current I2, the current does not flow through, for example, the third ferromagnetic layer 30. The current does not flow through the third ferromagnetic layer 30, and thus the second ferromagnetic layer 20 does not become to be influenced by the spin transfer torque from the third ferromagnetic layer 30. Thereby the oscillation can be stabilized.

As shown in FIG. 5B, the magnetic element 102b may further include an insulating layer 10i provided between the third ferromagnetic layer 30 and the second non-magnetic layer 20n.

Third Embodiment

Figure 6:
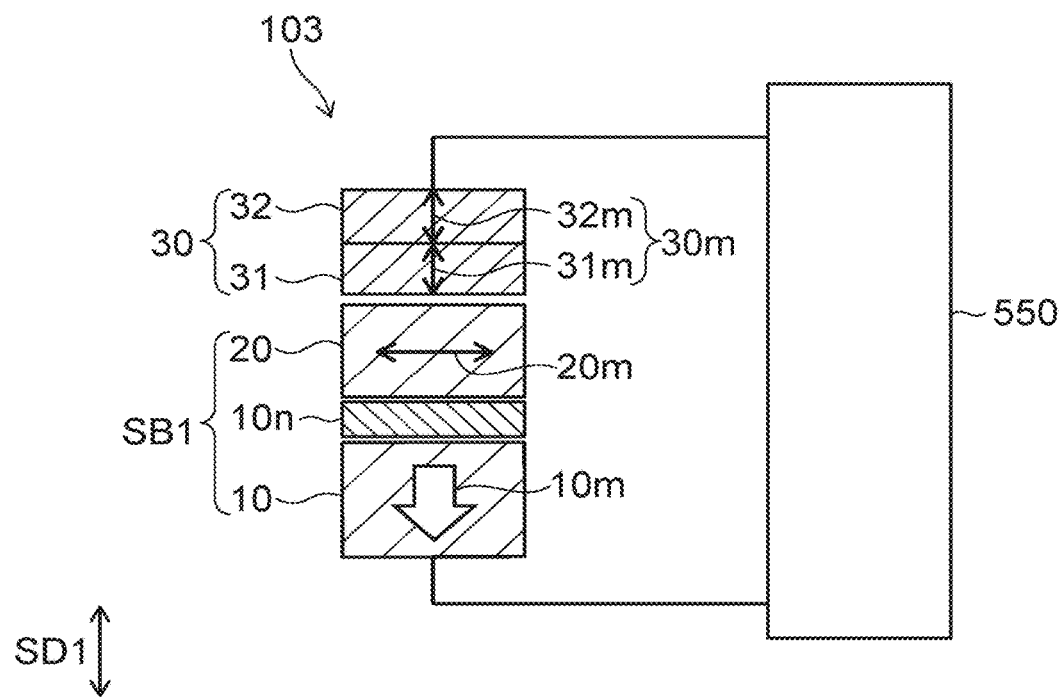
FIG. 6 is a schematic cross-sectional view showing a magnetic element according to a third embodiment.

FIG. 6 is a schematic cross-sectional view illustrating a magnetic element according to a third embodiment.

As shown in FIG. 6, the third ferromagnetic layer of a magnetic element 103 includes a first portion 31 and a second portion 32. Other than the above, the description similar to the magnetic element described above can be applied to the magnetic element 103.

A direction of a magnetization 31m of the first portion 31 is variable. When the current does not flow through the magnetic element 103, the direction of the magnetization 31m is, for example, along the first direction SD1.

The second portion 32 is stacked with the first portion 31 in the first direction SD1. In this example, the first portion 31 is provided between the first stacked unit SB1 and the second portion 32. The second portion 32 may be provided between the first stacked unit SB1 and the first portion 31.

A direction of a magnetization 32m of the second portion 32 is variable. When the current does not flow through the magnetic element 103, the direction of the magnetization 32m is, for example, along the second direction SD2.

The magnetic resonance frequency of the second portion 32 is lower than the magnetic resonance frequency of the first portion 31. The magnetic resonance frequency of the first portion 31 is, for example, not less than 20 GHz. The magnetic resonance frequency of the second portion 32 is, for example, less than 20 GHz.

The first portion 31 and the second portion 32 are, for example, based on an alloy. A concentration of at least one element included in the second portion 32 is different from a concentration of the same element included in the first portion 31. That is, a composition ratio of the alloy included in the second portion 32 is different from a composition ratio included in the first portion 31. The second portion 32 is, for example, a portion having the composition ratio changed from the first portion 31 in the third ferromagnetic layer 30.

The material of the second portion 32 may be different from the material of the first portion 31. In this case, the first portion 31 and the second portion 32 can be regarded to be one layer included in the third ferromagnetic layer 30, respectively. That is, the third ferromagnetic layer 30 may be a stacked body including a first layer and a second layer.

The magnetization 31m of the first portion 31 and the magnetization 32m of the second portion 32 are coupled magnetostatically, coupled ferromagnetically or antiferromagnetically. The second magnetization 20m of the second ferromagnetic layer 20 and the magnetization 31m of the first portion 31 are coupled magnetostatically, coupled ferromagnetically or antiferromagnetically. The third magnetization 30m of the whole third ferromagnetic layer 30 can be also said to be an average value of the magnetization 31m of the first portion 31 and the magnetization 32m of the second portion 32. At this time, the magnetization 30m of the third ferromagnetic layer 30 and the second magnetization 20m of the second ferromagnetic layer 20 are coupled magnetostatically, coupled ferromagnetically or antiferromagnetically.

As described in the first embodiment, $2\gamma N_z M_s$ is desirable to be greater than 0.9 times of the magnetic resonance frequency f3 of the third ferromagnetic layer 30. In order to realize this relationship, for example, it is conceived to make the magnetic resonance frequency f3 of the third ferromagnetic layer 30 low. For example, a material having small anisotropic magnetic field (namely, a material having small effective magnetic field Heff) is selected as the material of the third ferromagnetic layer 30. However, in this case, the selection range of materials used for the third ferromagnetic layer 30 may be narrowed.

In contrast, in the embodiment, the third ferromagnetic layer 30 includes the first portion 31 and the second potion 32 having different magnetic resonance frequencies each other. When the first portion 31 and the second portion 32 are coupled magnetically, the precession of the magnetization 31m of the first portion 31 works with the precession of the magnetization 32m of the second portion 32. Thereby, the magnetic resonance frequency f3 of the whole third ferromagnetic layer 30 is lowered.

The magnetic resonance frequency f3 of the third ferromagnetic layer 30 takes a value between the magnetic resonance frequency of the first portion 31 and the magnetic resonance frequency of the second portion 32. Thereby, the relationship of ($2\gamma NzMs \geq f3 \times 0.9$) is likely to be realized. Therefore, it becomes possible to maintain a state of high oscillation frequency over a wide current range.

Fourth Embodiment

Figure 7:
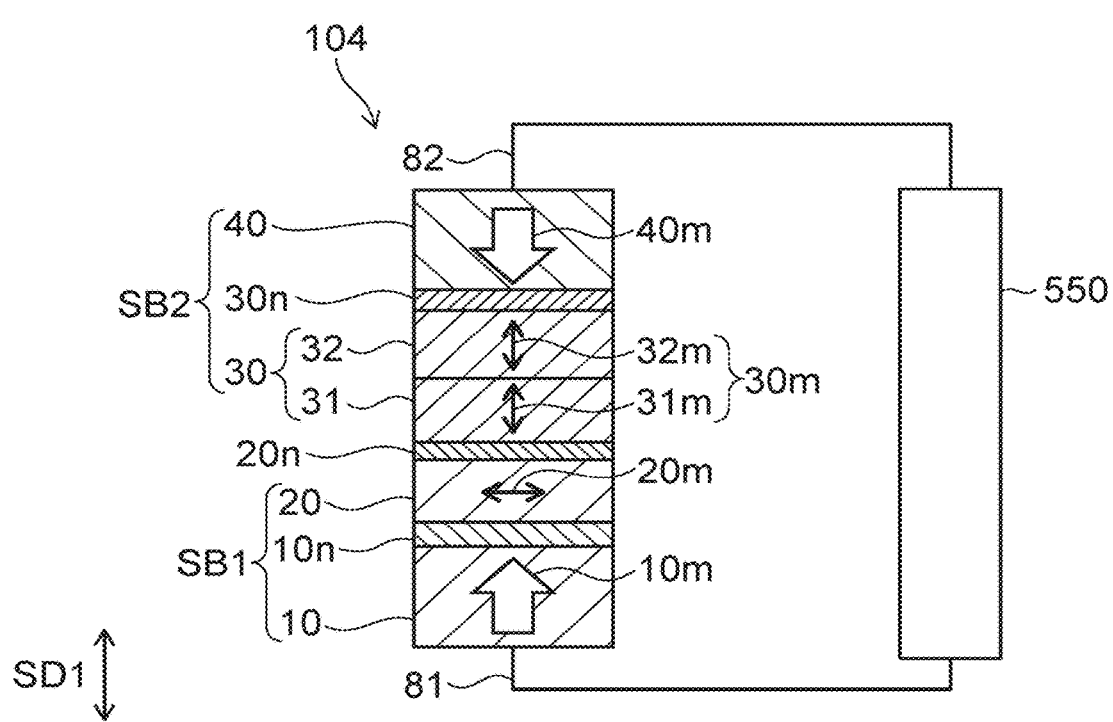
FIG. 7 is a schematic cross-sectional view showing a magnetic element according to a fourth embodiment.

FIG. 7 is a schematic cross-sectional view illustrating a magnetic element according to a fourth embodiment.

As shown in FIG. 7, in a magnetic element 104 according to the embodiment, the second stacked unit SB2 includes a third non-magnetic layer 30n and the fourth ferromagnetic layer 40. Other than the above, the magnetic element 104 is similar to the magnetic elements according to the previous embodiments.

The fourth ferromagnetic layer 40 is stacked with the third ferromagnetic layer 30 in the first direction SD1. In the example of FIG. 7, the third ferromagnetic layer 30 is located between the fourth ferromagnetic layer 40 and the first stacked unit SB1.

The fourth ferromagnetic layer 40 has a fourth magnetization 40m. A direction of the fourth magnetization 40m is substantially fixed. The direction of the fourth magnetization 40m has a component parallel to the first direction SD1. The fourth ferromagnetic layer 40 is, for example, a perpendicular magnetization film.

In the example of FIG. 7, the direction of the fourth magnetization 40m of the fourth ferromagnetic layer 40 is downward, and the direction of the first magnetization 10m of the first ferromagnetic layer 10 is upward. A direction of the component of the first direction SD1 of the fourth magnetization 40m is, for example, reverse to a direction of the component of the first direction SD1 of the first magnetization 10m. However, the direction of the first magnetization 10m and the direction of the fourth magnetization 40m are variable. For example, both of the direction of the first magnetization 10m and the direction of the fourth magnetization 40m may be upward or downward, and one may be upward and the other may be downward.

The third non-magnetic layer 30n is provided between the third ferromagnetic layer 30 and the fourth ferromagnetic layer 40. The third non-magnetic layer 30n contacts, for example, the third ferromagnetic layer 30 and the fourth ferromagnetic layer 40.

The magnetic element 104 functions, for example, as a magnetic memory element. When the third non-magnetic layer 30n is conductive, the magnetic element 104 serves as a GMR (Giant MagetoResistive) element. When the third non-magnetic layer 30n is insulative, the magnetic element 104 serves as a TMR (Tunneling MagnetoResistive) element. The TMR element has a large magnetoresistance effect and has good consistency with CMOS, therefore the TMR element is preferred.

In the following, the configuration and operation of the magnetic element 104 as the magnetic memory element will be described. The following descriptions can be also applied to other magnetic memory elements (magnetic elements) described later according to the embodiment.

In the magnetic element 104, a spin polarized electron is operated on the ferromagnetic layer 30 by causing a current (writing current) to flow through the first stacked unit SB1 and stacked unit SB2. The generated rotating magnetic field is operated on the third ferromagnetic layer 30 by causing the magnetization of the second ferromagnetic layer 20 to precess. Thereby, the direction of the third magnetization 30m of the third ferromagnetic layer 30 (direction of the magnetization 31m and the magnetization 32m) is determined to be a direction corresponding to a direction of the current.

The fourth ferromagnetic layer 40 functions, for example, as a magnetization fixed layer. In the fourth ferromagnetic layer 40, for example, the fourth magnetization 40m is fixed to a generally perpendicular direction to the film surface. The direction of the fourth magnetization 40m of the fourth ferromagnetic layer 40 is along the first direction SD1, and, for example, generally parallel to the first direction SD1.

As described already, the direction of the third magnetization 30m of the third ferromagnetic layer 30 is variable, and along the first direction SD1. The direction of the magnetization of the third ferromagnetic layer 30 is reversible. The third ferromagnetic layer 30 has a role to store data. The third ferromagnetic layer 30 functions, for example, as a magnetic memory layer.

In this example, the third ferromagnetic layer 30 includes the first portion 31 and the second portion 32. For example, the direction of the magnetization 31m of the first portion 31 is generally parallel to the first direction SD1 and reversible. As described later, an electrical resistance between the third ferromagnetic layer 30 and the fourth ferromagnetic layer 40 having the third non-magnetic layer 30n interposed changes depending on the direction of the magnetization 31m. A state of the magnetization 31m can be discriminated by the electrical resistance. Consequently, the first portion 31 is said to have the function to store information.

The direction of the magnetization 32m of the second portion 32 is also, for example, generally parallel to the first direction SD1, and reversible. The magnetic resonance frequency f3 of the third ferromagnetic layer 30 can be lowered similarly to the third embodiment by providing the second portion 32.

The second portion 32 also contributes to memory holding of the data. Therefore, it may be considered that the third ferromagnetic layer 30 is the magnetic memory layer and the first portion 31 is a main body of memory holding.

The third non-magnetic layer 30n functions as a spacer layer. When the third non-magnetic layer 30n is a tunnel barrier layer based on an insulating material, the second stacked unit SB2 including the fourth ferromagnetic layer 40, the third non-magnetic layer 30n and the third ferromagnetic layer 30 has, for example, a structure of MTJ (Magnetic Tunnel Junction).

The second ferromagnetic layer, as described already, functions as a magnetization rotation layer (oscillation layer). The second ferromagnetic layer 20 has a role to generate a high frequency magnetic field at writing.

When an electron current is flown in a direction perpendicular to the film surface, the second magnetization 20m of the second ferromagnetic layer 20 of a magnetic field source precesses. Thereby, the rotation magnetic field (high frequency magnetic field) is generated. The high frequency magnetic field has a component of the direction perpendicular to the third magnetization 30m (magnetization 31m and magnetization 32m) of the third ferromagnetic layer 30 (component of the direction of a hard magnetization axis of the third ferromagnetic layer 30). Therefore, at least a portion of the high frequency magnetic field generated from the second ferromagnetic layer 20 is applied to the direction of the hard magnetization axis of the third ferromagnetic layer 30. When the high frequency magnetic field generated from the second ferromagnetic layer 20 is applied to the direction of the hard magnetization axis of the third ferromagnetic layer 30, the third magnetization 30m of the third ferromagnetic layer 30 is easy to be reversed.

In the magnetic element 104, the direction of the third magnetization 30m of the third ferromagnetic layer 30 can be controlled by causing an electron current to flow through the first stacked unit SB1 and the second stacked unit SB2. Specifically, the direction of the magnetization 31m and the direction of the magnetization 32m can be reversed by changing the direction of the flowing electron current (polarity). In the case of storing information, for example, "0" and "1" are allotted respectively depending on the direction of the third magnetization 30m (magnetization 31m) of the third ferromagnetic layer 30. The magnetic element 104 has a first state or a second state different from the first state. Each of the first state and the second state corresponds to different two directions of the third magnetization 30m (magnetization 31m) of the third ferromagnetic layer 30.

It is favorable that a width (diameter) of the second ferromagnetic layer 20 is not more than 35 nm. When the width of the second ferromagnetic layer 20 is greater than 35 nm, for example, vortex (closure domain) occurs in accordance with the precession of the second magnetization 20m of the second ferromagnetic layer 20. The occurrence of the vortex is suppressed, for example, by setting a circle equivalent diameter of a sectional shape of the second ferromagnetic layer 20 not more than 35 nm and a thickness of the second ferromagnetic layer 20 not less than 0.5 nm and not more than 3.5 nm. Thereby, for example, it is possible to cause the high frequency magnetic field generated from the second ferromagnetic layer 20 to operate adequately on the magnetization of the third ferromagnetic layer 30 and to assist magnetization reversal of the third ferromagnetic layer 30. That is, it is possible to obtain the magnetic field strength sufficient for reversing the third magnetization 30m (magnetization 31m and magnetization 32m) at a position of the third ferromagnetic layer 30.

When the circular equivalent diameter of the transverse sectional shape (sectional shape when cutting by a plane perpendicular to the first direction SD1) of the second ferromagnetic layer 20 is R (nm), a half value of "R" is r (=R/2) (nm), and a layer thickness is t (nm), it is desirable that sizes satisfy a relationship equation of $r < 0.419t^2 - 2.86t + 19.8$.

In the specification, "circle equivalent diameter" is referred to as a diameter of a circle under the assumption of the circle having the same area as an area in a planar shape to be objected. For example, when the transverse sectional shape of the third ferromagnetic layer 30 is circular, "R" means a diameter. When the transverse sectional shape of the third ferromagnetic layer 30 is elliptic, "R" means a diameter of a circle having the same area as the area of the ellipse. When the transverse sectional shape of the third ferromagnetic layer 30 is polygonal, "R" means a diameter of a circle having the same area as the area of the polygon.

The specific example of the operation of the magnetic element 104 is firstly described based on the example of "writing" operation.

FIG. 8A to FIG. 8E and FIG. 9A to FIG. 9E are schematic views illustrating the operation of the magnetic element according to the fourth embodiment.

These figures illustrate states of the first stacked unit SB1 and the second stacked unit SB2 at "writing" operation in the magnetic element 104. In the writing operation, the writing operation to the third ferromagnetic layer 30 is implemented by flowing an electron current 60 (writing current) so as to pass over the film surfaces of the third ferromagnetic layer 30 and the fourth ferromagnetic layer 40. Here, the case where the magnetoresistance effect via the third non-magnetic layer 30n is a normal type is described.

In the magnetoresistance effect of the "normal type", an electrical resistance when magnetizations of magnetic layers on both sides of the non-magnetic layer are parallel each other is lower than an electrical resistance when being antiparallel. In the case of the normal type, when the magnetization 31m and the magnetization 32m of the third ferromagnetic layer 30 are parallel to the fourth magnetization 40m of the fourth ferromagnetic layer 40, the electrical resistance between the third ferromagnetic layer 30 and the fourth ferromagnetic layer 40 having the third non-magnetic layer interposed is lower than when being antiparallel.

FIG. 8A to FIG. 8E illustrate the case where the direction of the magnetization 31m and the direction of the magnetization 32m are reversed from downward to upward.

Figure 8A:
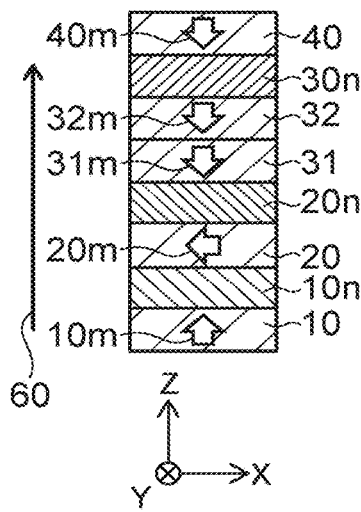
FIG. 8A to FIG. 8E are schematic views showing operation of the magnetic element according to the fourth embodiment.
Figure 8B:
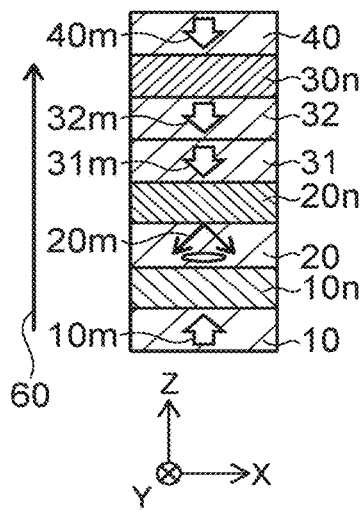
Figure 8C:
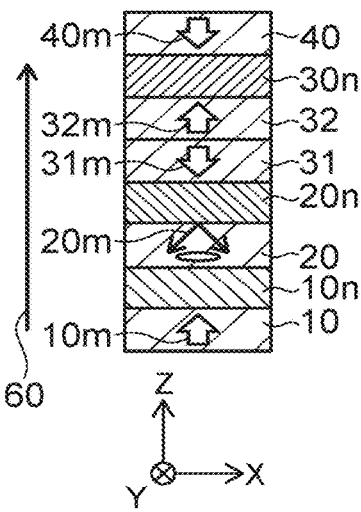
Figure 8D:
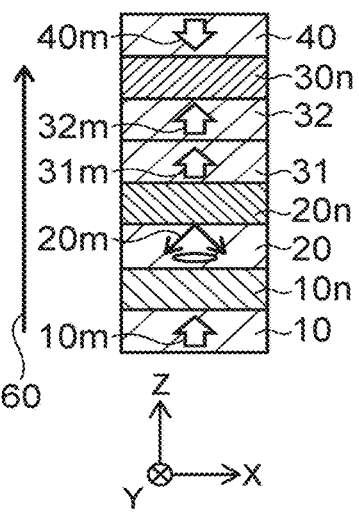
Figure 8E:
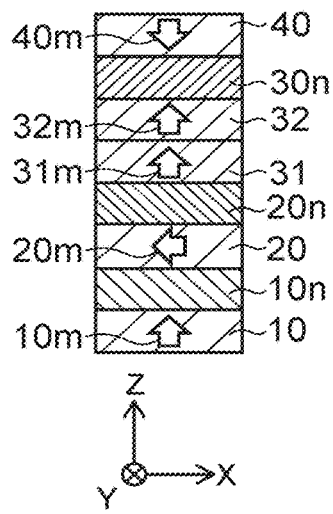

FIG. 8A illustrates a state of starting the flow of the electron current 60. FIG. 8E illustrates a state of finishing the flow of the electron current 60 (state of the magnetization 31m and the magnetization 32m reversed). FIG. 8B to FIG. 8D illustrate states on the way.

As shown in FIG. 8A, in the case where the direction of the magnetization 31m and the direction of the magnetization 32m are reversed from downward to upward, the electron current 60 is flown from the first stacked unit SB1 toward the second stacked unit SB2. That is, the electron current 60 is flown upward.

When the electron current 60 is flown upward, electrons with the same oriented spin (in this example, downward) as the magnetization 40m of the fourth ferromagnetic layer 40 out of electrons passing through the third non-magnetic layer 30n pass through the fourth ferromagnetic layer 40. On the other hand, electrons with reversely oriented spin (in this example, upward) to the magnetization 40m of the fourth ferromagnetic layer 40 are reflected at an interface between the fourth ferromagnetic layer 40 and the third non-magnetic layer 30n. An angular momentum of spin of the reflected electrons is transmitted to the third ferromagnetic layer 30 and operates on the magnetization 31m and the magnetization 32m of the third ferromagnetic layer 30.

As shown in FIG. 8B, when the electron current 60 is flown through the first stacked unit SB1, the second magnetization 20m of the second ferromagnetic layer 20 precesses and the rotating magnetic field is generated. The electron passing through the first ferromagnetic layer 10 having the first magnetization 10m of the direction generally perpendicular to the film surface comes to have the same directional spin as the first magnetization 10m of the first ferromagnetic layer 10. When this electron is flown into the second ferromagnetic layer 20, the angular momentum of the spin is transmitted to the second ferromagnetic layer 20, and operates on the second magnetization 20m of the second ferromagnetic layer 20. That is, the spin transfer torque acts. Thereby, supply of the electron current 60 causes the second magnetization 20m to precess. The spin polarization degree of the electron passing through the second ferromagnetic layer 20 is lost by passing through the second non-magnetic layer 20n.

As shown in FIG. 8C, when the second magnetization 20m of the second ferromagnetic layer 20 precesses, the direction of the magnetization 32m of the second portion 32 is reversed from downward to upward by the operation of the rotating magnetic field from the second ferromagnetic layer 20 and the operation of the spin polarized electron reflecting at the interface of the fourth ferromagnetic layer 40. As described previously, the magnetic resonance frequency of the second portion 32 is lower than the magnetic resonance frequency of the first portion 31. Thereby, the magnetization 32m of the second portion 32 is reversed from downward to upward by the operation of the electron with upward spin and the operation of the rotating magnetic field.

As shown in FIG. 8D, when the magnetization 32m of the second portion 32 is reversed from downward to upward, the magnetization 31m of the first portion 31 is reversed from downward to upward by the operation of the spin polarized electron, the operation of the rotating magnetic field from the second ferromagnetic layer 20 and the operation of the magnetically coupled magnetization 32m.

As shown in FIG. 8E, when the supply of the electron current 60 is stopped, the precession of the second magnetization 20m stops, and the direction of the magnetization 31m and the direction of the magnetization 32m are maintained in a state reversed from downward to upward. For example, "0" is allotted to the state of the third ferromagnetic layer 30 having the magnetization 31m and the magnetization 32m of this reversed direction. In the magnetic element 104, for example, the state where the direction of the magnetization 31m and the direction of the magnetization 32m are upward corresponds to the first state.

FIG. 9A to FIG. 9E illustrate the case where the magnetization 31m of the first portion 31 and the magnetization 32m of the second portion 32 are reversed from upward to downward.

Figure 9A:
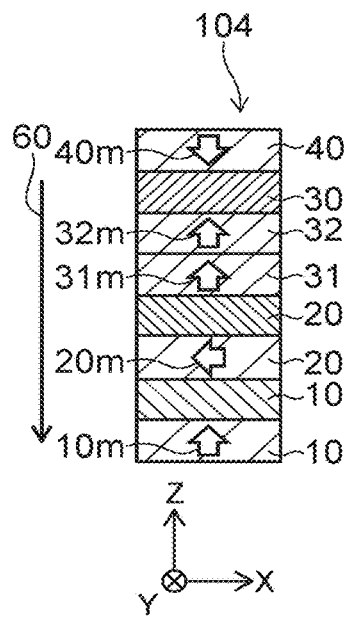
FIG. 9A to FIG. 9E are schematic views showing operation of the magnetic element according to the fourth embodiment.
Figure 9B:
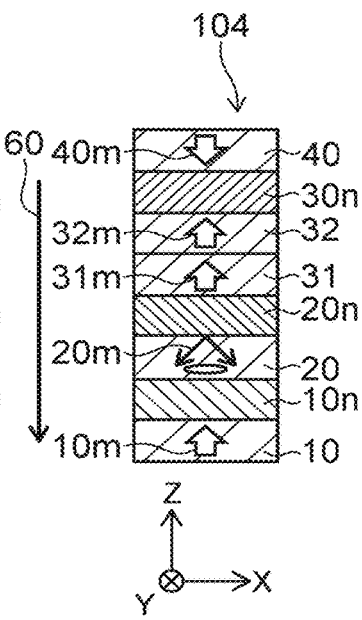
Figure 9C:
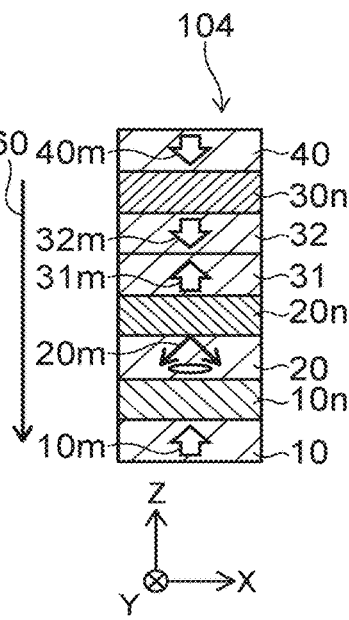
Figure 9D:
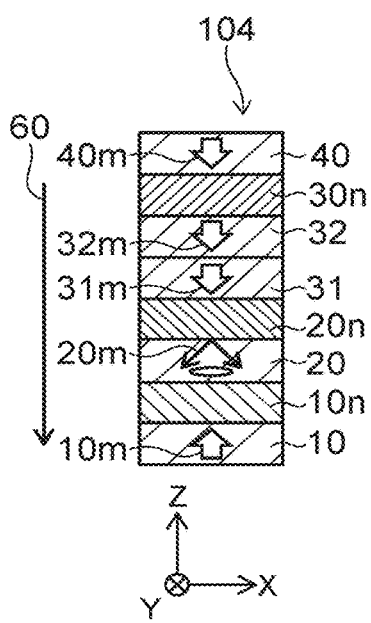
Figure 9E:
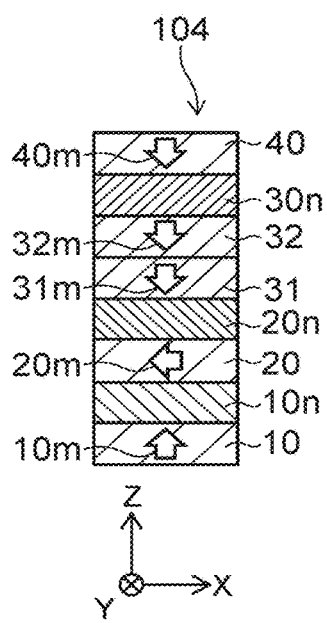

FIG. 9A illustrates a state of starting the flow of the electron current 60. FIG. 9E illustrates a state of finishing the flow of the electron current 60 (state of the magnetization 31m and the magnetization 32m reversed). FIG. 9B to FIG. 9D illustrate states on the way.

As shown in FIG. 9A, in the case where the direction of the magnetization 31m and the direction of the magnetization 32m are reversed from upward to downward, the electron current 60 is flown from the second stacked unit SB2 toward the first stacked unit SB1. That is, the electron current 60 is flown downward.

As shown in FIG. 9B, when the electron current 60 is flown, the second magnetization 20m of the second ferromagnetic layer 20 precesses and the rotating magnetic field is generated. Electrons with reversely oriented spin to the magnetization 10m of the first ferromagnetic layer 10 are reflected at an interface between the first ferromagnetic layer and the first non-magnetic layer 10n. An angular momentum of spin of the reflected electrons is transmitted to the second ferromagnetic layer 20 and operates on the second magnetization 20m of the second ferromagnetic layer 20. Thereby, the second magnetization 20m precesses.

When the electron current 60 is flown downward, electrons with the same oriented spin (in this example, downward) as the magnetization 40m of the fourth ferromagnetic layer 40 pass through the fourth ferromagnetic layer 40, and are transmitted to the third ferromagnetic layer 30. Thereby, the operation of the electrons with the downward spin and the operation of the rotating magnetic field from the second ferromagnetic layer 20 acts on the magnetization 31m and the magnetization 32m.

As shown in FIG. 9C, the direction of the magnetization 32m of the second portion 32 is reversed from upward to downward by the operation of the spin polarized electron and the operation of the rotating magnetic field from the second ferromagnetic layer 20.

As shown in FIG. 9D, when the magnetization 32m of the second portion 32 is reversed from upward to downward, the magnetization 31m of the first portion 31 is reversed from upward to downward by the operation of the spin polarized electron, the operation of the rotating magnetic field from the third ferromagnetic layer 30 and the operation of the magnetically coupled magnetization 32m.

As shown in FIG. 9E, when the supply of the electron current 60 is stopped, the precession of the second magnetization 20m stops, and the direction of the magnetization 31m and the direction of the magnetization 32m are maintained in a state reversed from upward to downward. For example, "1" is allotted to the state of the third ferromagnetic layer 30 having the magnetization 31m and the magnetization 32m of this reversed direction. In the magnetic element 104, for example, the state where the direction of the magnetization 31m and the direction of the magnetization 32m are downward corresponds to the second state.

"0" or "1" is allotted appropriately to each of multiple different states of the third ferromagnetic layer 30 on the basis of the operation like this. Thereby, "writing" in the magnetic element 104 is implemented.

In the case where the magnetoresistance effect is the "reverse type", when the magnetization 31m and the magnetization 32m are parallel to the fourth magnetization 40m of the fourth ferromagnetic layer 40, the electrical resistance between the third ferromagnetic layer 30 and the fourth ferromagnetic layer 40 having the third non-magnetic layer 30n interposed is higher than when being antiparallel. The "writing" operation in the reverse type is similar to the case of the normal type.

In this example, for example, the first state is "0" and the second state is "1". The first state may be "1" and the second state may be "0". The first state and the second state are not limited to "0" or "1", but may be other states. The number of states provided in the magnetic element 104 may be not less than 3. That is, the magnetic element 104 may be a memory element of multi bits.

Setting of the first state or the second state is implemented by the controller 550.

The supply of the electron current 60 is performed by, for example, the controller 550. The controller 550 supplies, for example, the electron current 60 for not less than 0.2 seconds to the magnetic element 104 in the writing operation. In the case where the electron current 60 is supplied for not less than 10 nanoseconds, the direction of the magnetization 31m and the direction of the magnetization 32m can be adequately reversed, for example, by supplying the electron current 60. In the case where the electron current 60 is supplied for not less than 1 nanosecond and not more than 3 nanoseconds, a time necessary for the writing operation can be suppressed, for example, while reversing the magnetization adequately.

Next, the example of "reading" operation will be described.

Detection of the direction of the magnetization 31m and the magnetization 32m in the magnetic element 104 is implemented, for example, by using the magnetoresistance effect. In the magnetoresistance effect, the electrical resistance changes depending on relative direction of the magnetization of each layer. In the case where the magnetoresistance effect is used, for example, a sense current is flown between the third ferromagnetic layer 30 and the fourth ferromagnetic layer 40, and a magnetic resistance is measured. A current value of the sense current is smaller than a current value corresponding to the electron current 60 flowing at the writing (at storing).

Figure 10A:
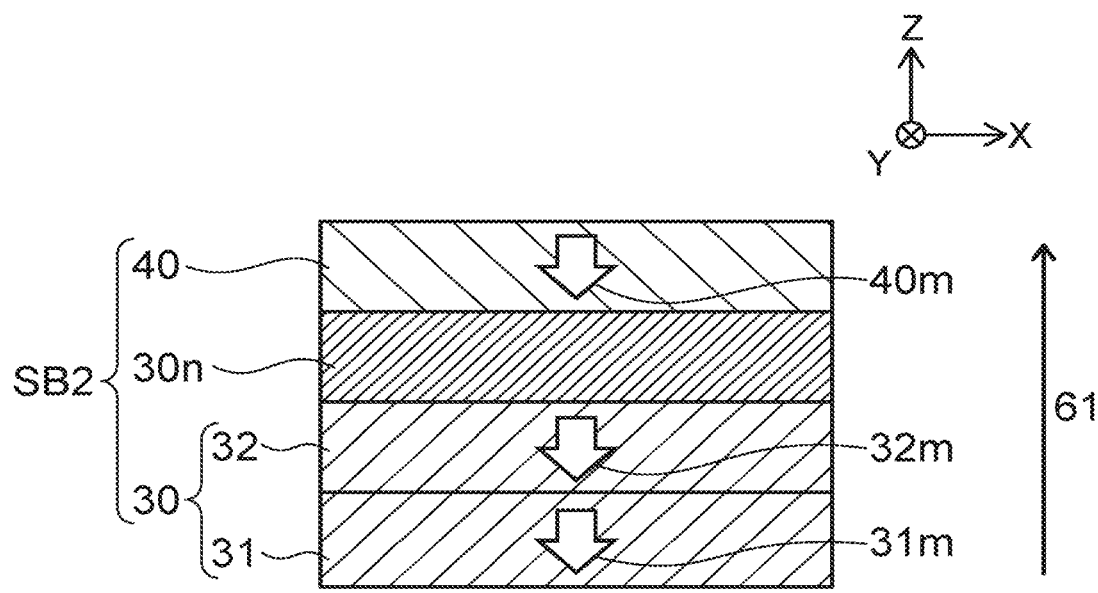
FIG. 10A and FIG. 10B are schematic views showing operation of the magnetic element according to the fourth embodiment.
Figure 10B:
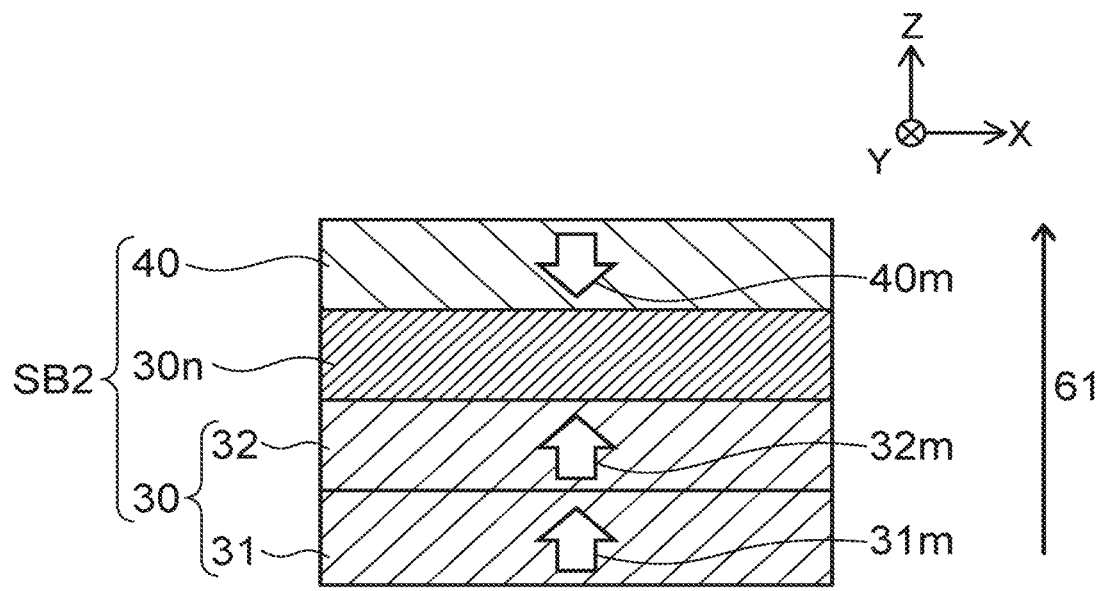

FIG. 10A and FIG. 10B are schematic views illustrating operation of the magnetic element according to the fourth embodiment.

These figures illustrate the state of the second stacked unit SB2 at the "reading" operation in the magnetic element 104. These figures omit the first stacked unit SB1, the conductive layer 81, the conductive layer 82 and the second nonmagnetic layer 20n.

FIG. 10A illustrates the case where the direction of the magnetization 40m of the fourth ferromagnetic layer 40 is the same as the direction of the magnetization 31m and the magnetization 32m. FIG. 10B illustrates the case where the direction of the magnetization 40m of the ferromagnetic layer 40 is antiparallel (reverse direction) to the direction of the magnetization 31m and the magnetization 32m.

As shown in FIG. 10a and FIG. 10B, a sense current 61 is flown through the second stacked unit SB2, and the electrical resistance is detected.

In the magnetoresistance effect of the normal type, the resistance in the state of FIG. 10A is lower than the resistance in the state of FIG. 10B. In the magnetoresistance effect of the reverse type, the resistance of the state of FIG. 10A is higher than the resistance of the state of FIG. 10B.

"0" and "1" are corresponded respectively to each of the multiple states having these different resistances each other, and thus the memory of two valued data becomes possible to be read. The direction of the sense current 61 may be reverse to the direction illustrated in FIG. 10A and FIG. 10B.

The supply of the sense current 61 is performed by, for example, the controller 550. The controller 550 supplies, for example, the sense current for not more than 10 nanoseconds to the magnetic element 104 in the reading operation. Thereby, for example, the reversal of the magnetization 31m and the magnetization 32m due to the supply of the sense current 61 can be suppressed. It is preferred to be not more than 5 nanoseconds. Thereby, the reversal of the magnetization due to the supply of the sense current 61 can be more adequately suppressed.

At this time, it is favorable to use a voltage constant method in which the controller 550 supplies the constant voltage. For example, with decreasing the size of the element, the characteristics of the element may fluctuate due to the fluctuation of the element size caused in manufacturing. Here, the resistance value of the element increases with decreasing the size of the element, therefore the current value for the reading is lowered in the voltage constant method. For this reason, also in the case where the size of the element is decreased by using the voltage constant method, incorrect writing becomes difficult to occur. For example, it is supposed to read by the sense current of not less than 1 nanosecond and not more than 5 nanoseconds. However, a current constant method in which the controller 550 supplies a constant current may be used.

In this manner, the controller 550 sets a time for supplying the current to the magnetic element 104 at the "writing" longer than a time for supplying the current to the magnetic element 104 at the "reading". The controller 550, for example, supplies a current of a first time to the magnetic element 104 at the "writing" and supplies a current of a second time to the magnetic element 104 at the "reading". Here, the first time is longer than the second time. Thereby, for example, the stable "writing" operation and the stable "reading" operation can be obtained.

A writing current of 10 nanoseconds to 30 nanoseconds is supposed as a memory operation corresponding to DRAM. On the other hand, a writing current of 1 nanosecond to 3 nanoseconds is supposed as usage corresponding to a cache memory.

The writing time (first time) is, for example, not less than 10 nanoseconds, and the reading time (second time) is less than 10 nanoseconds. In the magnetization reversal of not more than 3 nanoseconds, the magnetization becomes difficult to be influenced by the heat (assist effect by the phonon), and thus the current necessary for the reversal starts to increase. The vicinity of 1 nanosecond is called as a dynamic region, the magnetization is not influenced by the heat (phonon), and thus the current necessary for the reversal is further increased.

Then, for example, the writing is performed for not less than 10 nanoseconds and the reading is performed within not more than 3 nanoseconds. The writing is performed for not less than 1 nanosecond and not more than 3 nanoseconds, and the reading is performed at the current value smaller than at the writing and within not more than 3 nanoseconds, and thus the incorrect writing rate can be further decreased.

As described above, in the magnetic element 104, the first stacked unit SB1 functions as a magnetic field source. The second stacked unit SB2 functions as a magnetic memory unit. The first stacked unit SB1 may be called as the magnetic field source or STO (Spin Torque Oscillator). On the other hand, the second stacked unit SB2 may be called as the magnetic memory unit or MTJ.

As described above, the writing to the third ferromagnetic layer 30 serving as a memory layer of the MTJ element is performed, for example, by a spin torque writing method. In the magnetic element 104 like this, for example, it is desirable that the width of the magnetic element 104 is set to be not more than 35 nm from request for achieving high memory density. The width of the magnetic element 104 is, for example, a length of the magnetic element 104 in the X-axis direction or the Y-axis direction. In the case where a shape of the magnetic element 104 projected onto the X-Y plane is circular or elliptic, the width of the magnetic element 104 is a diameter (long diameter) of the magnetic element 104.

In the magnetic element 104, it is desirable that an exchange coupling constant Jex (erg/cm$^2$: erg/square centimeter) between the magnetization 31m of the first portion 31 and the magnetization 32m of the second portion 32 is large. For example, Jex>2 erg/cm$^2$ is preferable from a point of view that the coupling between the magnetization 31m and the magnetization 32m is not cut when a current flows through the magnetic element 104.

In the magnetic element (magnetic memory element, MTJ element) according to the embodiment, the third ferromagnetic layer 30 may not always include the first portion 31 and the second portion 32 described above. For example, a concentration (composition ratio) of an element included in the third ferromagnetic layer 30 may be substantially uniform in the third ferromagnetic layer 30. In this case, the third ferromagnetic layer 30 can be regarded as one layer having the third magnetization 30m. The third ferromagnetic layer 30 may include 3 or more multiple portions (multiple layers). In this case, for example, since the multiple portions included in the third ferromagnetic layer 30 couple magnetically one another, the net magnetization produced in the whole third ferromagnetic layer 30 can be regarded as the third magnetization 30m. In the case described above, the operation of the magnetic memory element corresponds to the case where the magnetization 31m and the magnetization 32m in the description of the above operation reverse simultaneously as the third magnetization 30m. The description of the operation of the magnetic memory element other than this is similar to the descriptions in FIG. 8A to FIG. 8E and FIG. 9A to FIG. 9E.

The MTJ element as described above corresponds to an element holding the memory state in MRAM (Magnetoresistive Random Access Memory). It is required that the diameter of the MTJ element is decreased for improving the integration of MRAM.

On the other hand, when the element diameter is made small and a volume of the magnetic memory layer (third ferromagnetic layer 30) is decreased, a thermal agitation resistance is lowered. When the thermal agitation resistance is lowered, the magnetization state becomes difficult to be held. The thermal agitation resistance is expressed by $\Delta$ value. The $\Delta$ value is a ratio of magnetic anisotropy energy to thermal energy, and is expressed by the following formula.

$$\Delta = Ku \times V/(k_B \times T)$$

In the above formula, Ku is an effective magnetic anisotropy constant of the magnetic memory layer, V is a volume of the magnetic memory layer, $k_B$ is a Boltzman constant, and T is an absolute temperature of the magnetic memory layer. Low $\Delta$ means a low thermal agitation resistance. For example, $\Delta > 60$ is desirable in order to make information holding of not less than 10 years possible. When the diameter of the MTJ element is reduced, for example, a material with large Ku is used for keeping the $\Delta$ value to be high.

On the other hand, reduction of a writing current is required for the MTJ element. A method for reducing the writing current includes, for example, applying a magnetic field oscillating by the magnetic resonance frequency of the magnetic memory layer to the magnetic memory layer. Here, an effective anisotropic magnetic field Hk of the magnetic memory layer is proportional to the effective magnetic anisotropy constant Ku. Because of this, in the case where the material with large Ku is used as the magnetic memory layer for a high $\Delta$ value, the effective anisotropic magnetic field Hk of the magnetic memory layer becomes high. When the effective anisotropic magnetic field Hk of the memory layer becomes high, the magnetic resonance frequency of the magnetic memory layer is increased. For example, in the case where the $\Delta$ value is made larger than 60, Hk is appropriately 10 kOe to 20 kOe, the resonance frequency of the magnetic memory layer may be a high frequency of appropriately 30 GHz to 60 GHz. When the magnetic resonance frequency is too high, it becomes difficult to generate a magnetic field having its frequency. For this reason, it is difficult to adopt the method for reducing the writing current described above.

In contrast, in the magnetic element 104 according to the embodiment, the perpendicular magnetization film (third ferromagnetic layer 30) is stacked with the oscillation layer (second ferromagnetic layer). Similar to the magnetic element 101 or the like, $2\gamma NzMs$ in the oscillation layer is not less than 0.9 times of the magnetic resonance frequency f3 of the third ferromagnetic layer 30. In the magnetic element 104, it is possible to obtain stably the rotating magnetic field of high oscillation frequency f as well as the magnetic element 101 or the like. Thereby, it is possible to apply stably the magnetic field of the high frequency to the magnetic memory layer. Therefore, the writing current in the magnetic memory layer can be reduced.

FIG. 11A to FIG. 11C and FIG. 12 are schematic views illustrating simulation results of the characteristics of the magnetic element according to the fourth embodiment.

These figures show the simulation results about the reduction of the writing current in the magnetic element 104.

In the simulation, parameters of each of the second ferromagnetic layer 20 and the third ferromagnetic layer 30 (first portion 31 and second portion 32) are changed. In the simulation, a current pulse is applied to the magnetic element 104, and a current (reverse current) at which the magnetization 31m of the first portion 31 and the magnetization 32m of the second portion 32 reverse is determined. In the following, the result of a current pulse width of 10 ns (nanosecond) is shown. Similar result is obtained also in a current pulse width of 1 ns.

The calculation results shown here are results in the case where the first portion 31 and the second portion 32 are ferromagnetically coupled. In the calculation, it is assumed that the direction of the magnetization of the first ferromagnetic layer 10 and the direction of the magnetization of the fourth ferromagnetic layer 40 are reverse each other.

Figure 11A:
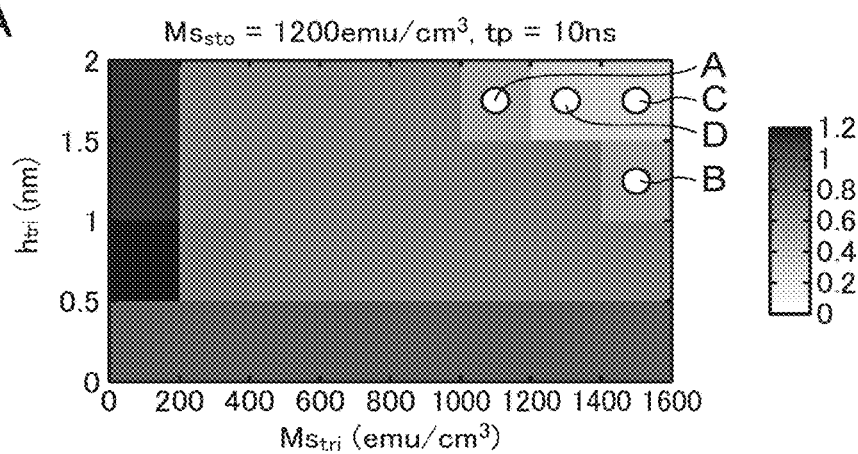
FIG. 11A to FIG. 11C are schematic views showing simulation results of characteristics of the magnetic element according to the fourth embodiment.

FIG. 11A shows a contour illustrating the magnitude of the reverse current.

In this calculation, the magnetization $Ms_{tri}$ (emu/cm$^3$) of the second portion 32 is varied in a range from 200 to 1600 emu/cm$^3$, and the thickness $h_{tri}$ of the second portion 32 is varied in a range from 0.5 to 2 nm. At this time, the magnetization $Ms_{mtj}$ (emu/cm$^3$) of the first portion 31 is assumed to be 400 emu/cm$^3$, and the thickness $h_{mtj}$ of the first portion 31 is assumed to be 2 nm. The magnetization Ms (emu/cm$^3$) of the second ferromagnetic layer 20 is assumed to be 1200 emu/cm$^3$, and the thickness $h_{sto}$ of the second ferromagnetic layer 20 is assumed to be 2 nm.

That is, the calculation about FIG. 11A corresponds to the case where when the parameter (namely $2\gamma NzMs$) of the second ferromagnetic layer 20 is constant, the magnetic resonance frequency f3 of the third ferromagnetic layer 30 is varied. The horizontal axis of FIG. 11A represents the magnetization $Ms_{tri}$ (emu/cm$^3$) of the second portion 32, and the vertical axis represents the thickness $h_{tri}$ of the second portion 32.

A color (depth) in FIG. 11A shows a rate of the reverse current in the respective conditions with reference to the reverse current Iw0 in the case where the second ferromagnetic layer 20 is not provided (that is, the case where the high frequency magnetic field is not applied to the third ferromagnetic layer 30). That is, the color in FIG. 11A shows a ratio Rw (=Iw/Iw0) of the reverse current Iw in the respective regions in the figure to the reverse current Iw0. With thinner color, the ratio Rw is low. That is, it means that the reverse current Iw is low, and the writing current is reduced.

In FIG. 11A, the reduction amount of the writing current is greater in the upper-right region. At a point A and a point B in FIG. 11A, $2\gamma NzMs$ of the second ferromagnetic layer 20 is not less than 0.8 times of the magnetic resonance frequency f3 of the third ferromagnetic layer 30. The point A corresponds to the state of FIG. 4A described previously, and the point B corresponds to the state of FIG. 4B described previously. At a point C and a point D in FIG. 11A, $2\gamma NzMs$ of the second ferromagnetic layer 20 is not less than 0.9 times of the magnetic resonance frequency f3 of the third ferromagnetic layer 30. The point C and the point D correspond to examples shown in FIG. 4C and FIG. 4D.

With reference to FIG. 4A to FIG. 4D, in the upper-right region of FIG. 11A, the oscillation frequency f of the second ferromagnetic layer 20 is high depending on the magnetic resonance frequency f3 of the third ferromagnetic layer 30. In the region like this, the writing current is reduced.

For example, at the point C and the point D, the writing current can be reduced to not more than ⅓ times with respect to the case where the second ferromagnetic layer 20 is not provided. On the other hand, at the point A and the point B, the writing current is appropriately ½ times with respect to the case where the second ferromagnetic layer 20 is not provided. It is seen from the simulation that this difference depends on whether $2\gamma NzMs$ of the second ferromagnetic layer is not less than 0.9 times of the magnetic resonance frequency f3 of the third ferromagnetic layer 30 or not. At the point C and the point D where the relationship of ($2\gamma NzMs \geq f3 \times 0.9$) comes into effect, the reduction amount of the writing current is great.

Figure 11B:
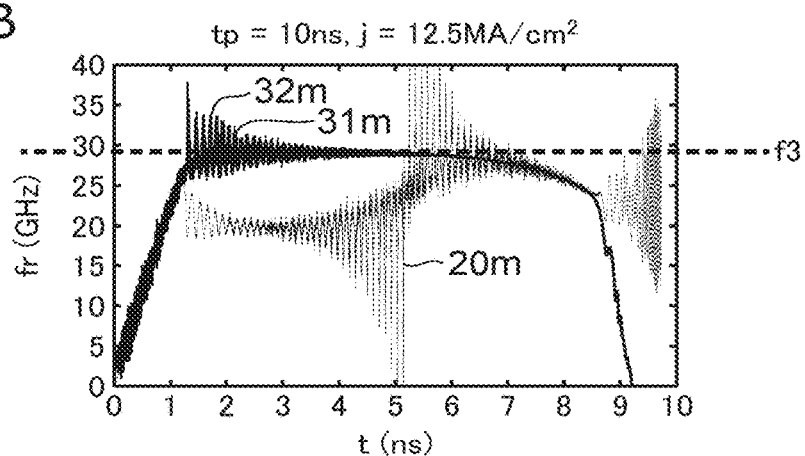
Figure 11C:
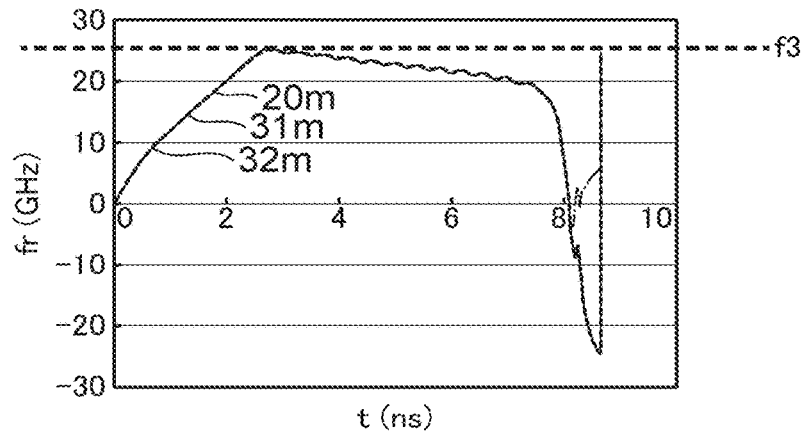

FIG. 11B and FIG. 11C are graphs illustrating the behavior of the respective magnetizations (magnetization 31m, magnetization 32m, second magnetization 20m). The horizontal axis of these figures represents time t (ns) when the pulse current is flown, and the vertical axis represents a frequency fr (GHz).

FIG. 11B shows the behavior of the respective magnetizations at the point A. FIG. 11B relates to the case where the relationship of ($2\gamma NzMs \geq f3 \times 0.9$) does not come into effect. As shown in FIG. 11B, the behavior of the magnetization 31m is synchronized with the behavior of the magnetization 32m. On the other hand, the second magnetization 20m is unable to arrive at the magnetic resonance frequency f3 of the third ferromagnetic layer 30 and is non-synchronous. Because of this, assist of the reversal of the magnetization 31m and the magnetization 32m by the high frequency magnetic field from the second ferromagnetic layer 20 is limited.

On the other hand, FIG. 11C shows the behavior of the respective magnetizations at the point D. FIG. 11C relates to the case where the relationship of ($2\gamma NzMs \geq f3 \times 0.9$) does not come into effect. In this case, the behavior of the magnetization 31m, the behavior of the magnetization 32m and the behavior of the second magnetization 20m are synchronized one another. Because of this, the reversal of the magnetization 31m and the magnetization 32m by the high frequency magnetic field from the second ferromagnetic layer 20 is assisted. Thereby, the writing current is reduced.

Figure 12:
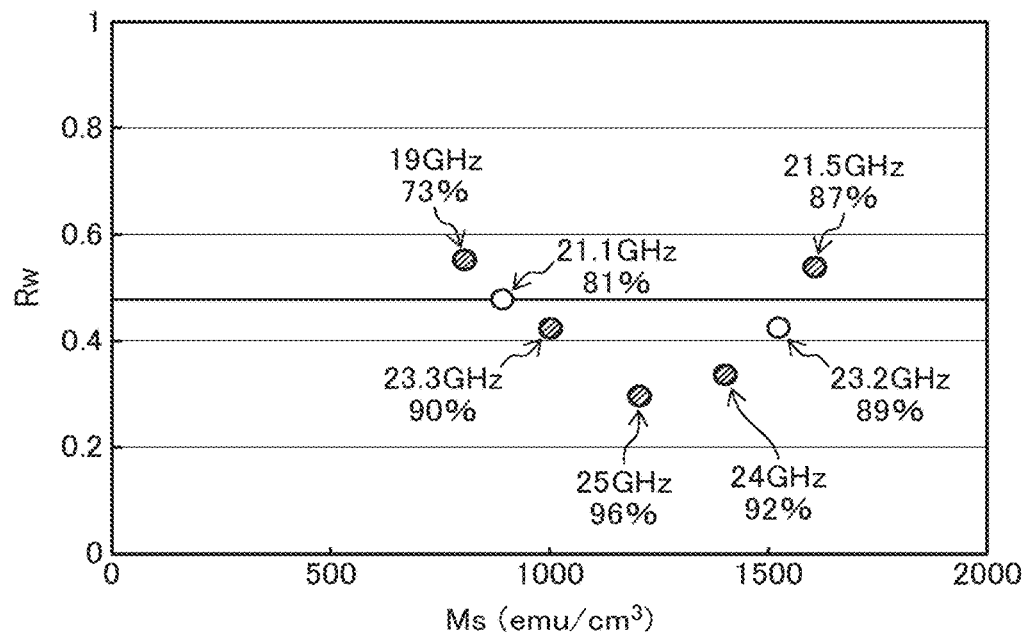
FIG. 12 is a schematic view showing simulation results of the characteristics of the magnetic element according to the fourth embodiment.

FIG. 12 is a graph showing the relationship between the magnetization Ms (emu/cm³) of the second ferromagnetic layer 20 and the reduction amount of the reversal current. In this calculation, the magnetization Ms (emu/cm³) of the second ferromagnetic layer 20 is varied. The shape (thickness) of the second ferromagnetic layer 20, the configuration of the first portion 31 and the configuration of the second portion 32 are fixed. The thickness $h_{sto}$ of the second ferromagnetic layer 20 is assumed to be 2 nm, the magnetization $Ms_{mtj}$ (emu/cm³) of the first portion 31 is assumed to be 400 emu/cm³, the thickness of the first portion 31 is assumed to be 2 nm, the magnetization $Ms_{tri}$ (emu/cm³) of the second portion 32 is assumed to be 1400 emu/cm³, and the thickness $h_{tri}$ of the second portion 32 is assumed to be 2 nm.

That is, the calculation about FIG. 12 corresponds to the case where when the magnetic resonance frequency f3 of the third ferromagnetic layer 30 is constant, $4\pi NzMs$ in the second ferromagnetic layer 20 is varied. The maximum value fmax (GHz) of the oscillation frequency f of the second ferromagnetic layer 20 and a ratio (%) of fmax to the magnetic resonance frequency f3 are represented at the respective points in the graph. As seen from FIG. 12, when the ratio of fmax to f3 is not less than 90%, the reduction of the writing current is great.

From the simulation results described above, it is seen that $2\gamma NzMs$ in the second ferromagnetic layer 20 is desirable to be not less than 0.9 times of the magnetic resonance frequency f3 of the third ferromagnetic layer 30.

As described already, from viewpoint of long term information holding, it is desirable that the thermal agitation resistance (Δvalue) of the memory layer (third ferromagnetic layer 30) is high. For this reason, for example, the material with the large effective magnetic anisotropy constant Ku is used for the first portion 31 and the thermal agitation resistance is improved. However, in the case of using the material with the large effective magnetic anisotropy constant Ku, the magnetic resonance frequency of the first portion 31 may become too high. Then, in the magnetic element 104 according to the embodiment, the second portion 32 is provided. The magnetic resonance frequency of the second portion 32 is lower than the magnetic resonance frequency of the first portion 31. Thereby, the magnetization 31m and the magnetization 32m can be reversed at the frequency lower than the magnetic resonance frequency of the first portion 31. Thereby, the magnetic resonance frequency f3 of the third ferromagnetic layer (whole) can be lowered. In this manner, if providing the first portion 31 and the second portion 32 in the third ferromagnetic layer 30, also in the case of downsizing the element, the magnetic resonance frequency f3 of the third ferromagnetic layer 30 (whole) can be suppressed from becoming too high while maintaining the thermal agitation resistance.

Figure 13:
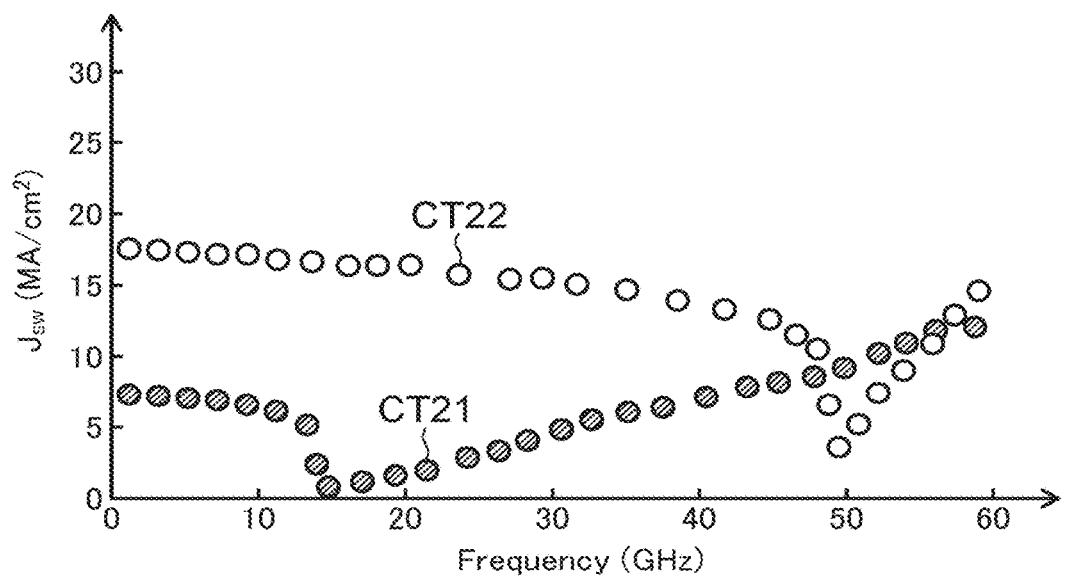
FIG. 13 is a graph showing the characteristics of the magnetic element according to the fourth embodiment.

FIG. 13 is a graph illustrating the characteristics of the magnetic element according to the fourth embodiment.

FIG. 13 is a view showing the change of the writing current to an external magnetic field in the cases where the third ferromagnetic layer 30 includes the second portion or not. The horizontal axis of FIG. 13 represents the frequency of the external magnetic field, and the vertical axis represents the current density necessary for magnetization reversal.

The magnetic resonance frequency (magnetic resonance frequency f3) of the third ferromagnetic layer 30 can be measured by, for example, causing a probe to touch upper and lower electrodes (for example, conductive layer 81 and conductive layer 82) and using a dumping measurement method. For the dumping measurement method, for example, methods described in H. Kubota et. al., Nature physics 4 (08) 37, or J. Sankey et. al., Nature physics 4 (08) 67 or the like can be used.

The characteristic CT21 in FIG. 13 shows the results of the magnetic element 104 according to the embodiment. The characteristic CT22 shows the results the example of the third ferromagnetic layer 30 provided with only first portion 31.

As shown in FIG. 13, in the case where the second portion 32 is not provided, the magnetic resonance frequency of the third ferromagnetic layer 30 is near 50 GHz. On the other hand, in the case of the magnetic element 104, the magnetic resonance frequency f3 of the third ferromagnetic layer 30 is less than 20 GHz. In this way, it can be decided whether the second portion 32 is provided in the third ferromagnetic layer 30 or not by, for example, using measuring the magnetic resonance frequency f3 of the third ferromagnetic layer 30 using the dumping measurement method. The magnetic resonance frequency f3 is, for example, between the first magnetic resonance frequency of the first portion 31 and the second magnetic resonance frequency of the second portion 32.

Figure 14:
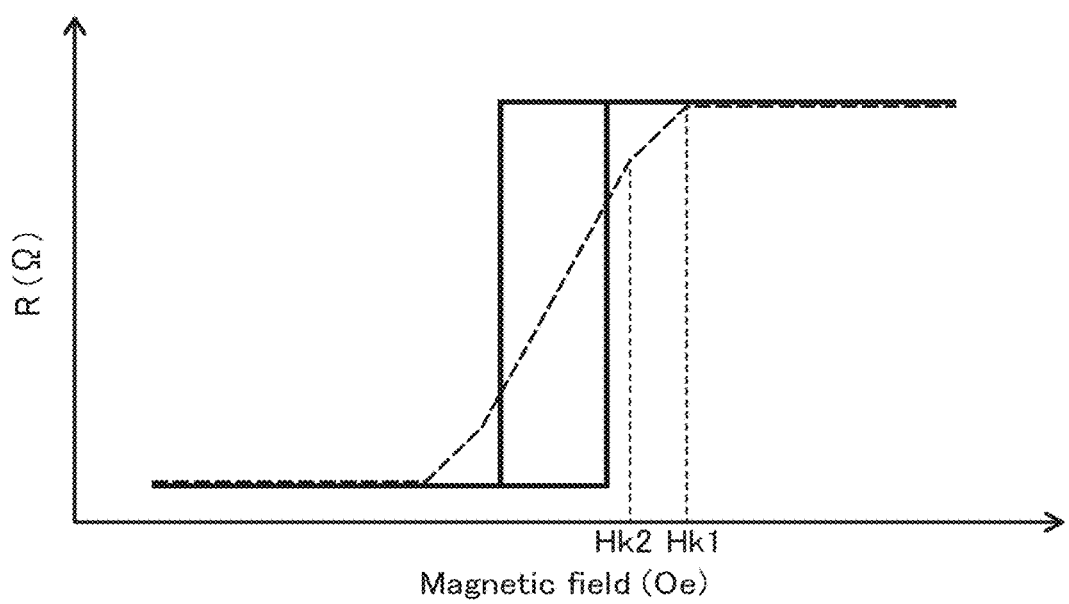
FIG. 14 is a graph showing the characteristics of the magnetic element according to the fourth embodiment.

FIG. 14 is a graph illustrating the characteristics of the magnetic element according to the fourth embodiment.

FIG. 14 shows one example of measurement results of effective anisotropic magnetic field Hk1 of the first portion 31 and effective anisotropic magnetic field Hk2 of the first portion 32. The horizontal axis of FIG. 14 represents the external magnetic field, and the vertical axis represents the resistance value R of the magnetic memory unit.

The effective anisotropic magnetic field Hk1 of the first portion 31 and the effective anisotropic magnetic field Hk2 of the first portion 32 can be determined, for example, by causing the probe to touch the upper and lower electrodes of the stacked body and measuring the resistance of the magnetic memory unit when applying the magnetic field in each of an easy axis direction and a hard axis direction. In this example, the easy axis direction is the first direction SD1 and the hard axis direction is in-plane direction (second direction SD2).

As shown in FIG. 14, the effective anisotropic magnetic field Hk1 of the first portion 31 is, for example, the value of the magnetic field at the saturation magnetic field. The effective anisotropic magnetic field Hk2 of the first portion 32 is, for example, the value of the magnetic field at a point when the gradient of the resistance value changes before the saturation magnetic field is obtained.

It is desirable that the effective anisotropic magnetic field Hk1 of the first portion 31 is away from the effective anisotropic magnetic field Hk2 of the first portion 32, however both may be coincident. It is desirable that a hysteresis loop in the easy axis direction has a squareness ratio of not less than 80%, however may be not square.

Figure 15:
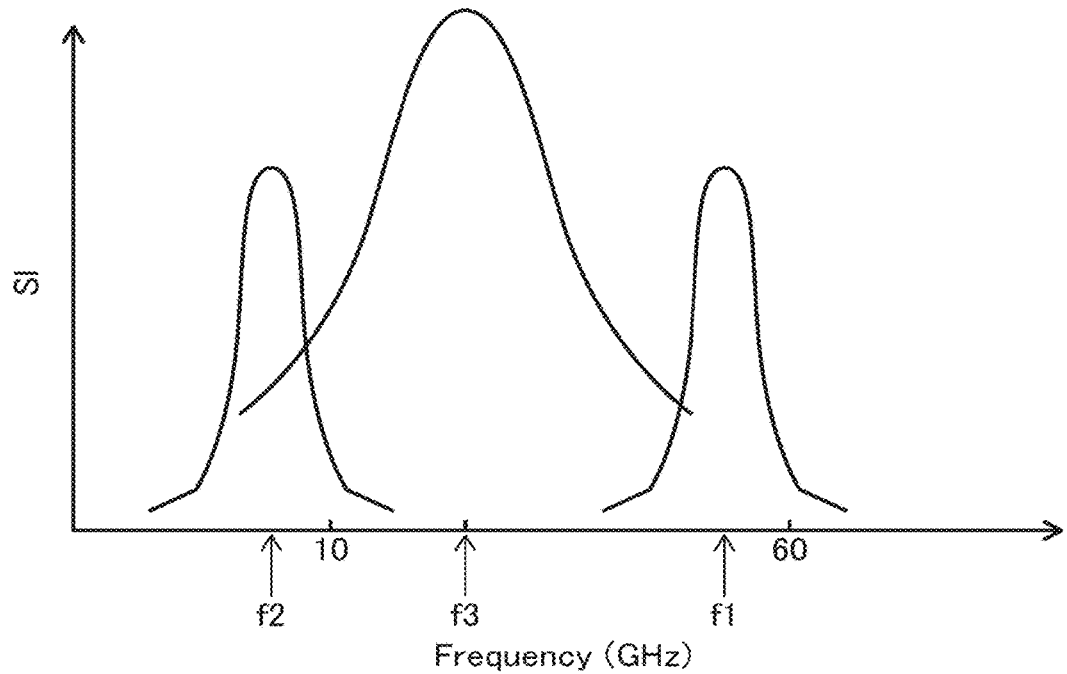
FIG. 15 is a graph showing the characteristics of the magnetic element according to the fourth embodiment.

FIG. 15 is a graph illustrating the characteristics of the magnetic element according to the fourth embodiment.

FIG. 15 shows one example of measurement results of the magnetic resonance frequency f1 of the first portion 31 and the magnetic resonance frequency f2 of the second portion 32. The horizontal axis of FIG. 15 represents a measured frequency of a measurement device, and the vertical axis represents a signal intensity SI of the measurement device.

The magnetic resonance frequency f1 of the first portion 31 and the magnetic resonance frequency f2 of the second portion 32 can be measured by, for example, a ferromagnetic resonance (FMR) measurement device or the like. In the FMR measurement, for example, the spectrum is measured by causing the probe to touch the upper and lower electrodes of the stacked body. In the case where the third ferromagnetic layer 30 is provided with the first portion 31 and the second portion 32, two or more spectra are measured, corresponding to the magnetic resonance frequency f1 of the first portion 31 and the magnetic resonance frequency f2 of the first portion 32, respectively.

In the case where the first portion 31 and the second portion 32 are coupled magnetically, the spectrum is observed also between the magnetic resonance frequency f1 of the first portion 31 and the magnetic resonance frequency f2 of the second portion 32. For example, the signal intensity of the spectrum between the magnetic resonance frequency f1 and the magnetic resonance frequency f2 is higher than the signal intensity of the spectrum at the magnetic resonance frequency f1 and higher than the signal intensity of the spectrum at the magnetic resonance frequency f2. The frequency corresponding to the spectrum like this between the magnetic resonance frequency f1 and the magnetic resonance frequency f2 can be regarded as the magnetic resonance frequency f3 of the whole of the third ferromagnetic layer 30. In the case where the third ferromagnetic layer 30 includes 2 or more multiple layers (portions), multiple spectra are observed. In this case, the frequency corresponding to the highest intensity spectrum is regarded as the magnetic resonance frequency f3 of the third ferromagnetic layer 30.

From the above, the measurements can be made assuming that one of the observed spectra is the magnetic resonance frequency f1 of the first portion 31, another one is the magnetic resonance frequency f2 of the second portion 32, and the highest intensity spectrum is the magnetic resonance frequency f3.

For example, the material used for the second stacked unit SB2 is identified by compositional analysis combining transmission electron microscopy (TEM) and electron energy-loss spectroscopy (EELS), and a single layer film or a stacked film based on the materials corresponding to the first portion 31 and the second portion 32 is formed. The magnetic resonance frequency f1, the magnetic resonance frequency f2 and the magnetic resonance frequency f3 or the like can be determined more precisely by measuring the magnetic resonance frequency of the single layer film or the stacked film by the FMR measurement or the like.

The material used for the second ferromagnetic layer 20 can be identified by the compositional analysis based on TEM or EELS or the like. Ms (emu/cc) in the second ferromagnetic layer 20 can be determined from the identified material. In the case where the second ferromagnetic layer 20 includes the multiple layers (or multiple portions with different materials), the material of each layer (each portion) is identified. Ms (emu/cc) of the second ferromagnetic layer 20 can be determined as an average of the magnetization (emu/cc) of the respective layers.

The maximum frequency which the second ferromagnetic layer 20 is capable of outputting ($\gamma/(2\pi) \times 4\pi NzMs = 2\gamma NzMs$) is also possible to be measured by the FMR. As described already, the second ferromagnetic layer 20 is an in-plane magnetization film and the third ferromagnetic layer 30 is a perpendicular magnetization film. Thus, for example, the FMR measurement is made while applying the magnetic field in the direction perpendicular to the first direction SD1. Thereby, the spectrum of the second ferromagnetic layer 20 can be isolated from the spectrum of the third ferromagnetic layer 30. When the magnetic resonance frequency of the third ferromagnetic layer 30 (first portion 31 and second portion 32) is measured, the FMR measurement is made while applying the magnetic field in a direction parallel to the first direction SD1.

Next, examples of the configuration of each layer of the magnetic element 104 will be described. The following descriptions can be applied to any magnetic element according to the embodiments. In the following descriptions, "material A/material B" means that the material B is stacked on the material A.

(First Ferromagnetic Layer 10 (Spin Injection Layer), Fourth Ferromagnetic Layer 40 (Reference Layer))

The first ferromagnetic layer 10 and the fourth ferromagnetic layer 40 can be based on, for example, a metal material including at least one element selected from the group consisting of iron (Fe), cobalt (Co), nickel (Ni), manganese (Mn) and chromium (Cr). Furthermore, the first ferromagnetic layer 10 can be based on an alloy including at least one selected from the above group and at least one metal selected from the group consisting of platinum (Pt), palladium (Pd), iridium (Ir), ruthenium (Ru) and rhodium (Rh).

The composition of magnetic materials included in each of the first ferromagnetic layer 10 and the fourth ferromagnetic layer 40 and the condition of heat treatment or the like are adjusted. Thereby, in each of the first ferromagnetic layer 10 and the fourth ferromagnetic layer 40, for example, characteristics of magnetization amount and magnetic anisotropy or the like can be adjusted.

The first ferromagnetic layer 10 and the fourth ferromagnetic layer 40 can be based on, for example, an amorphous alloy of rare earth-transition metal such as TbFeCo and GdFeCo. The first ferromagnetic layer 10 and the fourth ferromagnetic layer 40 can be based on, for example, a stacked structure of Co/Pt, Co/Pd and Co/Ni or the like. Co/Ru, Fe/Au, and Ni/Cu or the like form a perpendicular magnetization film by combining with a foundation layer. Co/Ru, Fe/Au, or Ni/Cu or the like can be used by controlling a crystal orientation direction of the films. The first ferromagnetic layer 10 and the fourth ferromagnetic layer 40 may include an additive such as gallium (Ga), aluminum (Al), germanium (Ge), nitrogen (N), phosphorus (P), arsenic (As), boron (B), and silicon (Si). For example, the first ferromagnetic layer 10 and the fourth ferromagnetic layer 40 may be based on $Mn_xGa_y$ and $Mn_xGe_y$ or the like. The composition ratio x and composition ratio y may be changed.

(Third Ferromagnetic Layer 30 (Memory Layer))

The third ferromagnetic layer 30 (first portion 31 and second portion 32) can be based on, for example, a metal material including at least one element selected from the group consisting of iron (Fe), cobalt (Co), nickel (Ni), manganese (Mn) and chromium (Cr). Furthermore, an alloy including at least one selected from the above group and at least one metal selected from the group consisting of platinum (Pt), palladium (Pd), iridium (Ir), ruthenium (Ru) and rhodium (Rh) can be used. For example, the third ferromagnetic layer 30 includes a first alloy including at least one of Co, Mn, Fe, Ni, Cu, Rh, Ru or Pd.

The composition of magnetic materials included in the third ferromagnetic layer 30 and the condition of heat treatment or the like are adjusted. For example, characteristics of magnetization amount and magnetic anisotropy or the like can be adjusted. For example, the first portion 31 and the second portion 32 can be formed in the third ferromagnetic layer 30.

The third ferromagnetic layer 30 can be based on, for example, an amorphous alloy of rare earth-transition metal such as TbFeCo and GdFeCo or the like. The third ferromagnetic layer 30 can be based on, for example, a stacked structure of Co/Pt, Co/Pd and Co/Ni or the like. Co/Ru, Fe/Au, and Ni/Cu or the like form a perpendicular magnetization film by combining with a foundation layer. Co/Ru, Fe/Au, or Ni/Cu or the like can be used by controlling a crystal orientation direction of the films. An additive such as gallium (Ga), aluminum (Al), germanium (Ge), nitrogen (N), phosphorus (P), arsenic (As), boron (B), and silicon (Si) may be included. For example, the third ferromagnetic layer 30 (at least one of first portion 31 or second portion 32) can be based on CoFe, CoFeB, CoFeMnSi, MnGa or MnGe or the like. The composition ratio of the respective materials may be changed.

At least one of the first portion 31 or the second portion 32 may be based on, for example, a Heusler alloy. The Heusler alloy is, for example, an alloy having $L2_1$ structure and the composition such as $X_2YZ$. For example, at least one of the first portion 31 or the second portion 32 includes the Heusler alloy including at least one of Co, Mn, Fe, Ni, Cu, Rh, Ru or Pd.

For example, the first portion 31 and the second portion 32 include a first Heusler alloy. The first Heusler alloy includes at least one of $Co_2FeSi$, $Co_2FeAl$, $Co_2FeGa$, $Co_2MnGe$, $Co_2MnSn$, $Co_2MnSi$, $Co_2MnGa$, $Co_2MnAl$, $Co_2MnSb$, $Co_2CrGa$, $Ni_2MnIn$, $Ni_2MnGa$, $Ni_2MnSn$, $Ni_2MnSb$, $Ni_2FeGa$, $Pd_2MnSb$, $Pd_2MnSn$, $Cu_2MnAl$, $Cu_2MnSn$, $Cu_2MnIn$, $Rh_2MnGe$, $Rh_2MnPb$, $Rh_2MnSn$, $Pd_2MnGe$, $Rh_2FeSn$, $Ru_2FeSn$, or $Rh_2FeSb$.

For example, saturation magnetization of the second portion 32 can be great by using the first Heusler alloy for the second portion 32. Thereby, for example, the magnetic resonance frequency in the second portion 32 can be reduced and the magnetic resonance effect can be easy to occur.

For example, the first portion 31 and the second portion 32 may include a second Heusler alloy. The second Heusler alloy includes at least one of $Co_2HfSn$, $Co_2ZrSn$, $Co_2HfAl$, $Co_2ZrAl$, $Co_2HfGa$, $Co_2TiSi$, $Co_2TiGe$, $Co_2TiSn$, $Co_2TiGa$, $Co_2TiAl$, $Co_2VGa$, $Co_2VAl$, $Co_2TaAl$, $Co_2NbGa$, $Co_2NbAl$, $Co_2VSn$, $Co_2NbSn$, $Co_2CrAl$, $Rh_2NiSn$, $Rh_2NiGe$, $Mn_2WSn$, $Fe_2MnSi$ or $Fe_2MnAl$.

The second Heusler alloy described above has relatively small saturation magnetization. For example, the saturation magnetization of the second Heusler alloy can be less than 400 emu/cc. Thereby, a leakage magnetic field of the adjacent magnetic element can be reduced.

In the embodiment, the Heusler alloy described above may be used for one of the first portion 31 and the second portion 32, and the Heusler alloy described above may be used for both of the first portion 31 and the second portion 32. It is desirable to use the second Heusler alloy for the first portion 31. Thereby, for example, the leakage magnetic field to surrounding elements can be suppressed. It is desirable to use the second Heusler alloy for the second portion 32. Thereby, for example, the magnetic resonance frequency can be reduced.

(Second Ferromagnetic Layer 20 (Oscillation Layer))

The second ferromagnetic layer 20 can be based on, for example, a metal material including at least one element selected from the group consisting of iron (Fe), cobalt (Co), nickel (Ni), manganese (Mn) and chromium (Cr). Furthermore, an alloy including at least one selected from the above group and at least one metal selected from the group consisting of platinum (Pt), palladium (Pd), iridium (Ir), ruthenium (Ru) and rhodium (Rh). An additive such as gallium (Ga), aluminum (Al), germanium (Ge), nitrogen (N), phosphorous (P), arsenic (As), boron (B) and silicon (Si) may be included. For example, the second ferromagnetic layer 20 may be based on CoFe, CoFeB, FeB, CoFeSiB, NiFe, MnGa, MnGe, CoFeAl, CoFeSi, CoFeGe, CoFeSn, CoMnAl, CoMnSi, CoMnGe, CoMnSn, CoFeGaGe or CoFeMnSi or the like. The composition ratio of the respective materials may be changed.

In the case where an alloy of CoFeSiB, CoFe, CoFeB or CoFe and other metal is used for the second ferromagnetic layer 20, the magnetization Ms of the second ferromagnetic layer 20 is great. This allows a magnetostatic coupling force to strengthen. The Ms is preferable to be not less than 1000 emu/cc and not more than 1600 emu/cc, and more preferable to be not less than 1000 emu/cc and not more than 1400 emu/cc as shown in FIG. 12.

For example, the second ferromagnetic layer 20 includes the Heusler alloy. For example, the Heusler alloy including at least one of Co, Mn, Fe, Ni, Cu, Rh, Ru or Pd is used. The Heusler alloy has, for example, a high spin injection efficiency g (θ). Thereby, for example, the gradient f/J in the formula (1) can be large. That is, the oscillation frequency can be high to the current.

For example, the Heusler alloy of the second ferromagnetic layer 20 is based on at least one of $Co_2MnGa$, $Co_2MnAl$, $Ni_2MnIn$, $Ni_2MnGa$, $Ni_2MnSn$, $Pd_2MnSb$, $Pd_2MnSn$, $Cu_2MnAl$, $Cu_2MnSn$, $Cu_2MnIn$, $Rh_2MnGe$ or $Rh_2MnPb$. These Heusler alloy has a relatively small magnetization Ms. For example, the magnetization Ms is not more than 800 emu/cc. For example, the gradient f/J in the formula (1) can be further large by using these Heusler alloy.

For example, the Heusler alloy of the second ferromagnetic layer 20 may be based on at least one of $Co_2FeSi$, $Co_2FeAl$, $Co_2FeGa$, $Co_2MnGe$, $Co_2MnSn$ or $Co_2MnSi$. These Heusler alloy has a relatively great magnetization Ms. For example, the magnetization Ms is not less than 800 emu/cc and not more than 1000 emu/cc. Thereby, for example, the magnetic field generated by oscillation of the magnetization of the second ferromagnetic layer 20 can be large. The magnetization of the third ferromagnetic layer 30 is easy to be reversed by the magnetization of the second ferromagnetic layer 20. That is, the reverse current can be reduced.

In the embodiment, it is desirable to use the Heusler alloy like this. Thereby, the oscillation frequency to the current can be high in the oscillation layer. The reverse current can be reduced by magnetostatic coupling of the oscillation layer like this with the memory layer.

For example, in the case where the Heusler alloy is used for the second ferromagnetic layer 20, the leakage magnetic field may be generated circumferentially by the magnetization of the second ferromagnetic layer 20. In some cases, this leakage magnetic field, for example, may affect adjacent memory cells (see FIG. 26). In the embodiment, it is desirable that to use a magnetic shield 51 described later (see FIG. 16). Thereby, the leakage magnetic field can be suppressed.

(First Non-Magnetic Layer 10n, Third Non-Magnetic Layer 30n)

The first non-magnetic layer 10n and the third non-magnetic layer 30n can be based on, for example, an insulating material serving as a non-magnetic tunnel barrier layer. Specifically, for example, an oxide, a nitride or a fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg) and iron (Fe) can be used. The non-magnetic tunnel barrier layer is, for example, a non-magnetic layer including an insulator, and a current (tunnel current) due to a tunnel effect flows through the non-magnetic tunnel barrier layer when applying a voltage. A thickness of the non-magnetic tunnel barrier layer is, for example, not more than 2 nm. Thereby, when the voltage is applied, the tunnel current flows through the non-magnetic tunnel barrier layer.

Each of the first non-magnetic layer 10n and the third non-magnetic layer 30n can be based on, for example, $Al_2O_3$, $SiO_2$, MgO, AlN, MgAlO, MgZnO, MgGaO, Ta—O, Al—Zr—O, $Bi_2O_3$, $MgF_2$, $CaF_2$, $SrTiO_3$, $AlLaO_3$, Al—N—O, or Si—N—O or the like. The third non-magnetic layer 30n can be based on a non-magnetic semiconductor (ZnOx, InMn, GaN, GaAs, TiOx, Zn, Te, or those doped with a transition metal) or the like.

It is desirable that each of the thickness of the first non-magnetic layer 10n and the thickness of the third non-magnetic layer 30n has a value in a range of appropriately not less than about 0.2 nanometers (nm) and not more than 2.0 nm. Thereby, for example, it is suppressed the resistance from being extremely high while securing uniformity of insulating films.

The first non-magnetic layer 10n and the third non-magnetic layer 30n may be based on a non-magnetic metal layer. In the case where the third non-magnetic layer 30n is based on the non-magnetic metal layer, the magnetic element has the GMR configuration.

The non-magnetic metal layer can be based on, for example, one non-magnetic metal selected from the group consisting of copper (Cu), silver (Ag), gold (Au), chromium (Cr), zinc (Zn), gallium (Ga), niobium (Nb), molybdenum (Mo), ruthenium (Ru) palladium (Pd), hafnium (Hf), tantalum (Ta), tungsten (W), platinum (Pt) and bismuth (Bi), or an alloy including at least two or more elements selected from the group described above. In the case where the first non-magnetic layer 10n is based on the non-magnetic metal layer, it is desirable that the thickness is not less than 1.5 nm and not more than 20 nm. Thereby, it can be suppressed that interlayer coupling is not made between the magnetic layers and the spin polarized state of a conduction electron is lost during passing through the non-magnetic metal layer.

(Second Non-Magnetic Layer 20n)

The following three cases (i) to (iii) are conceived as materials used for the second non-magnetic layer 20n.

(Second Non-Magnetic Layer 20n (i))

The case of (i) is the case where the non-magnetic metal layer is used for the second non-magnetic layer 20n.

The non-magnetic metal layer used for the second non-magnetic layer 20n can include, for example, at least one non-magnetic metal selected from the group consisting of copper (Cu), silver (Ag), gold (Au), chromium (Cr), zinc (Zn), gallium (Ga), niobium (Nb), molybdenum (Mo), ruthenium (Ru) palladium (Pd), hafnium (Hf), tantalum (Ta), titanium (Ti), tungsten (W), platinum (Pt), bismuth (Bi), iridium (Ir) and osmium (Os), or an alloy including two or more non-magnetic metals selected from the above group.

Furthermore, the non-magnetic metal layer used for the second non-magnetic layer 20n may be, for example, at least one of a conductive nitride, a conductive oxide or a conductive fluoride, including at least one element selected from the above group. For example, the second non-magnetic layer 20n can be based on, for example, TiN and TaN or the like. Furthermore, the second non-magnetic layer 20n may be based on a stacked film stacking films of these materials. The second non-magnetic layer 20n can be based on, for example, a stacked film of Ti film/Ru film/Ti film or the like.

(Second Non-Magnetic Layer 20n (ii))

The second non-magnetic layer 20n can be based on a material having a short spin diffusion length such as ruthenium (Ru). The spin polarization of the flowing electron can be easy to be lost by using the material having the short spin diffusion length such as ruthenium (Ru) for the second non-magnetic layer 20n. The case where the spin torque is attenuated by the second non-magnetic layer 20n in this manner is particularly referred to the case of (ii).

In the case of (ii), for example, a film having a short spin diffusion length such as ruthenium (Ru) (material having a function of spin loss), or a layer having a structure of a short spin diffusion length is used as the second non-magnetic layer 20n. Thereby, as described already, the second ferromagnetic layer 20 becomes hard to be influenced by the spin transfer torque from the third ferromagnetic layer 30. Thus, the oscillation state of the second ferromagnetic layer 20 is stabilized.

The materials available for the spin loss effect like this for the second non-magnetic layer 20n can include a metal selected from the group consisting of ruthenium (Ru), tantalum (Ta), tungsten (W), platinum (Pt), palladium (Pd), molybdenum (Mo), niobium (Nb), zirconium (Zr), titanium (Ti) and vanadium (V), or an alloy including two or more selected from the this group.

In the case of (ii), it is desirable to set the thickness of the second non-magnetic layer 20n is not less than 1.4 nm and not more than 20 nm.

If the thickness of the second non-magnetic layer 20n is not less than 1.4 nm, the spin polarization degree can be lost when the conduction electron passes through the inside and the interface of the second non-magnetic layer 20n. Furthermore, the change of precession of the second ferromagnetic layer 20 due to the direction of the magnetization of the third ferromagnetic layer 30 can be prevented by the second non-magnetic layer 20n.

On the other hand, if the thickness of the second non-magnetic layer 20n exceeds 20 nm, pillar formation of multilayer film becomes difficult. Furthermore, the strength of the rotating magnetic field generated from the second ferromagnetic layer 20 attenuates at a position of the third ferromagnetic layer 30. Therefore, it is desirable that the thickness of the second non-magnetic layer 20n is set not more than 20 nm.

(Second Non-Magnetic Layer 20n (iii))

In the case of (iii), the second non-magnetic layer 20n is a film having a strong spin orbit interaction capable of being used for switching the magnetic moment of the third ferromagnetic layer 30 (memory layer).

The second non-magnetic layer 20n is possible to be used for producing a spin orbit field $H_{SO}$. The spin orbit field is also possible to be spin orbit torque $T_{SO}$ operating on the magnetization of the third ferromagnetic layer 30. In the case of (iii), the material having the strong spin orbit interaction is used for the second non-magnetic layer 20n. In the material like this, the spin orbit interaction includes both of a spin Hall effect and a Rashba effect, however one of two is predominant. As a result, the spin Hall effect and the Rashba effect are described in the following. The spin Hall effect is generally recognized as a bulk effect. A substance showing the spin Hall effect often includes a heavy metal or a substance doped with the heavy metal. For example, the substance like this is possible to be selected from "M" doped with "A" and "B".

"A" includes Y, Zr, Nb, Mo, Tc, Ru, Rh, Pd, Cd, In, Sb, Te, Hf, Ta (including highly resistive amorphous β-Ta), W, Re, Os, Ir, Pt, Au, Hg, Tl, Pb, Bi, Po, At, and/or combinations thereof.

"M" includes at least one of Al, Ti, V, Cr, Mn, Cu, Zn, Ag, Hf, Ta, W, Re, Pt, Au, Hg, Pb, Si, Ga, GaMn, or GaAs.

"B" includes at least one of V, Cr, Mn, Fe, Co, Ni, P, S, Zn, Ga, Ge, As, Se, Y, Zr, Nb, Mo, Tc, Ru, Rh, Pd, Ag, Cd, InSb, Te, I, Lu, Hf, Ta, W, Re, Os, Ir, Pt, Au, Hg, Tl, Pb, Bi, Po, At, La, Ce, Pr, Nd, Pm, Sm, Eu, Gd, Tb, Dy, Ho, Er, Tm, or Yb.

For example, Fe, Pb, Au, Pt, Ag, Cu, Cr, Zn, As, Mn, Co, Ni, Mo, W, Sn, Bi, Hf, Ta, W, Re, Os, Ir, Tl, Pb, Hg, Pd, Cd and Ru or the like may be used as it is. Alloys thereof and a stacked body thereof may be used. A heavy metal may be doped with another heavy metal. For example, the material of the second non-magnetic layer 20n may be formed of Cu doped with Ir or/and Cu doped with Bi, or can include these. Cu—Ir (doping Jr) and Cu—Pt or the like may be used. Bi/AgBi/Ag or the like may be used.

Another material having strong spin orbit interaction can be used for the second non-magnetic layer 20n. In this material, the origin of the spin orbit field $H_{SO}$ relates to the spin orbit interaction at the interface. The strong spin orbit effect at the interface relates to the gradient of the crystal field to an interface direction and a perpendicular direction, and is often referred to as the Rashba effect. Here, the Rashba effect is not limited to this, and means the spin orbit interaction at the interface. In order to obtain the considerably large Rashba effect at least in the prescribed embodiment, the interface for the second non-magnetic layer 20n must be different. For example, in the case where the second non-magnetic layer 20n is based on a Pt film, the third ferromagnetic layer 30 is based on a Co film and the first non-magnetic layer 10n is based on MgO, the Rashba effect is possible to occur.

The second non-magnetic layer 20n may be an alloy. For example, the second non-magnetic layer 20n can include at least one of Cu, Zn, Ga, Ge, As, Se, Y, Zr, Nb, Mo, Tc, Ru, Rh, Pd, Ag, Cd, In, Sn, Sb, Te, I, Lu, Hf, Ta, W, Re, Os, Jr, Pt, Au, Hg, Tl, Pb, Bi, Po, At, La, Ce, Pr, Nd, Pm, Sm, Eu, Gd, Tb, Dy, Ho, Er, Tm, Yb, and/or combinations thereof.

In other embodiments, the second non-magnetic layer 20n includes a surface alloy of "A"/"B" (for example, an atom of "A" disposed on a (111) surface of "B" which id a main substance). An atomic layer in an upper part is a mix of "A" and "B". "A" includes at least one of Cu, Zn, Ga, Ge, As, Se, Y, Zr, Nb, Mo, Tc, Ru, Rh, Pd, Ag, Cd, In, Sn, Sb, Te, I, Lu, Hf, Ta, W, Re, Os, Ir, Pt, Au, Hg, Tl, Pb, Bi, Po, At, La, Ce, Pt, Nd, Pm, Sm, Eu, Gd, Tb, Dy, Ho, Er, Tim, or Yb. "B" includes at least one of Si, Zn, Cu, Ag, Au, W, Zn, Cr, Pt, or Pd. In many embodiments, "A" includes two or three other substances.

In the case of (iii), the thickness of the second non-magnetic layer 20n is not less than 0.5 nm and not more than 100 nm, and typically not less than 0.5 nm and not more than 10 nm. The thickness of the second non-magnetic layer 20n is desirably not more than 5 nm.

When reversing the magnetization direction of the third ferromagnetic layer 30, it is desirable to apply the magnetic field in the in-plane direction in order to control the magnetization direction. There are a case where a longitudinal direction of the second non-magnetic layer 20n is referred to as the in-plane direction and a case where a direction orthogonal to the longitudinal direction of the second non-magnetic layer 20 is referred to as the in-plane direction. The magnetic field may be applied uniformly in the above direction. For example, a magnet is provided in a package housing the element according to the embodiment. Thereby, the uniform magnetic field may be applied. In another method, another in-plane magnetization film is provided in the configuration of the stacked film, and its leakage magnetic field may be used. A sufficient magnitude of the magnetic field is less than 1 kOe, for example, may be a several tens to a several hundred Oe. Thus, it is easy for design to provide the in-plane magnetization film to apply the magnetic field.

When reversing the magnetization direction of the third ferromagnetic layer 30, in another method so as to enable its direction to control, an alloy such as IrMn, MnPt, MnAu of Mn and a heavy metal may be stacked on the above material described as the configuration of the second non-magnetic layer 20n. For example, the second non-magnetic layer 20n is based on Ta/IrMn, Ta/Pt, Ta/Pt/PtMn or the like. The second non-magnetic layer 20n may be based on Tl/BiSe.

The shape of the stacked body (first stacked unit SB1 and second stacked unit SB2) projected onto the X-Y plane is arbitrary. The shape of the stacked body projected onto the X-Y plane is, for example, circular, elliptic, flat circular, and polygonal or the like. In the case of the polygon, it is desirable to have 3 or more corners such as quadrangle or hexagonal. The polygon may have a round corner shape.

The shape of the stacked body (first stacked unit SB1 and second stacked unit SB2) projected onto the plane parallel to the Z-axis direction (for example, Z-X plane or Z-Y plane) is arbitrary. The shape (shape cut by as a plane perpendicular to the film surface) of the stacked body projected onto the plane parallel to the Z-axis direction can have, for example, a tapered shape or a reversed tapered shape.

Next, an example of a method for manufacturing a magnetic element 103a (not shown) according to the third embodiment will be described. The magnetic element 103a further includes the second non-magnetic layer 20n provided between the second ferromagnetic layer 20 and the third ferromagnetic layer 30 compared with the magnetic element 103 described in relation to FIG. 6. The following manufacturing method can be also applied to other magnetic elements described later in addition to the magnetic element 103a by appropriately changing the fabrication order of layers.

After forming a lower electrode (not shown) on the wafer, the wafer is disposed in an ultrahigh vacuum sputtering apparatus. A Ta/Ru layer (contact layer to lower electrode and stopper layer), a FePt layer (first ferromagnetic layer 10), a Cu layer (first non-magnetic layer 10n), a CoFeB layer (second ferromagnetic layer 20 (oscillation layer)), a Ru layer (second non-magnetic layer 20n), a MnGa layer (first portion 31 of third ferromagnetic layer 30 (memory layer)), a CoFeMnSi layer (second portion 32 of third ferromagnetic layer 30) are stacked in this order. Here, a magnitude of the magnetic anisotropy in a direction perpendicular to a film surface can be also adjusted by annealing in the magnetic field. Subsequently, a Ru/Ta layer (upper contact layer) is stacked. Thus, a processed body is formed.

Next, an EB (electron beam) resist is coated and EB exposure is performed, and then a resist mask with a diameter of 30 nm is formed. A portion of the processed body not covered with the resist is removed by ion milling so as to expose the Ta layer of the contact layer to the lower electrode and the stopper layer.

After that, a SiN film serving as a protection insulating layer is formed to cover the first stacked unit SB1 and the second stacked unit SB2.

Next, after forming a SiO₂ film serving as a buried insulating layer and flattening by CMP (Chemical Mechanical Polishing) or the like, the whole surface is etched by RIE (Reactive Ion Etching) or the like to expose the upper contact layer to the electrode.

Furthermore, the resist is coated on the whole surface, and the resist is patterned by using a stepper exposure apparatus so that an opening of the resist corresponds to a position of the upper electrode. A Cu film is formed to bury the opening corresponding to the upper electrode and the resist is removed. Thereby, the upper electrode is formed. An interconnection (not shown) electrically connected to the upper electrode is provided.

From the above, the magnetic element 103a is completed.

Next, an example of a method for manufacturing the magnetic element 104 according to the fourth embodiment will be described. The following manufacturing method can be also applied to other magnetic elements described later in addition to the magnetic element 104 by appropriately changing the fabrication order of layers.

After forming a lower electrode (not shown) on the wafer, the wafer is disposed in an ultrahigh vacuum sputtering apparatus. A Ta/Ru layer (contact layer to lower electrode and stopper layer), a FePt layer (first ferromagnetic layer 10), a Cu layer (first non-magnetic layer 10n), a CoFeB layer (second ferromagnetic layer 20 (oscillation layer)), a Ru layer (second non-magnetic layer 20n), a MnGa layer (first portion 31 of third ferromagnetic layer 30 (memory layer)), a CoFeMnSi layer (second portion 32 of third ferromagnetic layer 30), an MgO layer (third ferromagnetic layer 30), a FePt layer (fourth ferromagnetic layer 40) are stacked in this order. Here, a magnitude of the magnetic anisotropy in a direction perpendicular to a film surface can be also adjusted by annealing in the magnetic field. Subsequently, a Ru/Ta layer (upper contact layer) is stacked. Thus, a processed body is formed.

Next, an EB (electron beam) resist is coated and EB exposure is performed, and then a resist mask with a diameter of 30 nm is formed. A portion of the processed body not covered with the resist is removed by ion milling so as to expose the Ta layer of the contact layer to the lower electrode and the stopper layer.

After that, a SiN film serving as a protection insulating layer is formed to cover the first stacked unit SB1 and the second stacked unit SB2.

Next, after forming a SiO₂ film serving as a buried insulating layer and flattening by CMP (Chemical Mechanical Polishing) or the like, the whole surface is etched by RIE (Reactive Ion Etching) or the like to expose the upper contact layer to the electrode.

Furthermore, the resist is coated on the whole surface, and the resist is patterned by using a stepper exposure apparatus so that an opening of the resist corresponds to a position of the upper electrode. A Cu film is formed to bury the opening corresponding to the upper electrode and the resist is removed. Thereby, the upper electrode is formed. An interconnection (not shown) electrically connected to the upper electrode is provided.

From the above, the magnetic element 104 is completed.

Figure 16:
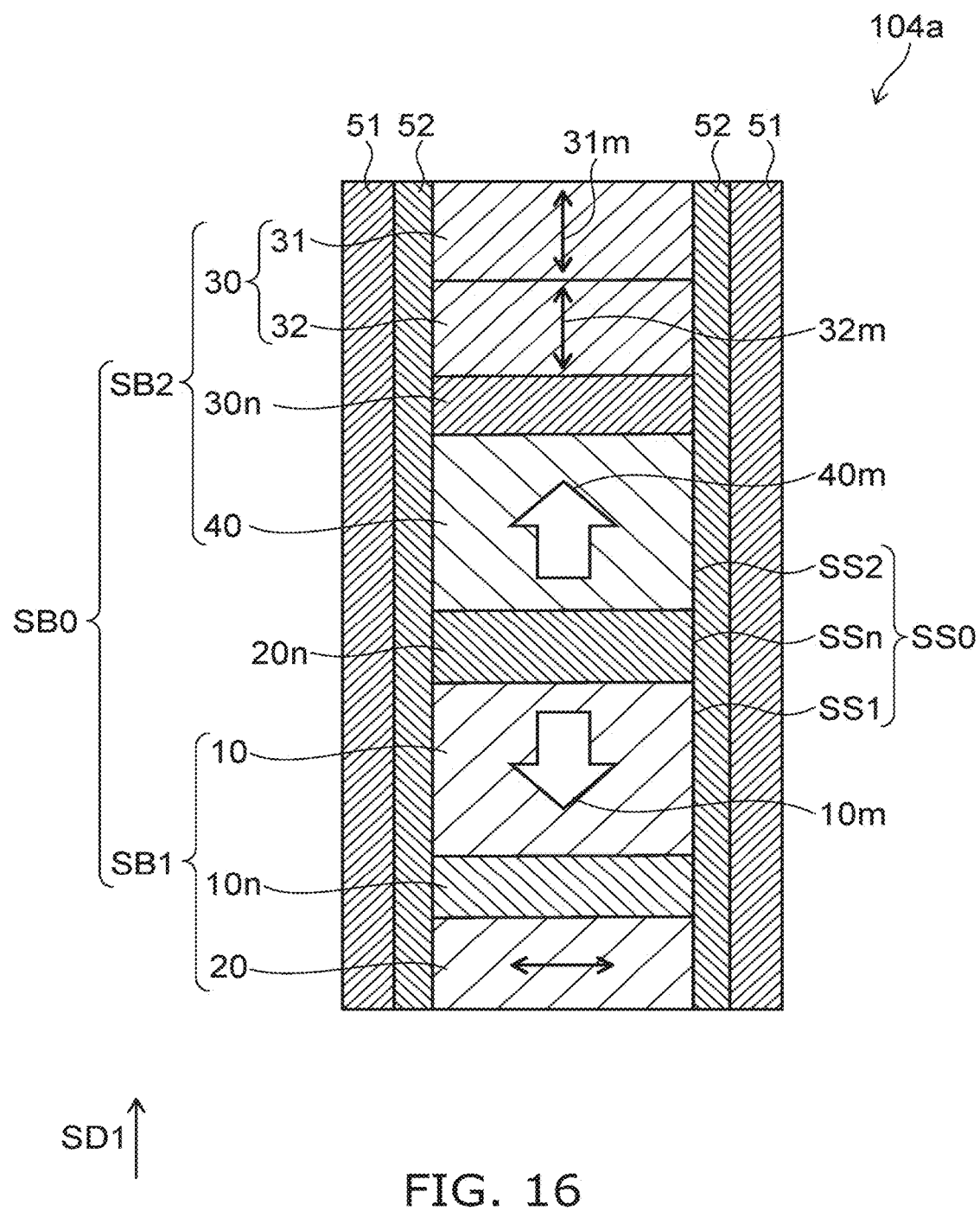
FIG. 16 is a schematic cross-sectional view showing another magnetic element according to the fourth embodiment.

FIG. 16 is a schematic cross-sectional view showing another magnetic element according to the fourth embodiment.

As shown in FIG. 16, a magnetic element 104a further includes a magnetic shield 51 (conductive layer). The magnetic element 104a includes a stacked body SB0 including the first stacked unit SB1, the second stacked unit SB2 and the second non-magnetic layer 20n. The stacked body SB0 has a side surface SS0 extending in the first direction SD1. The first stacked unit SB1 has a side surface SS1 (first side surface) extending in the first direction SD1. The second stacked unit SB2 has a side surface SS2 (second side surface) extending in the first direction SD1. The second non-magnetic layer 20n has a side surface SSn extending in the first direction SD1. Here, "extending in the first direction SD1" is assumed to include a state nonparallel to the first direction SD1. "Extending in the first direction SD1" is sufficient to have at least a component extending in the first direction SD1. That is, "a surface extending in the first direction SD1" must be a surface orthogonal to the first direction SD1.

The magnetic shied 51 covers at least a portion of the side surface SS0 of the stacked body SS0. That is, the magnetic shield 51 is provided along at least the portion of the side surface SS0, and opposes at least the portion of the side surface SS0. The side surface SS0 of the stacked body SS0 includes, for example, the side surface SS1 (first side surface) of the first stacked unit SB1, the side surface SS2

(second side surface) of the second stacked unit SB2, and the side surface SSn of the third non-magnetic layer 30n. In this example, the magnetic shield 51 covers the side surface SS1, the side surface SS2, and the side surface SSn. A shape of the magnetic shield 51 projected onto the X-Y plane is, for example, ringed and surrounds the stacked body SS0.

The magnetic element 104a further includes a protection layer 52 provided between the side surface SS0 of the stacked body SS0 and the magnetic shield 51. A thickness of the protection layer 52 is desirable to be not less than 2 nm and not more than 30 nm.

For example, the side surface SS1 of the first stacked unit SB1 and the side surface SS2 of the second stacked unit SB2 are covered by the magnetic shied 51 such as a permalloy (Py) via the protection layer 52 such as SiN or $Al_2O_3$ or the like. Thereby, for example, in the case where a plurality of magnetic elements 104a are arranged, the leakage magnetic field from the adjacent magnetic element 104a is suppressed from influencing badly on the operations of the first stacked unit SB1 and the second stacked unit SB2.

For example, since effective magnetic field operating on the second stacked unit SB2 is substantially the same in each memory cell (stacked body SB0), fluctuation of the reverse current between the bits is suppressed. Fluctuation of the oscillation current is similarly suppressed also in the first stacked unit SB1. The leakage magnetic field from the first stacked unit SB1 and the second stacked unit SB2 can be suppressed from operating on the adjacent magnetic element. As a result, a plurality of magnetic elements can be disposed proximally and the integration degree can be increased. For example, a memory density of the nonvolatile memory device can be increased.

The magnetic shield 51 is based on, for example, one metal selected from the group consisting of iron (Fe), cobalt (Co), nickel (Ni), manganese (Mn) and chromium (Cr), or an alloy including at least two or more metals selected from the group. The magnetic shield 51 may be based on, for example, an alloy including at least one metal selected from the group consisting of iron (Fe), cobalt (Co), nickel (Ni), manganese (Mn) and chromium (Cr), and at least one metal selected from the group consisting of platinum (Pt), palladium (Pd), iridium (Ir), ruthenium (Ru) and rhodium (Rh).

The characteristics of the magnetic shield 51 can be adjusted by adjusting a composition of the magnetic material included in the magnetic shield 51 and a condition of heat treatment. For example, the magnetic shield 51 may be an amorphous alloy of rare earth-transition metal such as TbFeCo and GdFeCo or the like. The magnetic shield 51 may be based on a stacked structure of Co/Pt, Co/Pd and Co/Ni or the like.

The protection layer 52 can be based on, for example, an oxide, a nitride, or fluoride including at least one element selected from the group consisting of aluminum (Al), titanium (Ti), zinc (Zn), zirconium (Zr), tantalum (Ta), cobalt (Co), nickel (Ni), silicon (Si), magnesium (Mg) and iron (Fe). The protection layer 52 is based on, for example, SiN.

In the following, an example of a method for manufacturing the magnetic element 104a will be described.

After forming a lower electrode (not shown) on the wafer, the wafer is disposed in an ultrahigh vacuum sputtering apparatus. A Ta/Ru layer (contact layer to lower electrode and stopper layer), a CoFeB layer (second ferromagnetic layer 20 (oscillation layer), a Cu layer (first non-magnetic layer 10n), a FePt layer (first ferromagnetic layer 10), a Ru layer (second non-magnetic layer 20n), a FePt layer (fourth ferromagnetic layer 40), an MgO layer (third non-magnetic layer 30n), a CoFeMnSi layer (second portion 32 of third ferromagnetic layer 30), and a MnGa layer (first portion 31 of third ferromagnetic layer 30) are stacked in this order. Here, a magnitude of the magnetic anisotropy in a direction perpendicular to a film surface can be also adjusted by annealing in the magnetic field. Subsequently, a Ru/Ta layer (upper contact layer) is stacked. Thus, a processed body is formed.

Next, an EB resist is coated and EB exposure is performed, and then a resist mask with a diameter of 30 nm is formed. A portion not covered with the resist is removed so as to expose the Ta layer on the lower electrode doubling as the stopper layer.

Subsequently, after forming a SiN layer as the protection layer 52, a Py layer functioning as the magnetic shield 51 is formed. The Py layer is left on the side wall of the magnetic element by etch back.

Next, after forming a $SiO_2$ film in order to bury insulatively the magnetic element and flattening by CPM or the like, the contact layer to the electrode is exposed by etching the whole surface by RIE or the like.

Furthermore, the resist is coated on the whole surface, the resist is patterned by using the stepper exposure apparatus so that a portion not covered with the resist is formed at a position of the upper electrode. The opening corresponding to the upper electrode is buried with Cu to form a film, and the resist is removed. An interconnection (not shown) is provided on the upper electrode so as to enable electrical input and output.

From the above, the magnetic element 104a is completed.

Figure 17A:
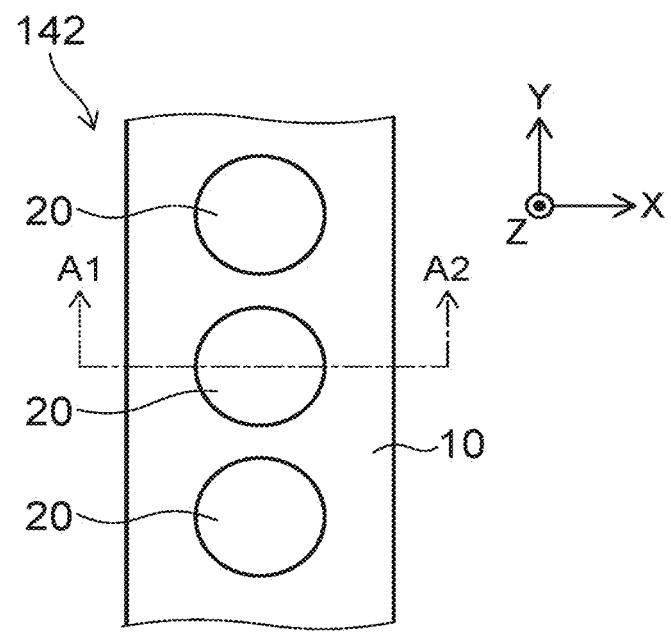
FIG. 17A and FIG. 17B are schematic views showing another magnetic element according to the fourth embodiment.
Figure 17B:
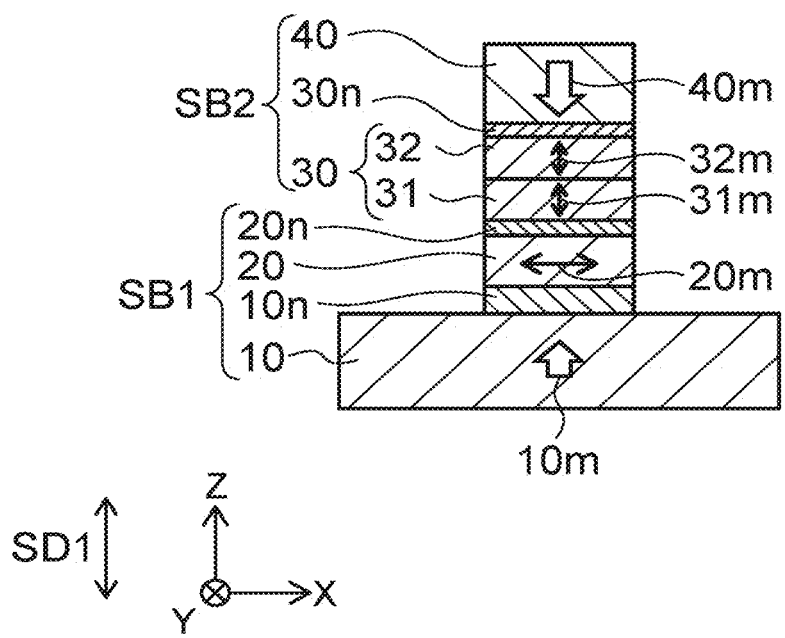

FIG. 17A and FIG. 17B are schematic views showing another magnetic element according to the fourth embodiment.

FIG. 17A is a schematic plan view of a magnetic element 142, and FIG. 17B is a schematic cross sectional view of the magnetic element 142. FIG. 17B shows schematically A1-A2 line section of FIG. 17A.

As shown in FIG. 17A and FIG. 17B, the magnetic element 142 is provided with first non-magnetic layer 10n, second ferromagnetic layer 20, second non-magnetic layer 20n, third ferromagnetic layer 30, third non-magnetic layer 30n and fourth ferromagnetic layer 40, in a plurality, respectively.

The plurality of second ferromagnetic layers 20 are arranged in a direction perpendicular to the first direction SD1. In this example, the plurality of second ferromagnetic layers 20 are arranged in the Y-axis direction. Each of the plurality of first non-magnetic layers 10n is provided between the first ferromagnetic layer 10 and the each of the plurality of second ferromagnetic layers 20. Each of the plurality of second stacked units SB2 is stacked with each of the plurality of the second ferromagnetic layers 20. Each of the plurality of second non-magnetic layers 20n is provided between each of the plurality of second ferromagnetic layers and each of the plurality of second stacked units SB2.

In the magnetic element 142, the plurality of first non-magnetic layers 10n are provided to be arranged on the first ferromagnetic layer 10. The plurality of second ferromagnetic layers 20 are provided on each of the plurality of first non-magnetic layers 10n. The plurality of second non-magnetic layers 20n are provided on each of the plurality of second ferromagnetic layers 20. The plurality of second stacked units SB2 are provided on each of the plurality of second non-magnetic layers 20n.

In the magnetic element 142, the first ferromagnetic layer 10 is larger than the second ferromagnetic layer and the third ferromagnetic layer 30 or the like. Thereby, the leakage magnetic field due to the first magnetization 10m of the first ferromagnetic layer 10 can be small at a position of the third ferromagnetic layer 30.

Figure 18A:
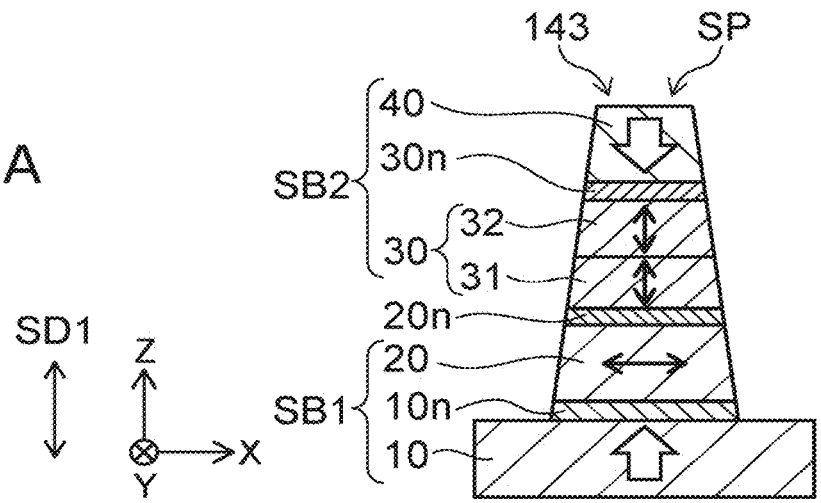
FIG. 18A to FIG. 18C are schematic cross-sectional views showing other magnetic elements according to the fourth embodiment.
Figure 18B:
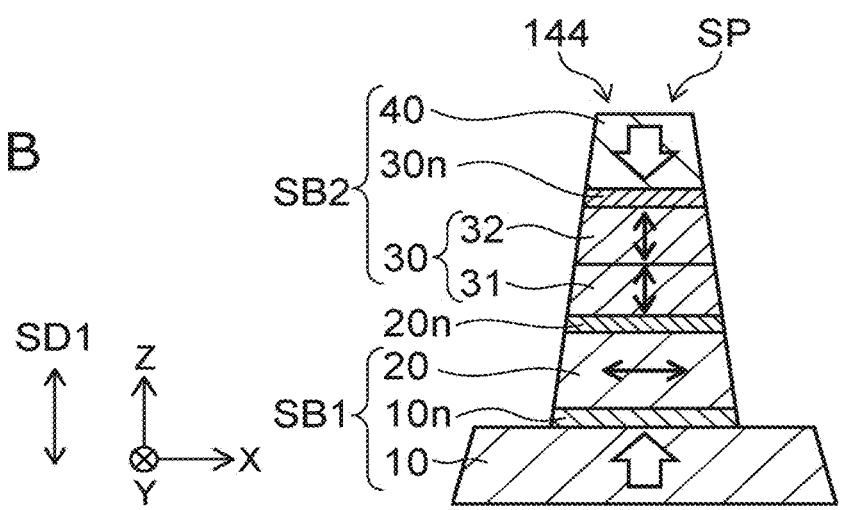
Figure 18C:
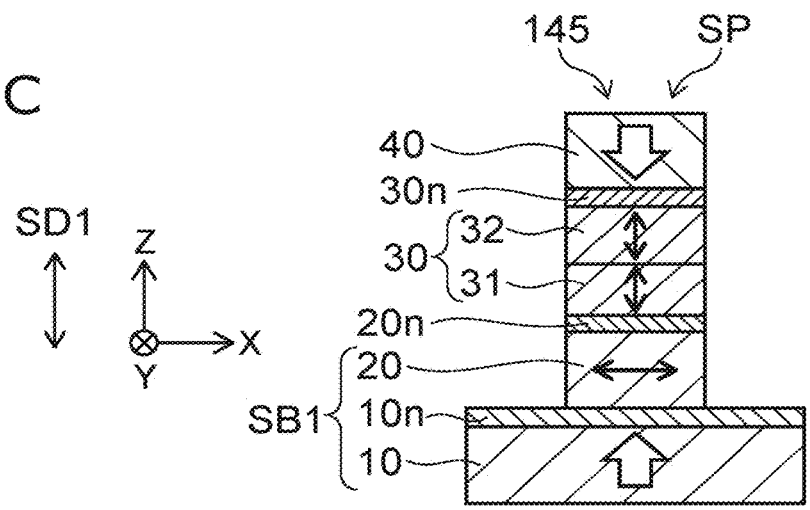

FIG. 18A to FIG. 18C are schematic cross-sectional views showing other magnetic elements according to the fourth embodiment.

As shown in FIG. 18A, the magnetic element 143 is provided with a stacked portion SP on the first ferromagnetic layer 10.

The stacked portion SP includes, in this example, one of the plurality of second ferromagnetic layers 20, one first non-magnetic layer 10n stacked with this one second ferromagnetic layer 20, one second stacked unit SB2 stacked with the one second ferromagnetic layer 20, and one second non-magnetic layer 20n stacked with the one second ferromagnetic layer 20. In the magnetic element 143, a width of the stacked portion SP (length in perpendicular direction to first direction SD1) decreases in a direction from the first ferromagnetic layer 10 toward the second ferromagnetic layer 20. For example, the width of the stacked portion SP decreases continuously.

In this example, the width of the stacked portion SP decreases continuously with going upward. That is, a shape of the stacked potion SP is tapered. The shape of the stacked portion SP is, for example, frustum shaped. A shape of the second ferromagnetic layer 20 or the like projected onto the X-Y plane is, for example, circular. Therefore, the shape of the stacked portion SP is for example, truncated conical. Therefore, in this example, a length of each of the plurality of second stacked units SB2 in the direction perpendicular to the first direction SD1 is shorter than a length of each of the plurality of second ferromagnetic layers 20 in the direction perpendicular to the first direction SD1. For example, a length of the third ferromagnetic layer 30 in the direction perpendicular to the first direction SD1 is shorter than a length of the second ferromagnetic layer 20 in the direction perpendicular to the first direction SD1.

As shown in FIG. 18B, in a magnetic element 144, a width of the first ferromagnetic layer 10 (length in a direction perpendicular to first direction SD1) decreases in a direction from the first ferromagnetic layer 10 toward the second ferromagnetic layer 20. For example, the width of the first ferromagnetic layer 10 decreases continuously. In this example, the width of the first ferromagnetic layer 10 decreases continuously with going upward. That is, a shape of the first ferromagnetic layer 10 is tapered. The shape of the first ferromagnetic layer 10 is, for example, frustum shaped. In this manner, the shape of the first ferromagnetic layer 10 may be tapered.

As shown in FIG. 18C, in a magnetic element 145, one first non-magnetic layer 10n is provided between the first ferromagnetic layer 10 and the second ferromagnetic layer 20. In the magnetic element 145, the first non-magnetic layer 10n is provided on the first ferromagnetic layer 10. The plurality of second ferromagnetic layers 20 are provided to be arranged on the first non-magnetic layer 10n. In this example, the stacked portion SP includes the plurality of second ferromagnetic layers 20.

In this manner, in the configuration of stacking the plurality of stacked portions SP on one first ferromagnetic layer 10, the first non-magnetic layer 10n may be provided in a plurality between the first ferromagnetic layer 10 and each of the second ferromagnetic layers 20, and one first non-magnetic layer 10n may be provided between the first ferromagnetic layer 10 and the plurality of second ferromagnetic layers 20. In the magnetic element 145, a shape of the first non-magnetic layer 10n may be tapered, and a shape of the second ferromagnetic layer 20 may be tapered.

FIG. 19A to FIG. 19K are schematic cross-sectional views illustrating magnetic elements according to the fourth embodiment.

As shown in FIG. 19A to FIG. 19F, in magnetic elements 121 to 126, the second ferromagnetic layer 20, the first non-magnetic layer 10n, the first ferromagnetic layer 10, the second non-magnetic layer 20n, the fourth ferromagnetic layer 40, the third non-magnetic layer 30n and the third ferromagnetic layer 30 are stacked in this order. In this manner, the stacking order of the stacked body SB0 may be the order shown in FIG. 19A to FIG. 19F.

In the magnetic element 121 and the magnetic element 122, a direction of the component of the first direction SD1 of the first magnetization 10m in the first ferromagnetic layer 10 is opposite to a direction of the component of the first direction SD1 of the fourth magnetization 40m in the fourth ferromagnetic layer 40. Thereby, for example, the influence of the leakage magnetic field due to the first magnetization 10m in the first ferromagnetic layer 10 and the fourth magnetization 40m in the fourth ferromagnetic layer 40 can be suppressed at a position of the third ferromagnetic layer 30.

In the magnetic element 121 and the magnetic element 122, the first ferromagnetic layer 10 and the fourth ferromagnetic layer 40 may be coupled antiferromagnetically via the second non-magnetic layer 20n. A structure in which mutual magnetization directions are coupled antiferromagnetically via the non-magnetic layer to be antiparallel in this way is called as a synthetic anti-ferromagnetic (SAF) structure. In this example, the stacked structure of "first magnetic layer (for example, first ferromagnetic layer 10)/non-magnetic layer (for example, second non-magnetic layer 20n)/second magnetic layer (for example, fourth ferromagnetic layer 40)" corresponds to the SAF structure.

By using the SAF structure, mutual magnetization fixing forces are strengthened, the resistance to the external magnetic field and thermal stability can be improved. In this structure, the leakage magnetic field applied to a position of the magnetic memory layer (for example, third ferromagnetic layer 30) in a direction perpendicular to the film surface can be substantially zero.

The non-magnetic layer (intermediate layer) in the SAF structure is based on a metal material such as ruthenium (Ru), iridium (Ir), or osmium (Os). A thickness of the non-magnetic layer is, for example, set to be not more than 3 nm. Thereby, a sufficiently strong antiferromagnetic coupling is achieved via the non-magnetic layer.

That is, the second non-magnetic layer 20n includes at least a metal selected from the group consisting of ruthenium (Ru), osmium (Os), and iridium (Ir), or an alloy including at least two or more metals selected from the group. In the case of the structure such as the magnetic element 121 and the magnetic element 122, a thickness of the second ferromagnetic layer 20 is, for example, not more than 3 nm.

In the magnetic element 123 and the magnetic element 124, a direction of the component of the first direction SD1 of the first magnetization 10m in the first ferromagnetic layer 10 is the same as a direction of the component of the first direction SD1 of the fourth magnetization 40m in the fourth ferromagnetic layer 40. In this manner, the direction of the first magnetization 10m may be parallel to the direction of the fourth magnetization 40m.

In the magnetic element 125 and the magnetic element 126, the direction of the first magnetization 10m and the direction of the fourth magnetization 40m are slanted to the first direction SD1. The direction of the first magnetization 10m and the direction of the fourth magnetization 40m may not be parallel to the first direction SD1. The direction of the first magnetization 10m and the direction of the fourth magnetization 40m are sufficient to have at least the component of the first direction SD1.

As shown in FIG. 19G and FIG. 19H, in a magnetic element 127 and a magnetic element 128, the second ferromagnetic layer 20, the first non-magnetic layer 10n, the first ferromagnetic layer 10, the second non-magnetic layer 20n, the third ferromagnetic layer 30, the third non-magnetic layer 30n and the fourth ferromagnetic layer 40 are stacked in this order. In this manner, the stacking order of the stacked body SB0 may be the order shown in FIG. 19G and FIG. 19H.

As shown in FIG. 19I and FIG. 19J, in a magnetic element 129 and a magnetic element 130, the first ferromagnetic layer 10, the first non-magnetic layer 10n, the second ferromagnetic layer 20, the second non-magnetic layer 20n, the fourth ferromagnetic layer 40, the third non-magnetic layer 30n and the third ferromagnetic layer 30 are stacked in this order. In this manner, the stacking order of the stacked body SB0 may be the order shown in FIG. 19I and FIG. 19J.

As shown in FIG. 19K, in a magnetic element 131, the first ferromagnetic layer 10, the first non-magnetic layer 10n, the second ferromagnetic layer 20, the second non-magnetic layer 20n, the first portion 31, the second portion 32, the third non-magnetic layer 30n and the fourth ferromagnetic layer 40 are stacked in this order. Furthermore, a fourth non-magnetic layer 40n may be provided between the first portion 31 and the second portion 32. In this manner, the stacking order of the stacked body SB0 may be the order shown in FIG. 19K.

In the magnetic elements 121 to 131, a writing current is flown through the stacked unit SB1 and the stacked unit SB2 via the conductive layer 81 and the conductive layer 82. The direction of the writing current is arbitrary.

In the case where the first portion 31 and the second portion 32 are coupled ferromagnetically, in the structures of FIG. 19A, FIG. 19B, FIG. 19E, FIG. 19F and FIG. 19K, the writing current is greatly reduced similarly to the magnetic element 104 described above. This is because of the coincidence of a direction of the rotating magnetic field generated in the second ferromagnetic layer 20 to a direction of the precession of the first magnetization 31m in the first portion 31 of the third ferromagnetic layer 30.

Also in the case of other structures, the writing current reduces, however the reduction amount becomes relatively small. In the structures of FIG. 19C, FIG. 19D, FIG. 19G, FIG. 19H, FIG. 19I, FIG. 19J and FIG. 19K, the magnetic field parallel to the first direction SD1 is applied externally to the magnetic element. Thereby, for example, the reduction amount of the writing current can be equal to the cases of the FIG. 19A, FIG. 19B, FIG. 19E, FIG. 19F and FIG. 19K. For example, in the case of FIG. 19C, the magnetic field is applied downward.

It can be confirmed by calculation that the difference of the reduction amount of the writing current depending on the structure of the magnetic element like this is due to the relationship between the direction of the precession of the magnetization of the third ferromagnetic layer 30 and the direction of the rotation of the magnetization of the second ferromagnetic layer 20. In the case where the direction of natural rotation of the magnetization of the second ferromagnetic layer 20 coincides with the direction of the precession of the magnetization of the third ferromagnetic layer 30 each other when a current is flown through STO without the third ferromagnetic layer 30, the magnetization reversal is efficiently assisted by the magnetic field. For this reason, the reduction amount of the writing current becomes great.

Figure 20:
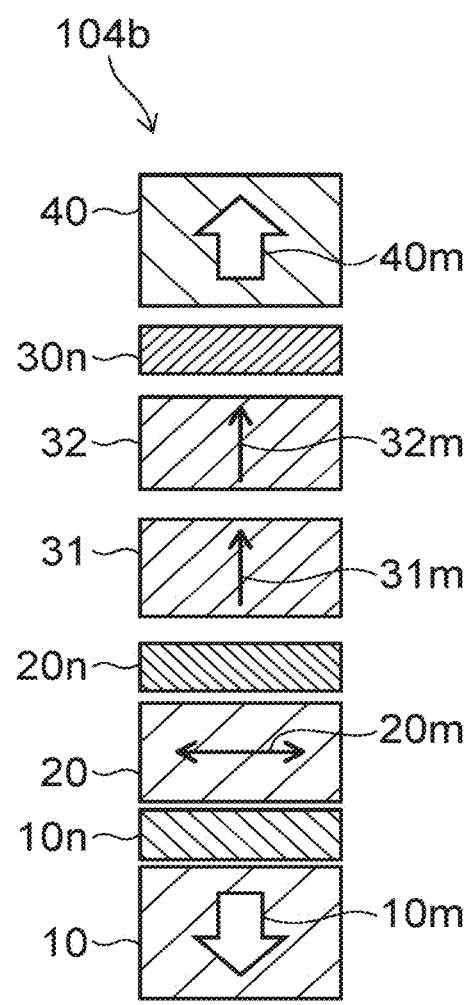
FIG. 20 is a schematic cross-sectional view showing another magnetic element according to the fourth embodiment.

Also in the case where the direction of the natural rotation of the magnetization of the second ferromagnetic layer 20 does not coincide with the direction of the precession of the magnetization of the third ferromagnetic layer 30 each other when the current is flown through STO without the third ferromagnetic layer 30, in the embodiment, since the second ferromagnetic layer 20 and the third ferromagnetic layer 30 are coupled magnetostatically, the direction of the rotation of the magnetization of the second ferromagnetic layer 20 is the same as the direction of the precession of the magnetization of the third ferromagnetic layer 30. However, in this case, the efficiency of assisting the magnetization reversal becomes relatively low. FIG. 20 shows the example that the reduction amount of the writing current is great and favorable.

FIG. 20 is a schematic cross-sectional view illustrating another magnetic element according to the fourth embodiment.

FIG. 20 illustrates the favorable structure of the magnetic element in the case where the first portion 31 and the second portion 32 are coupled ferromagnetically. As shown in FIG. 20, in a magnetic element 104b, the first ferromagnetic layer 10, the first non-magnetic layer 10n, the second ferromagnetic layer 20, the second non-magnetic layer 20n, the first portion 31, the second portion 32, the third non-magnetic layer 30n and the fourth ferromagnetic layer 40 are stacked in this order. In this example, the first magnetization 10m of the first ferromagnetic layer 10 is downward. The magnetization 31m of the first portion 31, the magnetization 32m of the second portion 32 and the fourth magnetization 40m of the fourth ferromagnetic layer 40 are upward, respectively.

Figure 21:
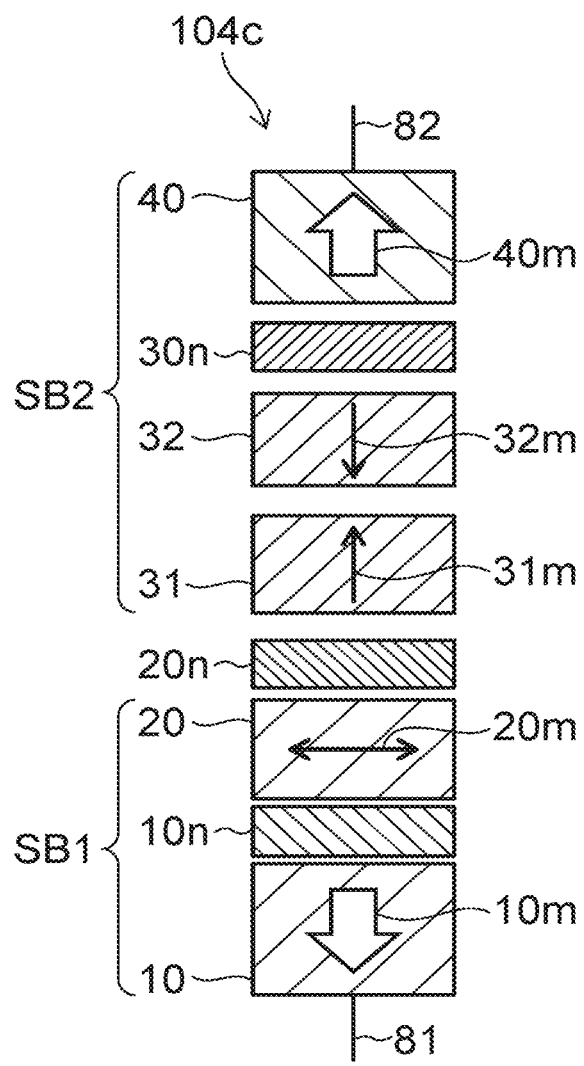
FIG. 21 is a schematic cross-sectional view showing another magnetic element according to the fourth embodiment.

In the case where the first portion 31 and the second portion 32 are coupled antiferromagetically, in any structure shown in FIG. 19A to FIG. 19K, the writing current can be reduced greatly. The reduction amount of the writing current is, for example, relatively great in the structure that a distance between the second ferromagnetic layer 20 and the third ferromagnetic layer 30 is short. For this reason, the structure shown in FIG. 19K is favorable. FIG. 21 shows the example that the reduction amount of the writing current is great and favorable.

FIG. 21 is a schematic cross-sectional view illustrating another magnetic element according to the fourth embodiment.

FIG. 21 illustrates the favorable structure of the magnetic element in the case where the first portion 31 and the second portion 32 are coupled antiferromagnetically. As shown in FIG. 21, in a magnetic element 104c, the first ferromagnetic layer 10, the first non-magnetic layer 10n, the second ferromagnetic layer 20, the second non-magnetic layer 20n, the first portion 31, the second portion 32, the third non-magnetic layer 30n and the fourth ferromagnetic layer 40 are stacked in this order. The fourth non-magnetic layer 40n may be not provided between the first portion 31 and the second portion 32. The magnetic element may include the conductive layer 81 and the conductive layer 82. The conductive layer 81 is electrically connected to the first ferromagnetic layer 10, and the conductive layer 82 is electrically connected to the fourth magnetic layer 40.

In this example, the first magnetization 10m of the first ferromagnetic layer 10 and the magnetization 32m of the second portion 32 are downward. The magnetization 31m of the first portion 31 and the fourth magnetization 40m of the fourth ferromagnetic layer 40 are upward. If the first portion 31 and the second portion 32 are coupled antiferromagnetically, the leakage magnetic field to adjacent surrounding bits can be small. Thereby, incorrect operation of the magnetic element can be suppressed.

Figure 22A:
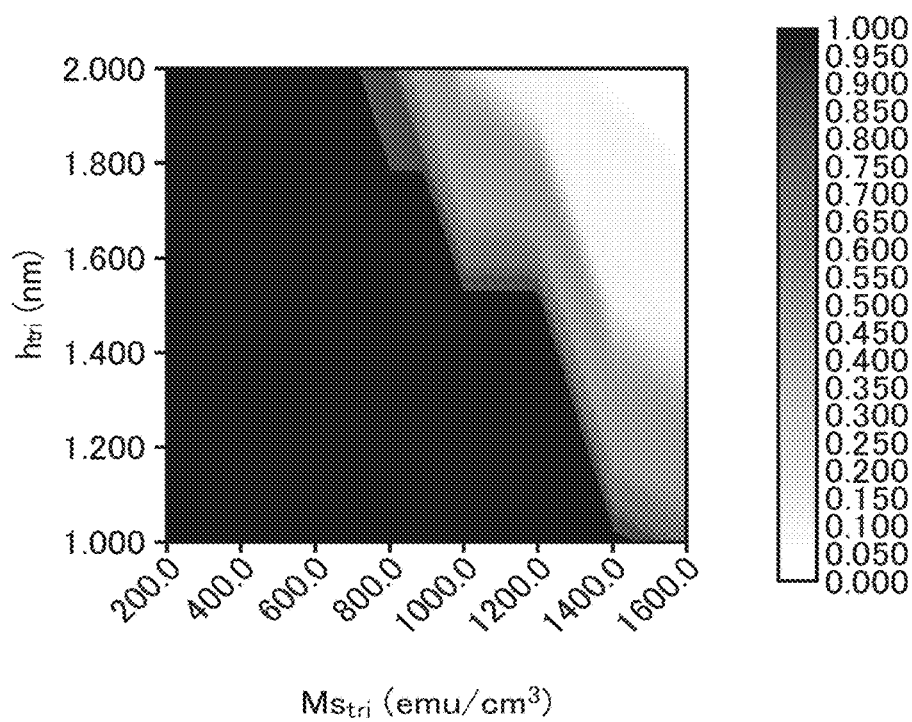
FIG. 22A and FIG. 22B are schematic views showing simulation results of characteristics of the magnetic element according to the fourth embodiment.
Figure 22B:
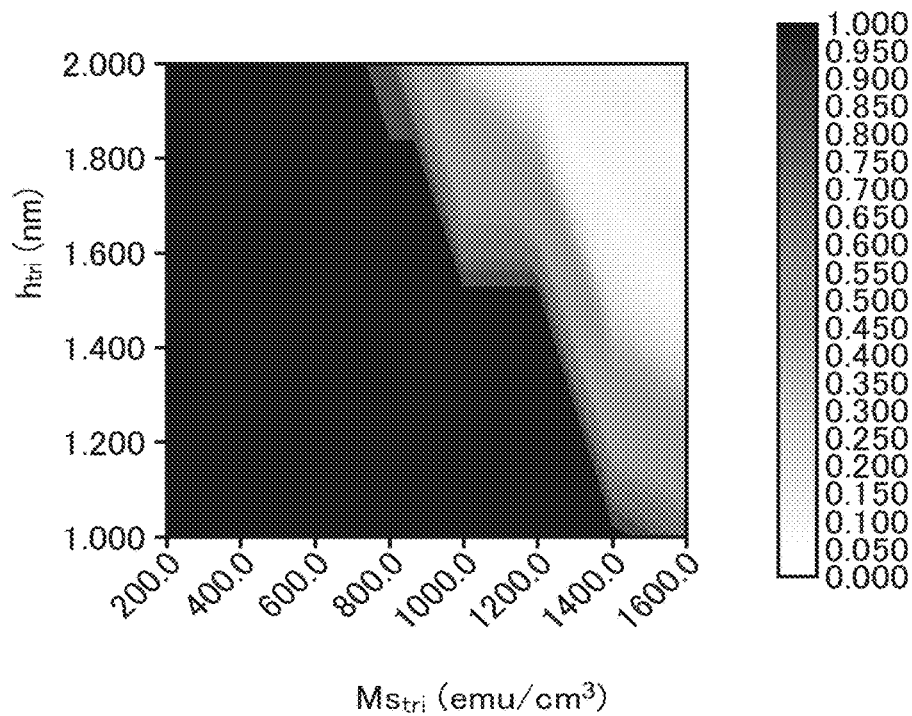

FIG. 22A and FIG. 22B are schematic views illustrating simulation results of characteristics of the magnetic element according to the fourth embodiment.

These figures show the simulation results about the reduction of the writing current in the magnetic element 104c shown in FIG. 21. FIG. 22A and FIG. 22B show contour illustrating the magnitude of the reverse current. The first portion 31 and the second portion 32 are coupled antiferromagnetically.

In this simulation, the magnetization $Ms_{tri}$ of the second portion 32 and the thickness $h_{tri}$ of the second portion 32 are varied. The magnetization $Ms_{mtj}$ (emu/cm$^3$) of the first portion 31 is assumed to be 400 emu/cm$^3$, and the thickness $h_{mtj}$ of the first portion 31 is assumed to be 2 nm. The thickness $h_{sto}$ of the second ferromagnetic layer 20 is assumed to be 2 nm. FIG. 22a shows results of the case where the magnetization Ms (emu/cm$^3$) of the second ferromagnetic layer 20 is assumed to be 1200 emu/cm$^3$, and FIG. 22B shows results of the case where the magnetization Ms (emu/cm$^3$) of the second ferromagnetic layer 20 is assumed to be 1400 emu/cm$^3$.

That is, the calculations on FIG. 22A and FIG. 22B correspond to the cases where the magnetic resonance frequency f3 of the third ferromagnetic layer 30 is varied when a parameter (namely, 2γNzMs) of the second ferromagnetic layer 20 is constant. In this calculation, a width of a pulse current which is flown through the stacked unit SB1 and the stacked unit SB2 by the conductive layers 81 and 82 is assumed to be 10 (ns). Even if the width of the pulse current is assumed to be 1 (ns), similar results are obtained.

The horizontal axis represents the magnetization $Ms_{tri}$ (emu/cm$^3$) of the second portion 32, and the vertical axis represents the thickness $h_{tri}$ (nm) of the second portion 32. A color (depth) in the figure shows a ratio Rw (=Iw/Iw0) of the reverse current Iw in the respective regions in the figure to the reverse current Iw0 similar to the description on FIG. 11A. The reverse current Iw0 is the reverse current in the case where the second ferromagnetic layer 20 is not provided. With thinner color, the ratio Rw is low. That is, it means that the reverse current Iw is low, and the writing current is reduced.

As shown in FIG. 22A and FIG. 22B, the writing current reduces greatly in the upper-right region in the figures. In this manner, even if in the case where the first portion 31 and the second portion 32 are coupled antiferromagnetically, the writing current can be reduced.

FIG. 23A to FIG. 23D are schematic views illustrating simulation results of the characteristics of the magnetic element according to the fourth embodiment.

These figures show the simulation results about the reduction of the writing current in the magnetic element 104c shown in FIG. 21. That is, the first portion 31 and the second portion 32 are coupled ferromagnetically.

In this simulation, the direction of the current flowing through the first stacked unit SB1 and the direction of the current glowing through the second stacked unit SB2 are changed, and the reduction of the writing current is calculated. For example, the second non-magnetic layer 20n is used for the interconnection layer. The controller 550 controls the current flowing through the second non-magnetic layer 20n, the conductive layer 81 and the conductive layer 82. Thereby, the direction of the current flowing through the first stacked unit SB1 and the direction of the current flowing through the second stacked unit SB2 are controlled.

Also in this simulation, the magnetization $Ms_{tri}$ of the second portion 32 and the thickness $h_{tri}$ of the second portion 32 are varied. The magnetization $Ms_{mtj}$ (emu/cm$^3$) of the first portion 31 is assumed to be 400 emu/cm$^3$, and the thickness $h_{mtj}$ of the first portion 31 is assumed to be 2 nm. The magnetization Ms (emu/cm$^3$) of the second ferromagnetic layer 20 is assumed to be 1200 emu/cm$^3$, and the thickness $h_{sto}$ of the second ferromagnetic layer 20 is assumed to be 2 nm.

Figure 23A:
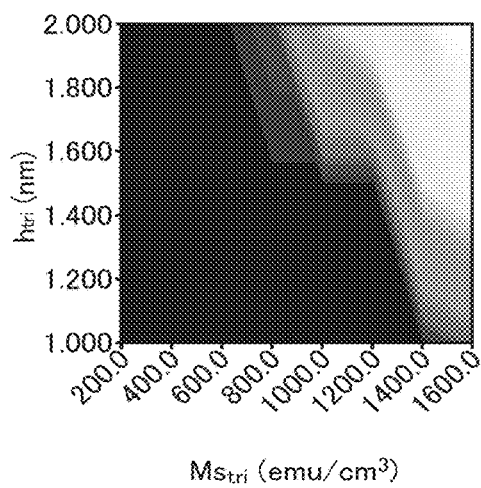
FIG. 23A to FIG. 23D are schematic views showing simulation results of the characteristics of the magnetic element according to the fourth embodiment.
Figure 23B:
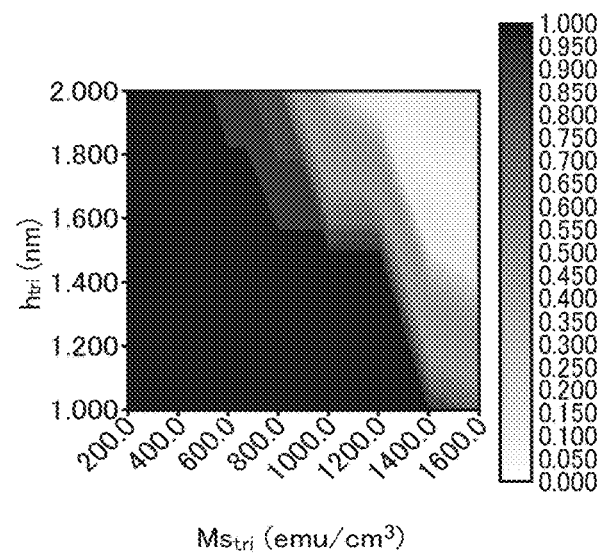
Figure 23C:
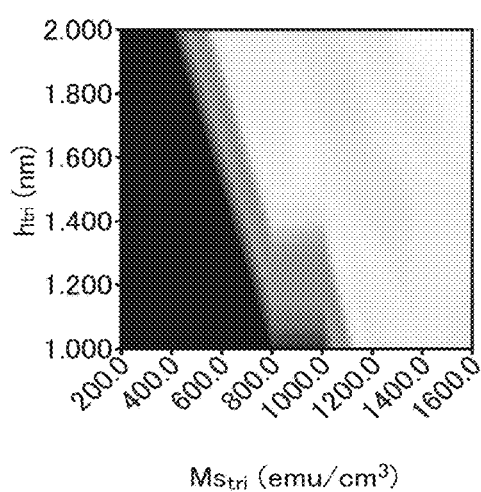
Figure 23D:
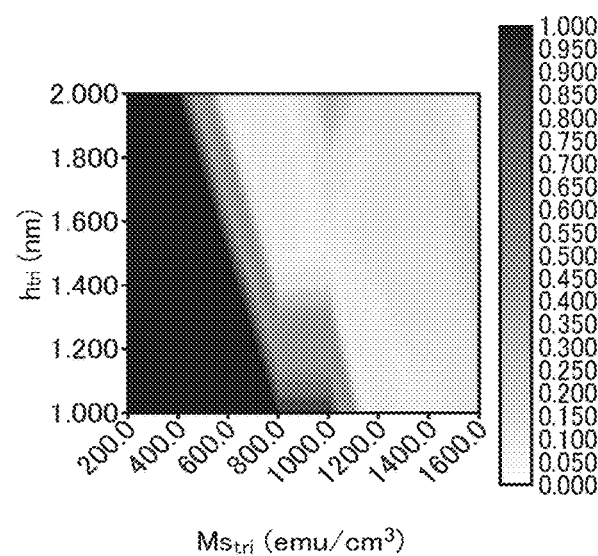

In FIG. 23A and FIG. 23B, the width of the pulse current which is flown through the magnetic element is determined as 10 (ns) by the second non-magnetic layer 20n, the conductive layer 81 and the conductive layer 82. In FIG. 23C and FIG. 23D, the width of the pulse current which is flown through the magnetic element is determined as 1 (ns) by the second non-magnetic layer 20n, the conductive layer 81 and the conductive layer 82.

The horizontal axis represents the magnetization $MS_{tri}$ (emu/cm$^3$) of the second portion 32, and the vertical axis represents the thickness $h_{tri}$ (nm) of the second portion 32. Similar to FIG. 22A and FIG. 22B, a color (depth) in the figures show a ratio Rw of the reverse current, and it means that the writing current is low with thinner color.

FIG. 23A and FIG. 23C show the calculation results of the case where the pulse current is in a normal direction. FIG. 23B and FIG. 23D show the calculation results of the case where the pulse current is in a reverse direction.

The normal direction means a state in which the direction of the current flowing through the first stacked unit SB1 (first ferromagnetic layer 10 and second ferromagnetic layer 20) is the same as the direction of the current flowing through the second staked unit SB2 (third ferromagnetic layer 30 and fourth ferromagnetic layer 40) each other in the structure of FIG. 21. This state corresponds to the case where the direction of the rotation of the second magnetization 20m in the second ferromagnetic layer 20 in STO including the first stacked unit SB1 and not including the second stacked unit SB2 coincides with the direction of the precession of the third magnetization 30m in the third ferromagnetic layer 30 in MTJ not including the first stacked unit SB1 and including the second stacked unit SB2. The direction of the current corresponding to the case of stacking STO and MTJ like this is defined as the normal direction for convenience.

The reverse direction means a state in which the direction of the current flowing through the first stacked unit SB1 is opposite to the direction of the current flowing through the second stacked unit SB2 each other in the structure of FIG. 21. This state corresponds to the case where the direction of the rotation of the second magnetization 20m in the second ferromagnetic layer 20 in STO including the first stacked unit SB1 and not including the second stacked unit SB2 does not coincide with the direction of the precession of the third magnetization 30m in the third ferromagnetic layer 30 in MTJ not including the first stacked unit SB1 and including the second stacked unit SB2 each other. The direction of the current corresponding to the case of stacking STO and MTJ like this is defined as the reverse direction for convenience. The cases of the reverse direction are, for example, the structures in FIG. 19C, FIG. 19D, FIG. 19G, FIG. 19H, FIG. 19I, FIG. 19J. However, if the current is flown through the structures in FIG. 19C, FIG. 19D, FIG. 19G, FIG. 19H, FIG. 19I, FIG. 19J from the conductive layer 81 toward the conductive layer 82, the direction of the precession of the third magnetization 30m coincides with the rotation direction of the second magnetization 20m by ferromagnetic coupling (or antiferromagnetic coupling, magnetostatic coupling).

If STO and MTJ corresponding to the reverse direction are stacked, the second magnetization 20m of the second ferromagnetic layer 20 and the third magnetization of the third ferromagnetic layer 30 are coupled magnetostatically, ferromagnetically or antiferromagnetically, and thus rotate in the same direction one another. However, this rotation is different from original rotation (rotation of the case where STO and MTJ are not stacked). Thus, it is conceived that the reduction amount of the writing current is decreased. However, It has been found that in the case where the first portion 31 and the second portion 32 are coupled antiferromagnetically, the reduction amount of the writing current does not decrease so much even if the case of the reverse direction.

In the case where the first portion 31 and the second portion 32 are coupled antiferromagnetically, even if in the case of the reverse direction of FIG. 23B, the writing current reduces similar to the case of the normal direction of FIG. 23A. Even if in the case of the reverse direction of FIG. 23D, the writing current reduces similar to the case of the normal direction of FIG. 23C. From this, in the case where the first portion 31 and the second portion 32 are coupled antiferromagnetically, in any stacking order shown in FIG. 19A to FIG. 19K, the writing current can be reduced.

In the case where the first portion 31 and the second portion 32 are coupled antiferromagnetically, the rotation direction of the second magnetization of the second ferromagnetic layer 20 coincides with one of the rotation direction of the magnetization 31m of the first portion 31 and the rotation direction of the magnetization 32m of the second portion 32. For this reason, it is found by the calculation that the assist effect of the magnetization reversal does not attenuate. Thereby, restriction about the stacking order of the respective layers included in the magnetic element is relaxed, and it becomes easy to design.

FIG. 24A to FIG. 24E are schematic cross-sectional views illustrating other magnetic elements according to the embodiment.

Magnetic elements 201 to 205 shown in FIG. 24A to FIG. 24E function as, for example, a magnetic memory element. In each of the magnetic elements 201 to 205, the second non-magnetic layer 20n is a conductive layer and has a function as an interconnection layer.

Figure 24A:
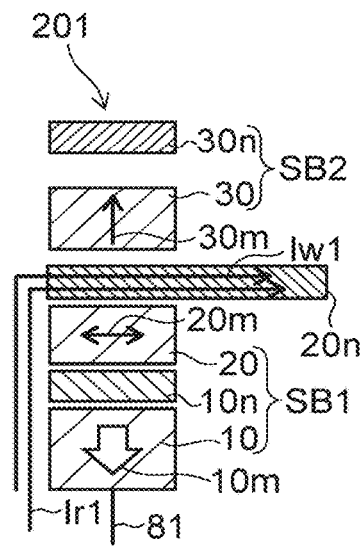
FIG. 24A to FIG. 24E are schematic cross-sectional views showing other magnetic elements according to the embodiment.

As shown in FIG. 24A, in the magnetic element 201, the first ferromagnetic layer 10, the first non-magnetic layer 10n, the second ferromagnetic layer 20, the second non-magnetic layer 20n, the third ferromagnetic layer 30 and the third non-magnetic layer 30n are stacked in this order.

In this example, the third non-magnetic layer 30n is based on a material inducing an interface magnetic anisotropy to the third ferromagnetic layer 30. In such a case, the magnetic anisotropy of the third ferromagnetic layer 30 is enhanced. Thereby, the magnetic resonance frequency f3 of the third ferromagnetic layer 30 becomes higher. For example, MgO or the like is used for the third non-magnetic layer 30n. The material used for the third non-magnetic layer 30n may be a spinel-based dielectric material.

As already described, in the case where the maximum frequency (2γNzMs) which the second ferromagnetic layer 20 is capable of outputting is higher than 0.9 times of the magnetic resonance frequency f3 of the third ferromagnetic layer 30, the high oscillation frequency f of the second ferromagnetic layer 20 is obtained stably. At this time, since the magnetic resonance frequency f3 of the third ferromagnetic layer 30 is high, the oscillation frequency f of the second ferromagnetic layer 20 can be high.

In the case where the second non-magnetic layer 20n is not an interconnection layer, the material inducing the interface anisotropy to the third ferromagnetic layer 30 may be used as the material of the third non-magnetic layer 30n. For example, MgO or the like is used for the third non-magnetic layer 30n. The material used for the third non-magnetic layer 30n may be a spinel-based dielectric material.

In the magnetic element 201, the controller 550 is electrically connected to the conductive layer 81 and the second non-magnetic layer 20n. The controller 550 controls the current flowing between the conductive layer 81 and the second non-magnetic layer 20n (current flowing through first stacked unit SB1).

For example, as shown in FIG. 24A, the controller 550 flows a writing current Iw1 between the conductive layer 81 and the second non-magnetic layer 20n via the first stacked unit SB1. At this time, the writing current Iw1 does not flow in the third ferromagnetic layer and the third non-magnetic layer 30n.

For example, in the case where the material of the second non-magnetic layer 20n is in the case (i) or (ii) described above, the second ferromagnetic layer 20 and the third ferromagnetic layer 30 are coupled magnetostatically (ferromagnetically or antiferromagnetically). Thus, the third magnetization 30m of the third ferromagnetic layer 30 can be reversed by the writing current Iw1.

For example, in the case where the material of the second non-magnetic layer 20n is in the case (iii) described above, a spin flow is operated on the third ferromagnetic layer 30 by the spin Hall effect (Rabash effect, spin orbit interaction or the like). Thereby, the third magnetization 30m of the third ferromagnetic layer 30 rotates. At this time, since the direction of the precession of the magnetization in the third ferromagnetic layer 30 coincides with the direction of the rotation of the magnetization in the second ferromagnetic layer 20, the magnetization reversal is assisted efficiently by the magnetic field. Thereby, the reduction amount of the writing current becomes great. In this case, since the writing current Iw1 does not flow in the third non-magnetic layer 30n, the element can be made difficult to be broken.

In the case where the material of the second non-magnetic layer 20n is any of (i) to (iii) described above, when reading, a reading current Ir is flown between the conductive layer 81 and the second non-magnetic layer 20n via the first stacked unit SB1. Thereby, the writing state can be discriminated as a difference of the oscillation frequencies f to the same value current. The difference of the oscillation frequencies can be produced by a difference of the leakage magnetic field of the third ferromagnetic layer 30. The respective magnetic elements described about the first to third embodiments may be used as the magnetic memory element similar to the magnetic element 201.

In the magnetic elements 202 to 205 shown in FIG. 24B to FIG. 24E, the controller 550 is electrically connected to the conductive layer 81, the conductive layer 82 and the second non-magnetic layer 20n.

Figure 24B:
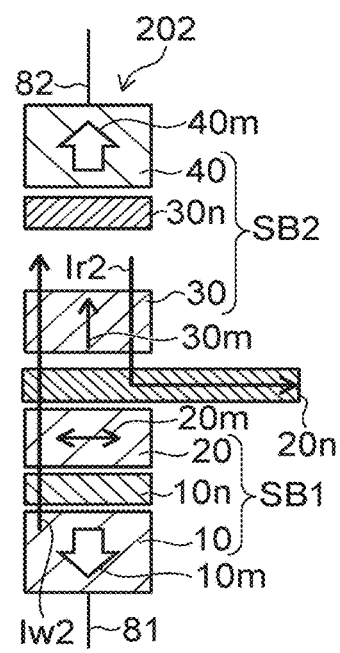
Figure 24C:
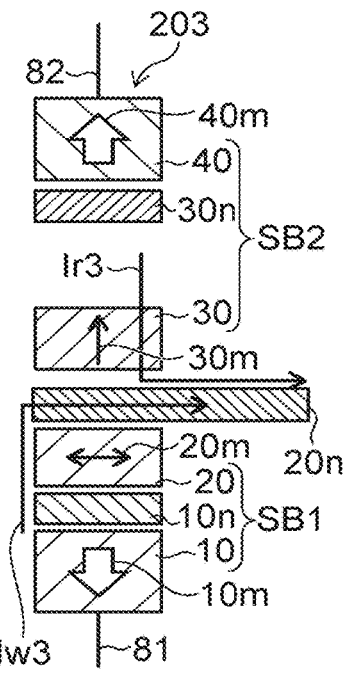

In the magnetic element 202 shown in FIG. 24B and the magnetic element 203 shown in FIG. 24C, the first ferromagnetic layer 10, the first non-magnetic layer 10n, the second ferromagnetic layer 20, the second non-magnetic layer 20n, the third ferromagnetic layer 30, the third non-magnetic layer 30n and the fourth ferromagnetic layer 40 are stacked in this order.

In the magnetic element 202 of FIG. 24B, the second non-magnetic layer 20n is based on the material of (i) or (ii) described above. The controller 550 flows aaaa writing current Iw2 between the conductive layer 81 and the conductive layer 82 via the first stacked unit SB1 and the second stacked unit SB2. Thereby, the third magnetization 30m of the third ferromagnetic layer 30 is reversed. When reading, the controller 550 flows a reading current Iw2 between the conductive layer 82 and the second non-magnetic layer 20n via the second stacked unit SB2. The reading current Ir1 does not flow through the first stacked unit SB1. In this structure, since the reading current Iw2 does not flow through the second ferromagnetic layer 20, the second ferromagnetic layer 20 does not oscillate when reading. Therefore, the reading is stabilized.

In the magnetic element 203 of FIG. 24C, the controller 550 flows a writing current Iw3 between the conductive layer 81 and the second non-magnetic layer 20n via the first stacked unit SB1. At this time, the writing current Iw3 does not flow through the second stacked unit SB2.

Also in the magnetic element 203, for example, in the case where the material of the second non-magnetic layer 20n is in the case (i) or (ii) described above, the second ferromagnetic layer 20 and the third ferromagnetic layer 30 are coupled magnetostatically (ferromagnetically or antiferromagnetically). For this reason, the third magnetization 30m of the third ferromagnetic layer 30 can be reversed by the writing current Iw3.

For example, in the case where the material of the second non-magnetic layer 20n is in the case (iii) described above, a spin flow is operated on the third ferromagnetic layer 30 by the spin Hall effect (Rabash effect, spin orbit interaction or the like). Thereby, the third magnetization 30m of the third ferromagnetic layer 30 is reversed. Thereby, the third magnetization 30m of the third ferromagnetic layer 30 rotates. At this time, since the direction of the precession of the magnetization in the third ferromagnetic layer 30 coincides with the direction of the rotation of the magnetization in the second ferromagnetic layer 20, the magnetization reversal is assisted efficiently by the magnetic field. Thereby, the reduction amount of the writing current becomes great. Since the writing current Iw3 does not flow in the third non-magnetic layer 30n, the element can be made difficult to be broken.

When reading, the controller 550 flows a reading current Ir3 between the conductive layer 82 and the second non-magnetic layer 20n via the stacked unit SB2. Since the reading current Ir3 does not flow through the second ferromagnetic layer 20, the second ferromagnetic layer 20 does not oscillate when reading. Therefore, the reading is stabilized.

Figure 24D:
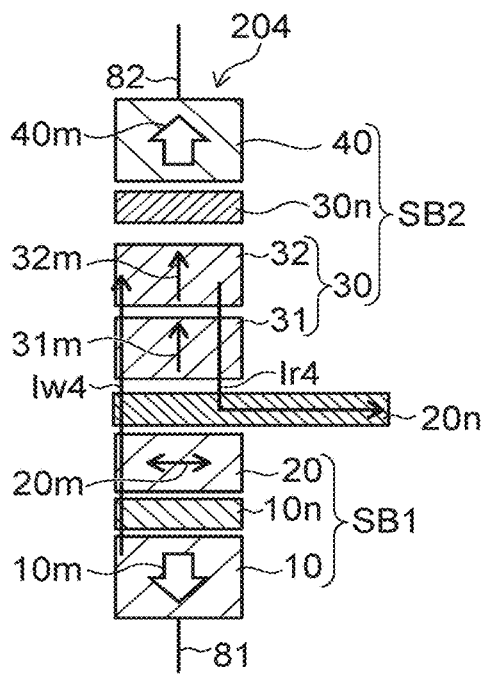
Figure 24E:
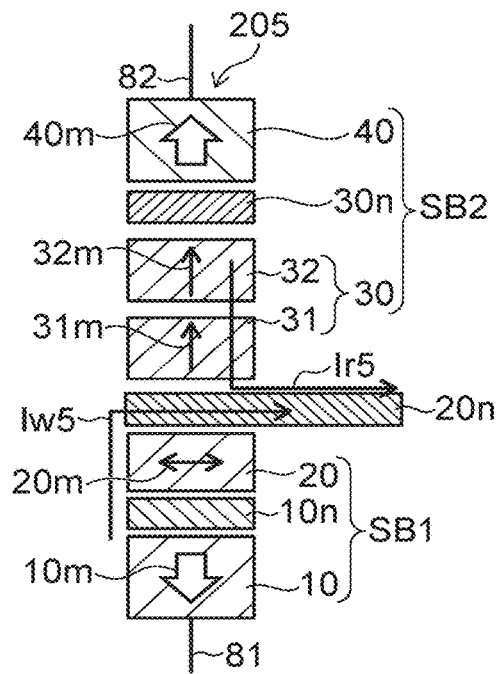

In the magnetic element 204 shown in FIG. 24D and the magnetic element 205 shown in FIG. 24E, the third ferromagnetic layer 30 includes the first portion 31 and the second portion 32. The first portion 31 and the second portion are coupled ferromagnetically. Thereby, the magnetic resonance frequency f3 of the third ferromagnetic layer 30 is lowered and the reduction amount of the writing current can be great. The first portion 31 and the second portion 32 may be coupled magnetistaically or antiferromagnetically.

In the magnetic element 204 of FIG. 24D, the controller 550 flows a writing current Iw4 between the conductive layer 81 and the second non-magnetic layer 20n via the first stacked unit SB1 and the second stacked unit SB2. When reading, the controller 550 flows a reading current Ir4 between the conductive layer 82 and the second non-magnetic layer 20n via the second stacked unit SB2. The reading current Ir4 does not flow the first stacked unit SB1. Since the reading current Ir4 does not flow through the second ferromagnetic layer 20, the second ferromagnetic layer 20 does not oscillate when reading. Therefore, the reading is stabilized.

In the magnetic element 205 of FIG. 24E, the controller 550 flows a writing current Iw5 between the conductive layer 81 and the second non-magnetic layer 20n via the first stacked unit SB1, At this time, the writing current Iw5 does not flow through the second stacked unit SB2.

Also in the magnetic element 205, for example, in the case where the material of the second non-magnetic layer 20n is in the case (i) or (ii), the second ferromagnetic layer 20 and the third ferromagnetic layer 30 are coupled magnetostatically (ferromagnetically or antiferromagnetically). For this reason, the magnetization of the third ferromagnetic layer 30 can be reversed by the writing current Iw5. For example, in the case where the material of the second non-magnetic layer 20n is in the case (ii) described above, a spin flow is operated on the third ferromagnetic layer 30 by the spin Hall effect or the like (Rabash effect, spin orbit interaction or the like). Thereby, the magnetization of the third ferromagnetic layer 30 is reversed. At this time, since the direction of the precession of the magnetization of the third ferromagnetic layer 30 coincides with the direction of the rotation of the magnetization of the second ferromagnetic layer 20, the magnetization reversal is effectively assisted by the magnetic field. For this reason, the reduction amount of the writing current becomes great. Since the writing current Iw3 does not flow through the third non-magnetic layer 30n, the element can be made difficult to be broken.

When reading, the controller 550 flows a reading current Ir5 between the conductive layer 82 and the second non-magnetic layer 20n via the second stacked unit SB2. Since the reading current Ir5 does not flow through the second ferromagnetic layer 20, the second ferromagnetic layer 20 does not oscillate when reading. Therefore, the reading is stabilized.

Figure 25A:
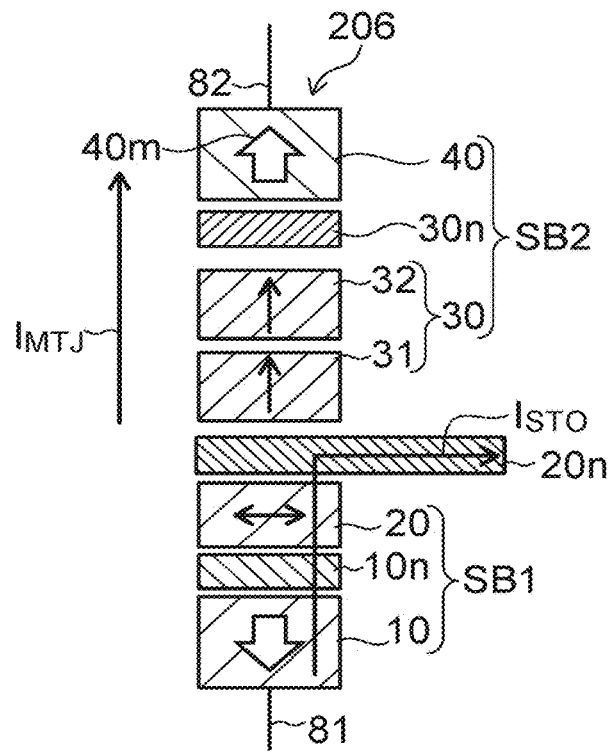
FIG. 25A and FIG. 25B are schematic views showing characteristics of a magnetic element according to the embodiment.
Figure 25B:
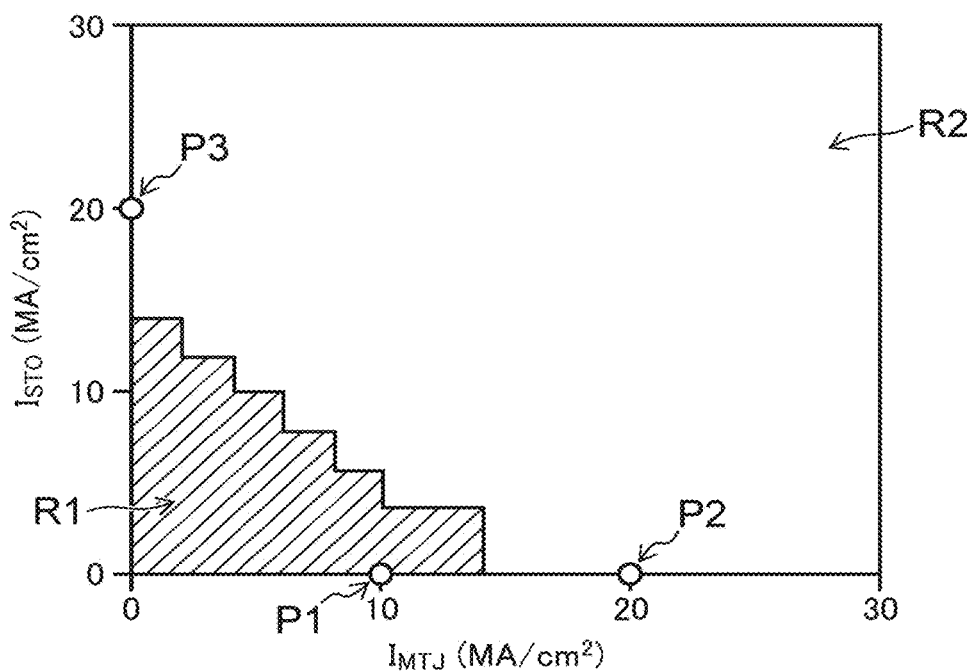

FIG. 25A and FIG. 25B are schematic views illustrating characteristics of a magnetic element according to the embodiment.

FIG. 25A and FIG. 15B show the simulation results of the writing current in a magnetic element 206. The structure of the magnetic element 206 is the same as the structure of the magnetic element 204 shown in FIG. 24D or the structure of the magnetic element 205 shown in FIG. 24E.

As shown in FIG. 25A, a density of the current flowing through the second stacked unit SB2 (current flowing between first portion 31 and conductive layer 82) is assumed to be $I_{MTJ}$ (MA/cm$^2$). A density of the current flowing between the conductive layer 81 and the second non-magnetic layer 20n via the first stacked unit SB1 is assumed to be $I_{STO}$ (MA/cm$^2$). In this simulation, $I_{MTJ}$ (MA/cm$^2$) and $I_{STO}$ (MA/cm$^2$) are varied and the behavior of the third magnetization 30m (magnetization 31m and magnetization 32m) of the third ferromagnetic layer 30 is determined. $I_{STO}=I_{MTJ}$ corresponds to the case where the current flows between the conductive layer 81 and the conductive layer 82 via the first stacked unit SB1 and the second stacked unit SB2.

The horizontal axis of FIG. 25B represents $I_{MTJ}$ (MA/cm$^2$), and the vertical axis represents $I_{STO}$ (MA/cm$^2$). In a hatched region R1 in FIG. 25B, the third magnetization 30m of the third ferromagnetic layer 30 does not reverse. In a white region R2 in FIG. 25B, the third magnetization 30m of the third ferromagnetic layer 30 reverses.

For example, in the condition of $I_{MTJ}$=10 MA/cm² and $I_{STO}$=0 MA/cm² such as a point P1 in FIG. 25B, the magnetization of the third ferromagnetic layer 30 does not reverse. On the other hand, in the condition of $I_{MTJ}$=20 MA/cm² and $I_{STO}$=0 MA/cm² such as a point P2, the magnetization of the third ferromagnetic layer 30 reverses. In the condition of $I_{MTJ}$=0 MA/cm² and $I_{STO}$=20 MA/cm² such as a point P3, the magnetization of the third ferromagnetic layer 30 reverses. The condition of the point P3 corresponds to the case where the second non-magnetic layer 20n is based on the material of (ii) or (iii) in the structures shown in FIG. 24A, FIG. 24C and FIG. 24E. Consequently, it is seen from the simulation that the magnetization reverses in the structures described above.

Fifth Embodiment

Figure 26:
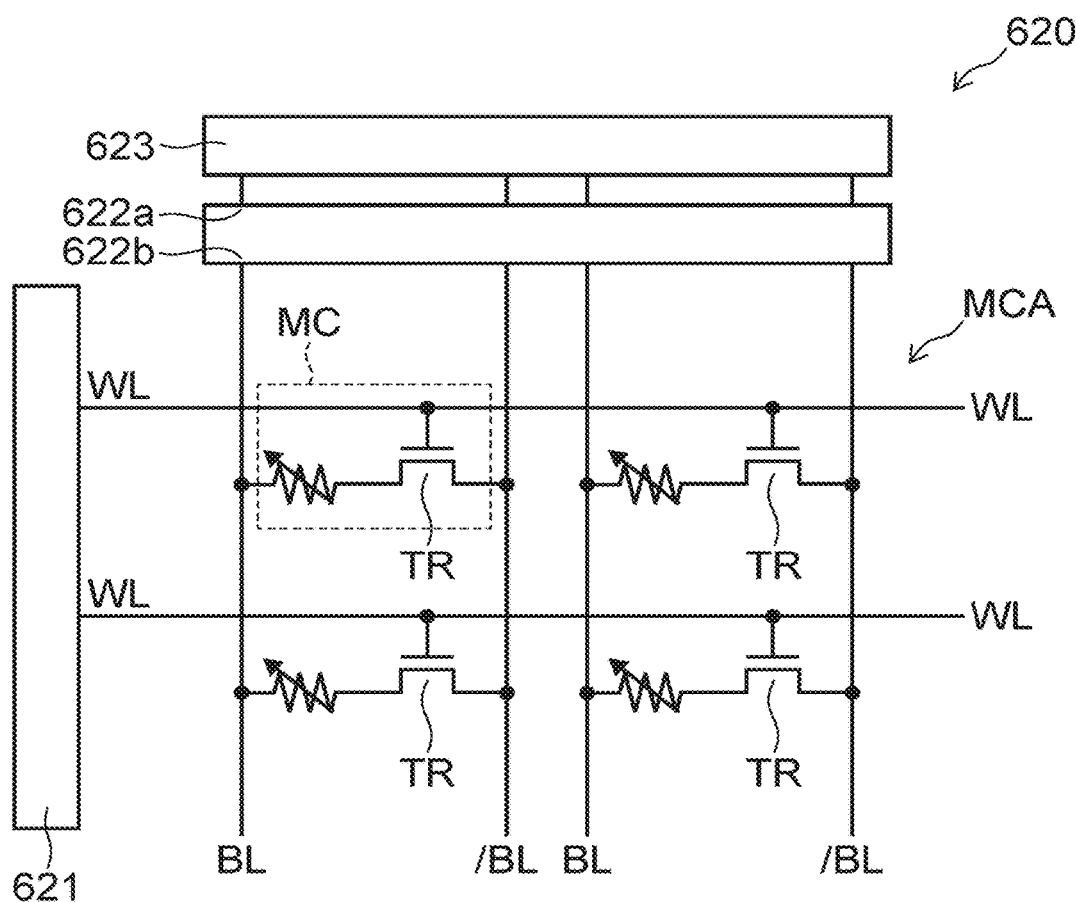
FIG. 26 is a schematic view showing the configuration of a memory device according to a fifth embodiment.

FIG. 26 is a schematic view illustrating the configuration of a memory device according to a fifth embodiment.

A memory device 620 according to the embodiment is, for example, a non-volatile memory device.

As shown in FIG. 26, the memory device 620 includes a memory cell array MCA. The memory cell array MCA has a plurality of memory cells MC arranged in a matrix configuration. The respective memory cells MC have one of the magnetic elements according to the embodiments as a magnetic memory element (for example, MTJ element).

A plurality of bit line pairs (bit line BL and bit line /BL) and a plurality of word lines WL are disposed in the memory cell array MCA. Each of the plurality of bit line pairs extends in a column direction. Each of the plurality of word lines WL extends in a row direction.

The memory cell MC is disposed at a cross point of the bit line BL and the word line WL. Each memory cell MC has a magnetic memory element and a selection transistor TR. One end of the magnetic memory element is connected to the bit line BL. Other end of the magnetic memory element is connected to the word line WL. The source terminal of the selection transistor TR is connected to the bit line /BL.

A row decoder 621 is connected to the word line WL. A writing circuit 622a and a reading circuit 622b are connected to the bit line pair (bit line BL and bit line /BL). A column decoder 623 is connected to the writing circuit 622a and the reading circuit 622b.

The respective memory cells MC are selected by the row decoder 621 and the column decoder 623. The example of data writing to the memory cell MC is shown below. At first, the word line WL connected to the memory cell MC is activated in order to select the memory cell MC to which the data is written. Thereby, the selection transistor TR is turned on.

In this example, for example, the row decoder 621, the writing circuit 622a, the reading circuit 622b, and the column decoder 623 constitute the controller 550. The controller 550 is electrically connected to each of the plurality of cells MC (plurality of magnetic elements) via the bit line BL, the word line WL and the selection transistor TR or the like. The controller 550 performs writing the data and reading the data to each of the plurality of memory cells MC.

For example, a bidirectional writing current is supplied to the magnetic memory element. Specifically, when the writing current is supplied to the magnetic memory element from left to right, the writing circuit 622a applies a positive potential to the bit line BL, and applies a ground potential to the bit line /BL. When the writing current is supplied to the magnetic memory element from left to right, the writing circuit 622a applies the positive potential to the bit line /BL, and applies the ground potential to the bit line BL. In this way, data "0", or data "1" can be written to the memory cell MC.

The example of data reading from the memory cell MC is shown below. At first, the memory cell MC is selected. The reading circuit 622b supplies the reading current flowing in a direction from the selection transistor TR toward the magnetic memory element to the magnetic memory element, for example. The reading circuit 622b senses a resistance value of the magnetic memory element on the basis of the reading current. In this way, information stored in the magnetic memory element can be read.

Figure 27:
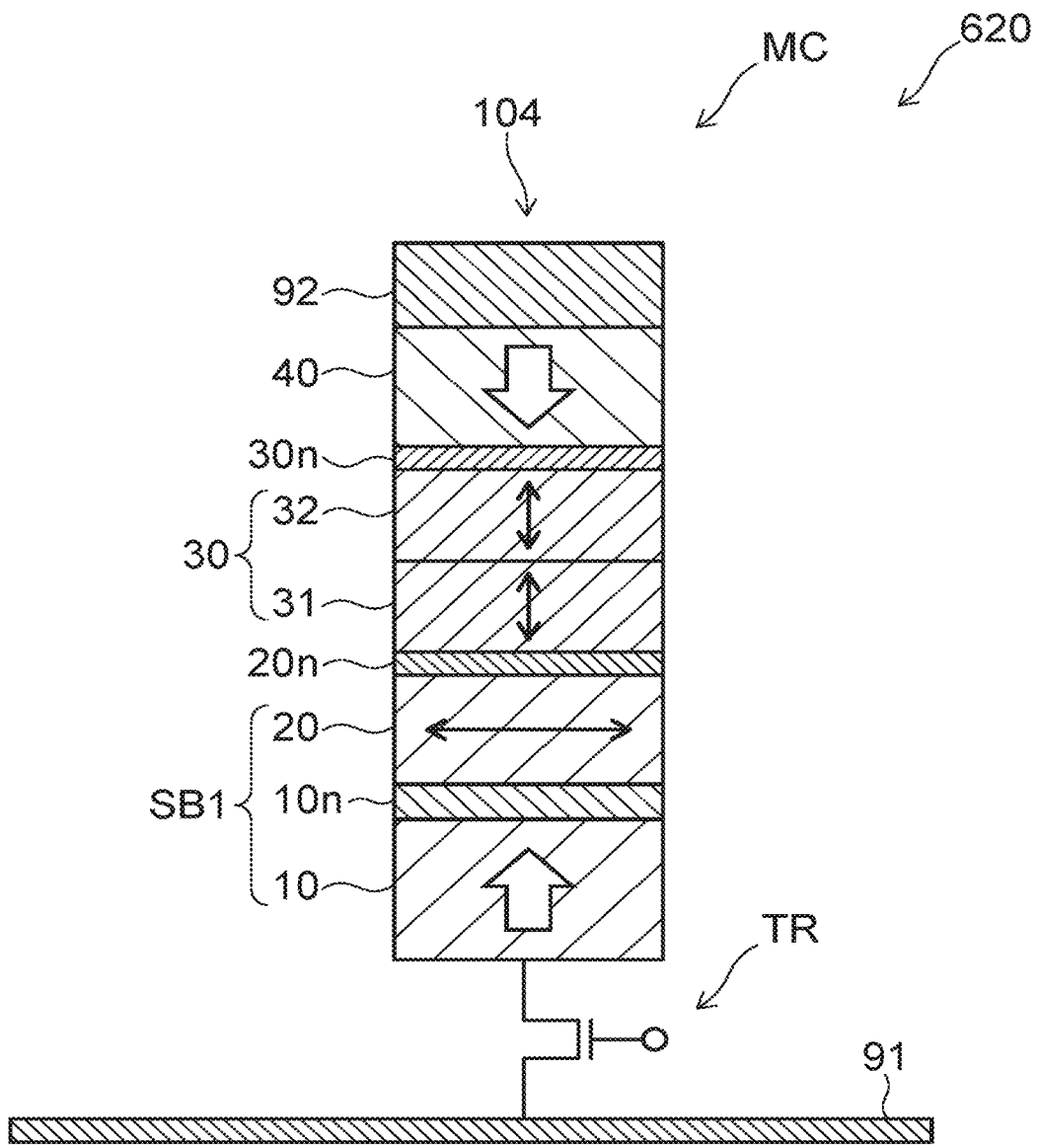
FIG. 27 is a schematic view showing the configuration of the memory device according to the fifth embodiment.

FIG. 27 is a schematic view illustrating the configuration of the memory device according to the fifth embodiment.

FIG. 27 illustrates a portion of one memory cell MC. In this example, the magnetic element 104 is used, however any magnetic element (magnetic memory element) according to the embodiments can be used.

As shown in FIG. 27, a memory device 620 includes the magnetic memory element (for example, magnetic element 104) according to the embodiment, a first interconnection 91 and a second interconnection 92. The first interconnection 91 is directly or indirectly connected to one end of the magnetic element 104 (for example, end of first ferromagnetic layer 10). The second interconnection 92 is directly or indirectly connected to other end of the magnetic element 104 (for example, end of second ferromagnetic layer 20).

Here, "directly connected" includes a state of being electrically connected without other interposed conductive members (for example, a via electrode and interconnection or the like) being inserted. "indirectly connected" includes a state of being electrically connected with other interposed conductive members (for example, a via electrode and interconnection or the like) being inserted, and a state of being variable between being conductive and being non-conductive with an interposed switch (for example, transistor or the like) being inserted.

One of the first interconnection 91 and the second interconnection 92 corresponds to, for example, the bit line BL or the bit line /BL. Other one of the first interconnection 91 and the second interconnection 92 corresponds to, for example, the bit line BL or the bit line /BL.

As shown in FIG. 27, the memory device 620 can further include the selection transistor TR. The selection transistor TR is provided at least one of between the magnetic element 104 and the first interconnection 91 (first position) and between the magnetic element 104 and the second interconnection 92 (second position).

In the configuration like this, the data can be written to any memory cell MC (for example, magnetic element 104) of the memory cell array MCA, and the written data to the magnetic element 104 can be read. Also in the memory device 620 configured like this, the rotational magnetic field with a high oscillation frequency f can be stably achieved by setting 2γNzMs in the oscillation layer not less than 0.9 times of the magnetic resonance frequency f3 of the third ferromagnetic layer 30. Therefore, the writing current in the magnetic memory layer can be reduced.

Sixth Embodiment

Figure 28:
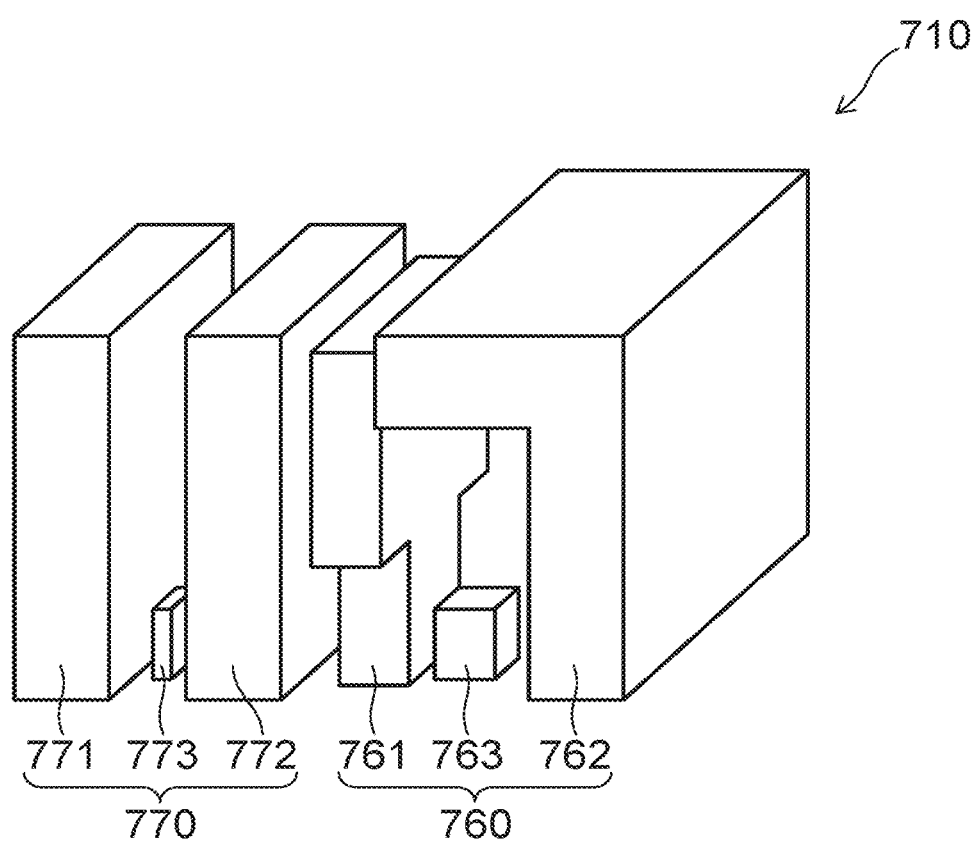
FIG. 28 is a schematic perspective view showing a magnetic head according to a sixth embodiment.

FIG. 28 is a schematic perspective view illustrating a magnetic head according to a sixth embodiment.

As shown in FIG. 28, a magnetic head 710 includes a reproduction unit 770 (reproduction head unit) and a writing unit 760 (writing head unit).

The reproduction unit 770 includes a first shield 771, a second shield 772, and a sensor unit 773. The sensor unit 773 is provided between the first shield 771 and the second shield 772. The reproduction unit 770 is, for example, a magnetoresistance effect element. The resistance of the sensor unit 773 changes depending on the magnetic field applied to the sensor unit 773 from a magnetic recording medium. Thereby, the reproduction unit 770 senses a direction of the magnetization of the magnetic recording medium. A recording signal recorded in the magnetic recording medium can be sensed.

The writing unit 760 includes, for example, a main magnetic pole 761, an opposing magnetic pole 762 and a magnetic element 763 (spin torque oscillator). The magnetic element 763 is one of the magnetic elements 101 to 103 according to the first to third embodiments, or its variation. The magnetic element 763 is provided between the main magnetic pole 761 and the opposing magnetic pole 762. The direction of the magnetization of the magnetic recording medium is controlled by applying the magnetic field to the magnetic recording medium from the writing unit 760. Thereby, the writing operation is implemented.

The magnetic element 763 (spin torque oscillator) applies the high frequency magnetic field to the magnetic recording medium in the writing. The high frequency magnetic field can assist the writing operation (referred to as microwave assist magnetic recording). In the microwave assist magnetic recording, the high frequency is applied to the magnetic recording medium depending on the anisotropic magnetic field of the magnetic recording medium. Thereby, the reverse of the magnetization of the magnetic recording medium is assisted by using the magnetic resonance. If the magnetic element 101 or the like according to the embodiment is used as the magnetic element 763 (spin torque oscillator), the stable high frequency magnetic field can be achieved by a small current. Thereby, for example, the stable writing operation can be implemented by the small current to the magnetic recording medium with large magnetic anisotropy.

Seventh Embodiment

Figure 29:
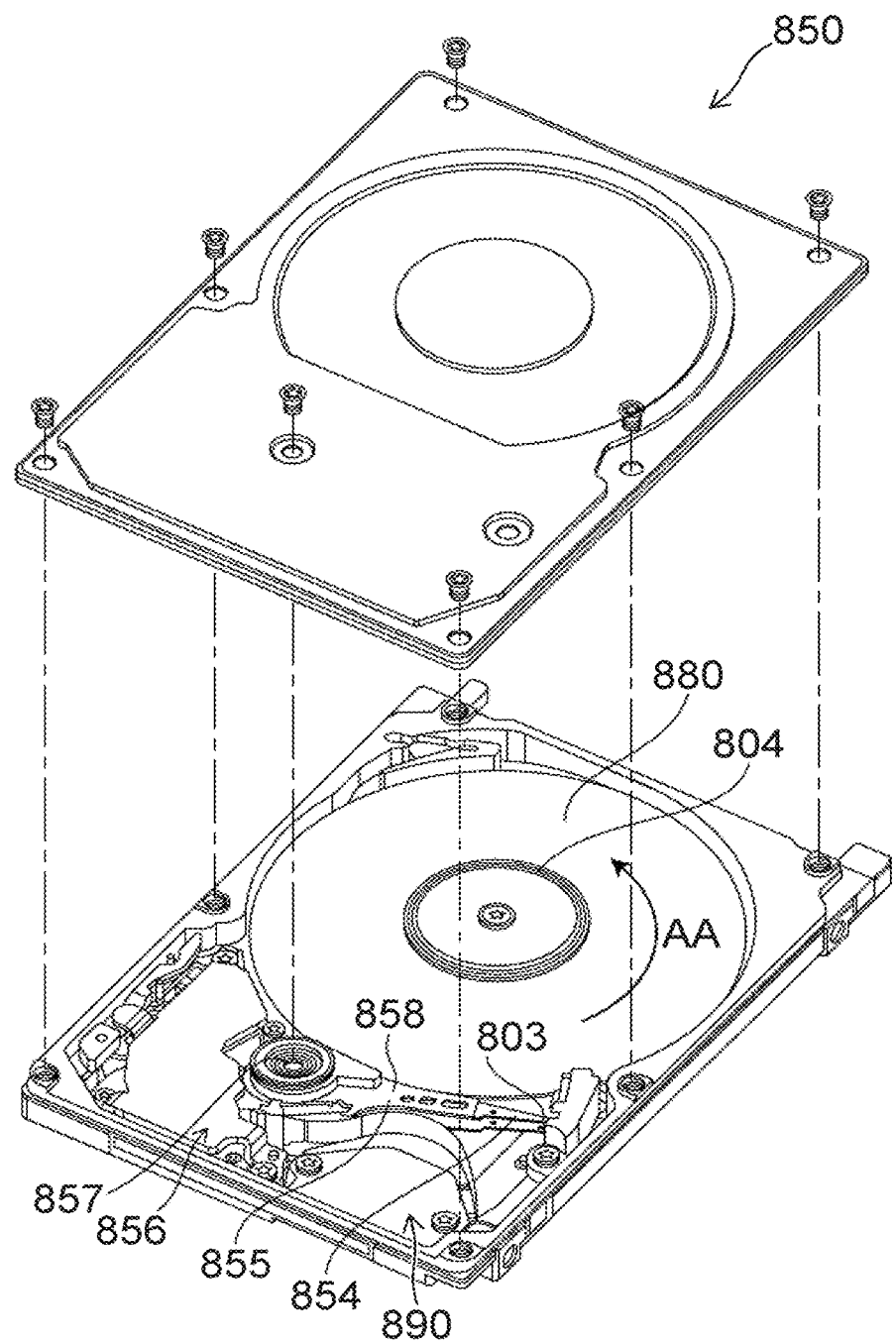
FIG. 29 is a schematic perspective view showing a magnetic recording and reproducing device according to a seventh embodiment.

FIG. 29 is a schematic perspective view illustrating a magnetic recording and reproducing device according to a seventh embodiment.

As shown in FIG. 29, a magnetic recording reproducing device 850 according to the embodiment includes a magnetic recording medium (recording medium disk 880) and a magnetic head assembly 868. The magnetic head assembly 858 includes the magnetic head, a suspension 854 and an actuator arm 855 or the like.

The magnetic recording reproducing device 850 is a device using a rotary actuator. The recording medium disk 880 is mounted on a spindle motor 804. The recording medium disk 880 is disc shaped, and is provided with a magnetic recording layer having magnetization. The recording medium disk 880 rotates in a direction of an arrow AA by a motor not shown. This motor responds to, for example, a control signal from a drive device controller not shown. The magnetic recording reproducing device 850 according to the embodiment may include the plurality of recording medium disks 880.

Record reproduction of information stored in the recording medium disk 880 is performed by a head slider 803. The head slider 803 is attached to a tip of the suspension 854. The suspension 854 is a thin film. The magnetic head 710 according to the sixth embodiment or its variation is mounted to near the tip of the head slider 803. The magnetic elements according to the first to third embodiments or the variations are used for the magnetic head.

When the recording medium disk 880 rotates, the head slider 803 is held above a surface of the recording medium disk 880. In the embodiment, a type so called "contact-sliding type" that the head slider 803 contacts the recording medium disk 880 may be used.

The suspension 854 is connected to one end of the actuator arm 855. The actuator arm 855 has a bobbin unit or the like holding a drive coil not shown. A voice coil motor 856 is provided on other end of the actuator arm 855. The voice coil motor 856 is, for example, one kind of a linear motor. The voice coil motor 856 can include, for example, a drive coil and a magnetic circuit not shown. The drive coil is, for example, wound around the bobbin unit of the actuator arm 855. The magnetic circuit can include, for example, a permanent magnet and an opposing yoke not shown. The permanent magnet and the opposing yoke face each other and the drive coil is disposed therebetween.

The actuator arm 855 is held by, for example, ball bearings not shown. The ball bearings are provided, for example, at two positions above and below a bearing unit 857. The actuator arm 855 can rotate and slide freely by the voice coil motor 856. As a result, the magnetic head can move to an arbitrary position of the recording medium disk 880.

The magnetic recording reproducing device 850 further includes a signal processor 890 electrically connected to the magnetic head. The signal processor 890 controls the operations of the reproducing head unit and the writing head unit to performs signal writing to the magnetic recording medium and reading. For example, the signal processor 890 senses a change of the resistance of the magnetoresistance effect element of the magnetic head. The signal processor 890, for example, includes the previously described controller 550 and controls the operation of the magnetic element 763. According to the magnetic recording reproducing device 850 according to the embodiment, the stable writing operation can be implemented by the small current.

According to the embodiments, a magnetic element capable of generating a high frequency magnetic field and a memory device can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components such as first stacking units, second stacking units, first ferromagnetic layers, second ferromagnetic layers, third ferromagnetic layers, first non-magnetic layers, second non-magnetic layers, third non-magnetic layers, controllers etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic elements and memory devices practicable by an appropriate design modification by one skilled in the art based on the magnetic elements and memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory device comprising:
   a magnetic element;
   a first interconnection electrically connected to one end of the magnetic element;
   a second interconnection electrically connected to other end of the magnetic element; and
   a controller electrically connected to the magnetic element via the first interconnection and the second interconnection,
   wherein the magnetic element comprises:
   a first stacked unit comprising:
      a first ferromagnetic layer having a first magnetization,
      a second ferromagnetic layer separated from the first ferromagnetic layer in a first direction, the second ferromagnetic layer having a second magnetization, and
      a first non-magnetic layer provided between the first ferromagnetic layer and the second ferromagnetic layer; and
   a third ferromagnetic layer stacked with the first stacked unit in the first direction, the third ferromagnetic layer having a third magnetization,
      wherein the third ferromagnetic layer comprises a first portion and a second portion, the first portion being provided between the second portion and the first stacked unit, a magnetic resonance frequency of the first portion being higher than a magnetic resonance frequency of the second portion, and a magnetization of the first portion and a magnetization of the second portion being antiferromagnetically coupled, and
   wherein:
      a component of the first direction of the first magnetization is larger than a component of a second direction perpendicular to the first direction of the first magnetization,
      a component of the first direction of the second magnetization is smaller than a component of the second direction of the second magnetization, and
      a component of the first direction of the third magnetization is larger than a component of the second direction of the third magnetization.

2. The memory device according to claim 1, further comprising a transistor provided at least one of between the magnetic element and the first interconnection or between the magnetic element and the second interconnection.

3. The memory device according to claim 1, wherein the third ferromagnetic layer comprises at least one selected from the group consisting of a first alloy and a Heuller alloy, wherein
   the Heuller alloy comprises at least one selected from the group consisting of Co, Mn, Fe, Ni, Cu, Rh, Ru and Pd, and
   the first alloy comprises at least one selected from the group consisting of Co, Mn, Fe, Ni, Cu, Rh, Ru and Pd.

4. The memory device according to claim 1, wherein the third ferromagnetic layer comprises at least one selected from the group consisting of $Co_2FeSi$, $Co_2FeAl$, $Co_2FeGa$, $Co_2MnGe$, $Co_2MnSn$, $Co_2MnSi$, $Co_2MnGa$, $Co_2MnAl$, $Co_2MnSb$, $Co_2CrGa$, $Ni_2MnIn$, $Ni_2MnGa$, $Ni_2MnSn$, $Ni_2MnSb$, $Ni_2FeGa$, $Pd_2MnSb$, $Pd_2MnSn$, $Cu_2MnAl$, $Cu_2MnSn$, $Cu_2MnIn$, $Rh_2MnGe$, $Rh_2MnPb$, $Rh_2MnSn$, $Pd_2MnGe$, $Rh_2FeSn$, $Ru_2FeSn$, and $Rh_2FeSb$.

5. The memory device according to claim 1, wherein
   the third ferromagnetic layer comprises at least one selected from the group consisting of $Co_2HfSn$, $Co_2ZrSn$, $Co_2HfAl$, $Co_2ZrAl$, $Co_2HfGa$, $Co_2TiSi$, $Co_2TiGe$, $Co_2TiSn$, $Co_2TiGa$, $Co_2TiAl$, $Co_2VGa$, $Co_2VAl$, $Co_2TaAl$, $Co_2NbGa$, $Co_2NbAl$, $Co_2VSn$, $Co_2NbSn$, $Co_2CrAl$, $Rh_2NiSn$, $Rh_2NiGe$, $Mn_2WSn$, $Fe_2MnSi$, and $Fe_2MnAl$.

6. The memory device according to claim 1, wherein
   the first portion comprises at least one selected from the group consisting of $Co_2HfSn$, $Co_2ZrSn$, $Co_2HfAl$, $Co_2ZrAl$, $CoFeMnSi$, $Co_2HfGa$, $Co_2TiSi$, $Co_2TiGe$, $Co_2TiSn$, $Co_2TiGa$, $Co_2TiAl$, $Co_2VGa$, $Co_2VAl$, $Co_2TaAl$, $Co_2NbGa$, $Co_2NbAl$, $Co_2VSn$, $Co_2NbSn$, $Co_2CrAl$, $Rh_2NiSn$, $Rh_2NiGe$, $Mn_2WSn$, $Fe_2MnSi$, and $Fe_2MnAl$, and
   the second portion comprises at least one selected from the group consisting of $Co_2FeSi$, $Co_2FeAl$, $Co_2FeGa$, $Co_2MnGe$, $Co_2MnSn$, $Co_2MnSi$, $Co_2MnGa$, $Co_2MnAl$, $Co_2MnSb$, $Co_2CrGa$, $Ni_2MnIn$, $Ni_2MnGa$, $Ni_2MnSn$, $Ni_2MnSb$, $Ni_2FeGa$, $Pd_2MnSb$, $Pd_2MnSn$, $Cu_2MnAl$, $Cu_2MnSn$, $Cu_2MnIn$, $Rh_2MnGe$, $Rh_2MnPb$, $Rh_2MnSn$, $Pd_2MnGe$, $Rh_2FeSn$, $Ru_2FeSn$, and $Rh_2FeSb$.

7. The memory device according to claim 1, wherein
   the magnetic resonance frequency of the first portion is not less than 20 GHz, and
   the magnetic resonance frequency of the second portion is less than 20 GHz.

8. The memory device according to claim 1, wherein
   a component of magnetization of the first portion parallel to the first direction is larger than a component of the magnetization of the first portion perpendicular to the first direction, and
   a component of magnetization of the second portion parallel to the first direction is larger than a component of the magnetization of the second portion perpendicular to the first direction.

9. The memory device according to claim 1, further comprising:
   a second non-magnetic layer provided between the second ferromagnetic layer and the third ferromagnetic layer.

10. The memory device according to claim 9, wherein the second non-magnetic layer is conductive.

11. The memory device according to claim 9, further comprising:
    an insulating layer provided between the third ferromagnetic layer and the second non-magnetic layer.

12. The memory device according to claim 1, further comprising:

a fourth ferromagnetic layer stacked with the third ferromagnetic layer in the first direction;

the first interconnection electrically connected to the first ferromagnetic layer; and the second interconnection electrically connected to the fourth ferromagnetic layer.

13. The memory device according to claim 12, further comprising:

a third non-magnetic layer provided between the third ferromagnetic layer and the fourth ferromagnetic layer.

14. The memory device according to claim 1, further comprising:

a fourth ferromagnetic layer stacked with the third ferromagnetic layer in the first direction, and having a fourth magnetization, wherein a component of the first direction of the fourth magnetization is larger than a component of the second direction of the fourth magnetization.

15. The memory device according to claim 14, wherein the third ferromagnetic layer is disposed between the first ferromagnetic layer and the fourth ferromagnetic layer, and the second ferromagnetic layer is disposed between the first ferromagnetic layer and the third ferromagnetic layer.

16. The memory device according to claim 1, wherein a length of the third ferromagnetic layer in a direction perpendicular to the first direction is not more than 25 nanometers.

17. The memory device according to claim 1, further comprising:

a conductive layer, at least a portion of the conductive layer facing at least a portion of a side surface of the first stacked unit.

18. The memory device according to claim 1, wherein the second ferromagnetic layer is disposed between the first ferromagnetic layer and the third ferromagnetic layer.

19. The memory device according to claim 1, wherein $2\gamma N_z M_s$ is between 0.9 and 0.96 times of the magnetic resonance frequency of the third ferromagnetic layer when the second magnetization of the second ferromagnetic layer is $M_s$, a demagnetizing coefficient of the second ferromagnetic layer is $N_z$, and a gyro magnetic constant is $\gamma$.

20. The memory device according to claim 1, wherein the first portion is in physical contact with the second portion.

* * * * *